United States Patent
Cha et al.

(10) Patent No.: US 10,644,062 B2
(45) Date of Patent: May 5, 2020

(54) LIGHT EMITTING DIODE MODULE, DISPLAY PANEL HAVING THE SAME AND METHOD OF MANUFACTURING THE SAME

(71) Applicant: Samsung Electronics Co., Ltd., Suwon-si (KR)

(72) Inventors: Nam Goo Cha, Hwaseong-si (KR); Yong Il Kim, Seoul (KR); Young Soo Park, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/544,422

(22) Filed: Aug. 19, 2019

(65) Prior Publication Data

US 2019/0371856 A1    Dec. 5, 2019

Related U.S. Application Data

(60) Continuation of application No. 15/984,508, filed on May 21, 2018, now Pat. No. 10,388,693, which is a
(Continued)

(30) Foreign Application Priority Data

Apr. 8, 2016    (KR) .................. 10-2016-0043487

(51) Int. Cl.
*H01L 33/00*       (2010.01)
*H01L 27/15*       (2006.01)
(Continued)

(52) U.S. Cl.
CPC ........ *H01L 27/156* (2013.01); *H01L 25/0655* (2013.01); *H01L 33/0012* (2013.01);
(Continued)

(58) Field of Classification Search
CPC ............. H01L 25/0655; H01L 33/0012; H01L 33/0095
See application file for complete search history.

(56) References Cited

U.S. PATENT DOCUMENTS 6,372,608 B1    4/2002    Shimoda et al.
6,621,105 B2    9/2003    Taninaka et al.
(Continued)

FOREIGN PATENT DOCUMENTS

| DE | 10 2008 062 933 A1 | 7/2010 |
| DE | 10 2011 056 888 A1 | 6/2013 |
| KR | 10-0589784 B1 | 6/2006 |

OTHER PUBLICATIONS

Office Action dated Sep. 26, 2019, for corresponding application DE 102017105746.3.

*Primary Examiner* — Samuel A Gebremariam
(74) *Attorney, Agent, or Firm* — Muir Patent Law, PLLC

(57) ABSTRACT

In some examples, a semiconductor device may comprise a semiconductor chip including a plurality of pixels, each pixel formed of a plurality of sub-pixels, such as a red sub-pixel, green sub-pixel and blue sub-pixel. Each sub-pixel may comprise a light emitting diode. A first signal line may connect to signal terminals of a first group sub-pixels (e.g., arranged in the same row), and a second signal line may connect to common terminals of a second group of sub-pixels (e.g., arranged in the same column). The number of chip pads may thus be reduced to provide increased design flexibility in location and/or allowing an increase in chip pad size. In some examples, a light transmissive material may be formed in openings of a semiconductor growth substrate on which light emitting cells of the sub-pixels were grown. The light transmissive material of some of the sub-pixels may comprise a wavelength conversion material and/or filter. Exemplary display panels and methods
(Continued)

of manufacturing semiconductor devices and display panels are also disclosed.

20 Claims, 61 Drawing Sheets

Related U.S. Application Data division of application No. 15/413,079, filed on Jan. 23, 2017, now Pat. No. 9,997,561.

(51) Int. Cl.
*H01L 25/065* (2006.01)
*H01L 33/50* (2010.01)
*H01L 33/52* (2010.01)
*H01L 33/62* (2010.01)
*H01L 25/075* (2006.01)
*H01L 33/44* (2010.01)

(52) U.S. Cl.
CPC ........ *H01L 33/0095* (2013.01); *H01L 33/507* (2013.01); *H01L 33/52* (2013.01); *H01L 33/62* (2013.01); *H01L 25/0753* (2013.01); *H01L 33/0079* (2013.01); *H01L 33/44* (2013.01); *H01L 33/50* (2013.01); *H01L 2933/005* (2013.01); *H01L 2933/0041* (2013.01); *H01L 2933/0066* (2013.01)

(56) References Cited

U.S. PATENT DOCUMENTS

| | | | |
|---|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,323,723 B2 | 1/2008 | Ohtsuka et al. |
| 7,501,656 B2 | 3/2009 | Han et al. |
| 7,541,620 B2 | 6/2009 | Sagimori et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,786,495 B2 | 8/2010 | Takeuchi et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,299,477 B2 | 10/2012 | Kim et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,766,885 B2 | 7/2014 | Van de Ven et al. |
| 8,829,540 B2 | 9/2014 | Kim et al. |
| 8,957,431 B2 | 2/2015 | Lim et al. |
| 9,123,623 B2 | 9/2015 | Jo et al. |
| 2011/0089442 A1 | 4/2011 | Jin et al. |
| 2011/0241031 A1 | 10/2011 | Von Maim et al. |
| 2011/0291120 A1 | 12/2011 | Tak et al. |
| 2012/0119237 A1 | 5/2012 | Leatherdale et al. |
| 2014/0138543 A1 | 5/2014 | LaVeigne |
| 2014/0231841 A1 | 8/2014 | Wang |
| 2015/0014716 A1 | 1/2015 | Von Maim |
| 2015/0093842 A1 | 4/2015 | Higginson et al. |
| 2015/0255439 A1 | 9/2015 | Kim |

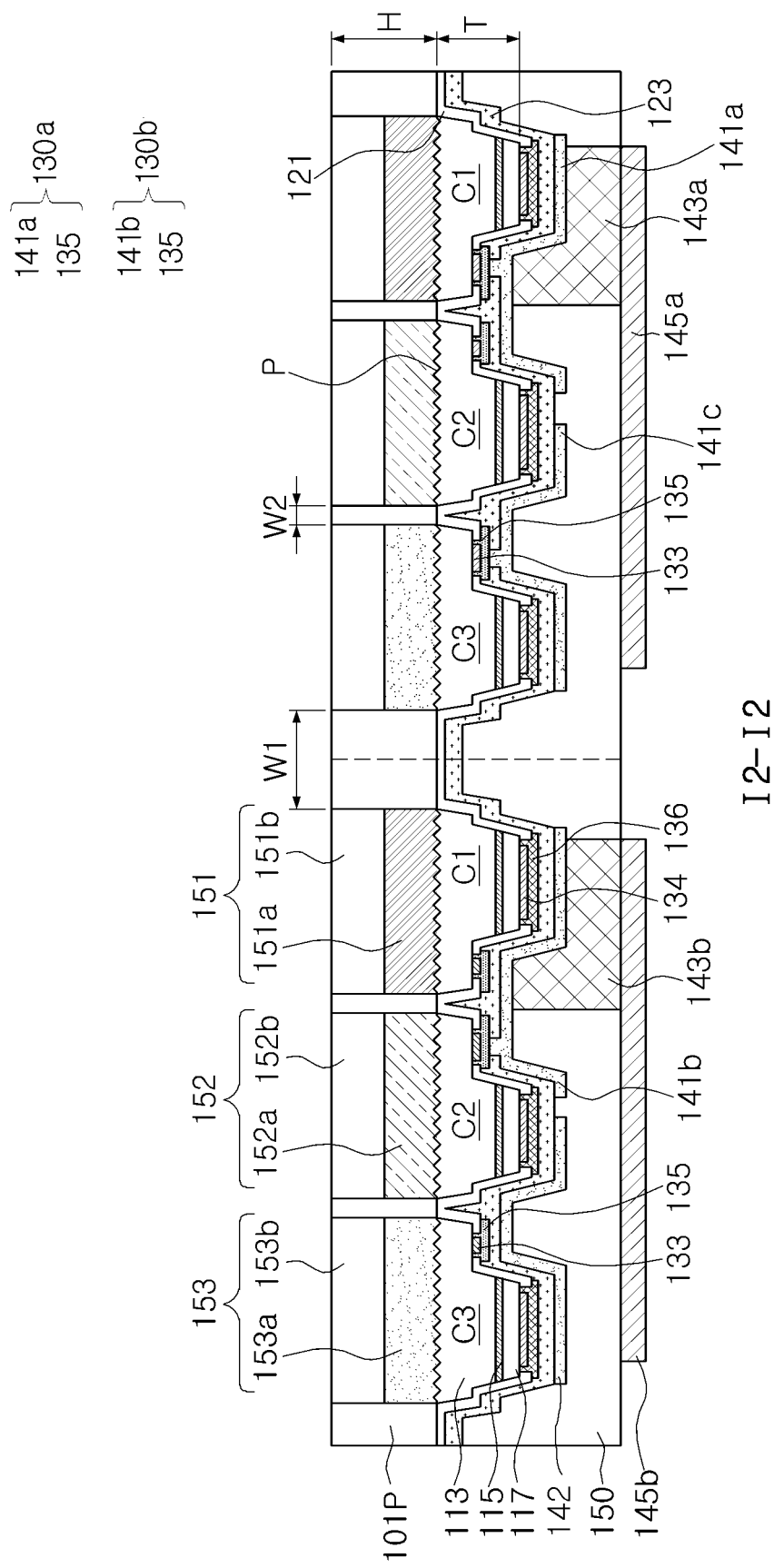

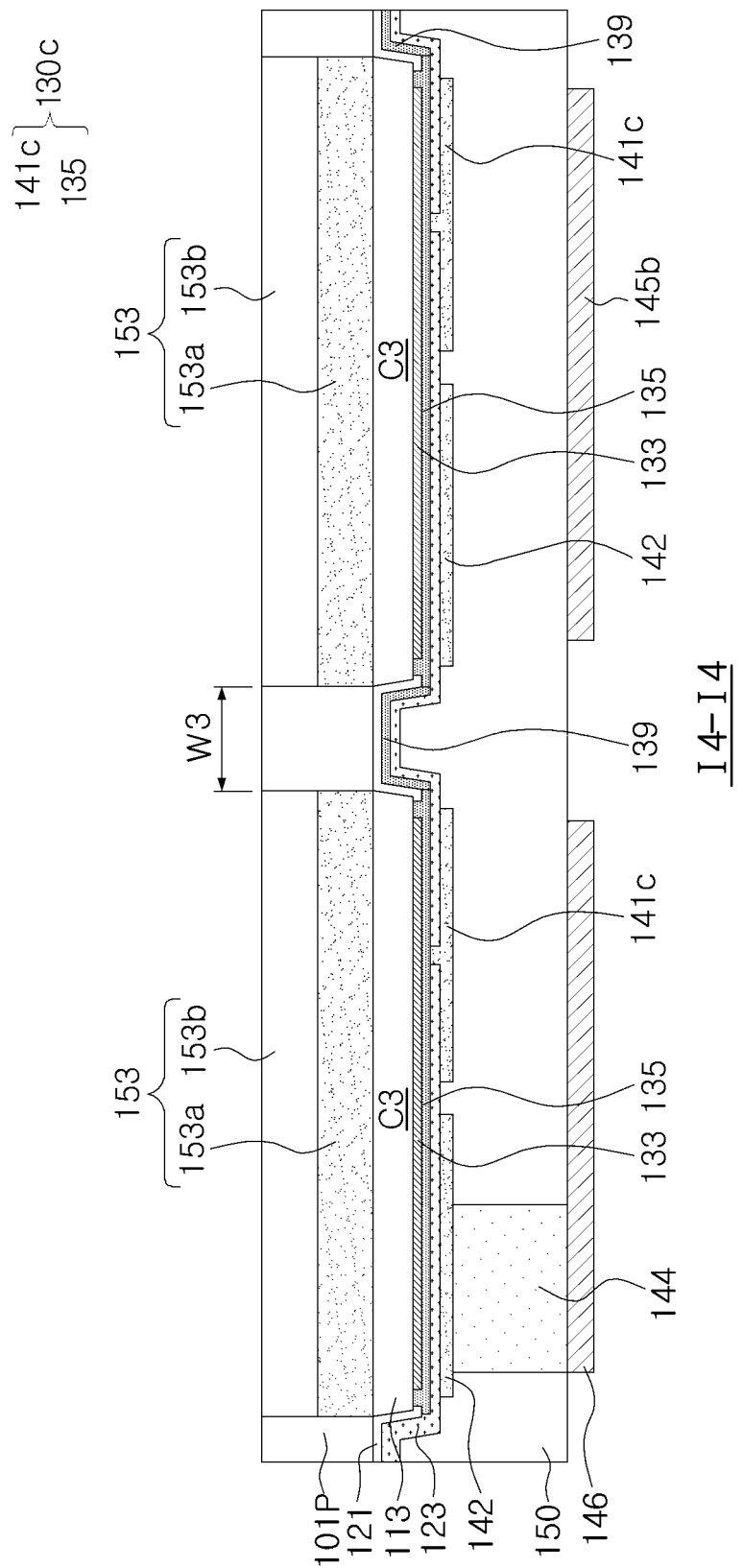

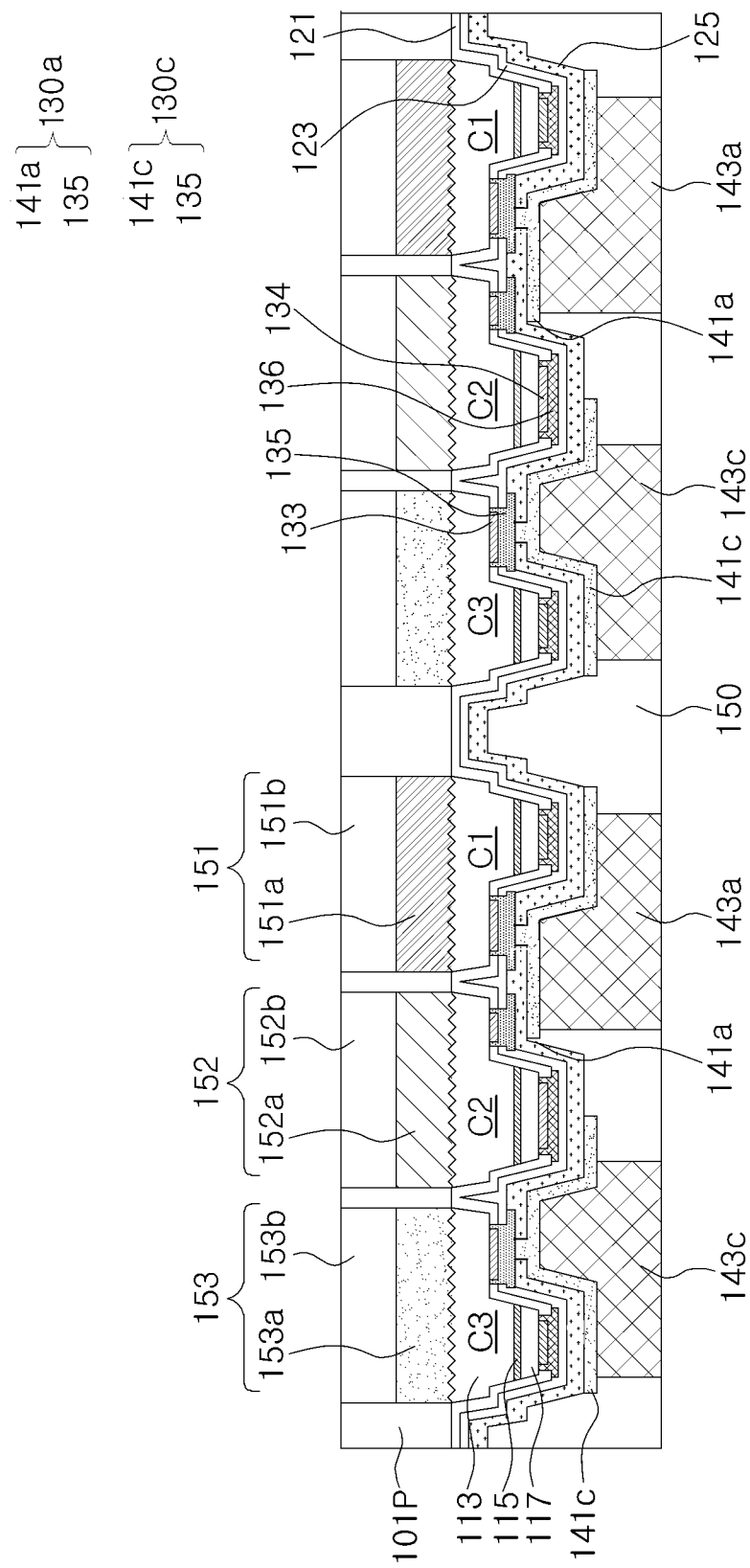

LIGHT EMITTING DIODE MODULE, DISPLAY PANEL HAVING THE SAME AND METHOD OF MANUFACTURING THE SAME

CROSS-REFERENCE TO RELATED APPLICATION

This application is a Continuation of U.S. patent application Ser. No. 15/984,508 filed May 21, 2018 which is a Divisional of U.S. patent application Ser. No. 15/413,079 filed Jan. 23, 2017, which claims the benefit of priority to Korean Patent Application No. 10-2016-0043487 filed on Apr. 8, 2016 in the Korean Intellectual Property Office, the disclosure of each of these applications being incorporated herein by reference in its entirety.

BACKGROUND

1. Field

The present disclosure relates to light emitting diode (LED) modules, and display panels having the same, and related methods of manufacturing such LED modules and display panels.

2. Description of Related Art

Semiconductor light emitting diodes (LED) are used as the light sources of various electronic products, as well as light sources for lighting devices. In particular, semiconductor LEDs are commonly used as light sources for various display devices such as TVs, mobile phones, PCs, notebook computers, personal digital assistants (PDAs), and the like.

A related art display device includes a display panel configured as a liquid crystal display (LCD) and a backlight, and, recently, a display in which one or more LEDs form a single pixel themselves, so that the display does not require a backlight. Such a display devices may be compact in size and provide a high luminance having excellent luminance efficiency, relative to conventional LCDs. Also, forming display panels using LEDS allows an aspect ratio of the display to be freely modified and realized with a large area, providing various types of large displays.

SUMMARY

An aspect of the present disclosure may provide a light emitting diode (LED) module capable of shortening a manufacturing process time of a display device.

Semiconductor devices according to certain embodiments may be formed as a single semiconductor chip, comprising a plurality of light emitting diodes, each light emitting diode comprising a first conductivity-type semiconductor layer, a second conductivity-type semiconductor layer and an active layer disposed between the first conductivity-type semiconductor layer and the second conductivity-type semiconductor layer, the plurality of light emitting diodes comprising a first group of light emitting diodes and a second group of light emitting diodes; a first wiring connecting first conductivity-type semiconductor layers of each light emitting diode of the first group of light emitting diodes in common as part of a first electrical node; a second wiring connecting first conductivity-type semiconductor layers of each light emitting diode of the second group of light emitting diodes in common as part of a second electrical node; a third wiring connecting second conductivity-type semiconductor layers of a first light emitting diode of the first group and a first light emitting diode of the second group in common as part of a third electrical node; a fourth wiring connecting second conductivity-type semiconductor layers of a second light emitting diode of the first group and a second light emitting diode of the second group in common as part of a fourth electrical node; and first, second, third and fourth chip pads respectively electrically connected to the first, second, third and fourth electrical nodes and the first, second, third and fourth electrical nodes may be different from one another.

In certain embodiments, a semiconductor device may be embodied as a single semiconductor chip comprising a p×q matrix of light emitting diodes arranged in p rows and q columns, where p and q are integers greater than 1, each light emitting diode comprising a first conductivity-type semiconductor layer, a second conductivity-type semiconductor layer and an active layer disposed between the first conductivity-type semiconductor layer and the second conductivity-type semiconductor layer; p first wirings, each dedicated to and connecting in common first conductivity-type semiconductor layers of the light emitting diodes of a respective one of the p rows of light emitting diodes; q second wirings, each dedicated to and connecting in common first conductivity-type semiconductor layers of the light emitting diodes of a respective one of the q columns of light emitting diodes; p chip pads respectively electrically connected to a corresponding one of the p first wirings; and q chip pads respectively electrically connected to a corresponding one of the q second wirings.

In some examples, a semiconductor device embodied as a single semiconductor may comprise a first pixel comprising a first red subpixel, a first green subpixel and a first blue subpixel; a second pixel comprising a second red subpixel, a second green subpixel and a second blue subpixel, wherein each of the subpixels comprise alight emitting diode having a first diode electrode and a second diode electrode connected to apply a voltage across the light emitting diode; a first signal line connecting the first diode electrodes of the light emitting diodes of the first red subpixel and the second red subpixel; a second signal line connecting the first diode electrodes of the light emitting diodes of the first green subpixel and the second green subpixel; a third signal line connecting the first diode electrodes of the light emitting diodes of the first blue subpixel and the second blue subpixel; a first common line connecting the second diode electrodes of the light emitting diodes of the first red subpixel, the first green subpixel and the first blue subpixel; and a second common line connecting the second diode electrodes of the light emitting diodes of the second red subpixel, the second green subpixel and the second blue subpixel.

In certain embodiments, a semiconductor device, embodied as a single semiconductor chip may comprise a plurality of pixels, each pixel comprising a plurality of subpixels, each subpixel comprising a light emitting diode and light transmissive material on the light emitting diode; a plurality of wirings, each wiring comprising a conductor or a plurality of electrically connected conductors, the plurality of wirings being connected to the light emitting diodes to drive the light emitting diodes; an encapsulant positioned about the wirings and under the light emitting diodes of the plurality of pixels; chip pads at an external surface of the single semiconductor chip and connected to corresponding ones of the plurality of wirings to provide an electrical connection from a source external to the semiconductor device to corresponding ones of the light emitting diodes; and a patterned semiconductor crystalline growth substrate positioned at upper surfaces of the plurality of light emitting diodes, the patterned semiconductor crystalline growth substrate comprising a plurality of openings. The light transmissive material of each subpixel may be formed within a corresponding one of the plurality of openings.

Methods of manufacturing such or similar semiconductor devices are also set forth.

In certain embodiments, a method of manufacturing may comprise forming a first conductivity-type semiconductor layer on a semiconductor wafer; forming an intrinsic layer on the first conductivity-type semiconductor layer; forming a second conductivity-type semiconductor layer on the intrinsic layer to form a multi-layered structure comprising the first conductivity-type semiconductor layer, the intrinsic layer, and the second conductivity-type semiconductor layer; etching the multilayered structure to separate portions of the multi-layered structure from one another, each separate portion of the multi-layered structure forming a light emitting diode to thereby provide a plurality of light emitting diodes on the semiconductor wafer; forming a plurality of wirings to provide electrical connections to each of the light emitting diodes; depositing an encapsulating material over the plurality of light emitting diodes and over at least portions of the plurality of wirings; etching the backside of semiconductor wafer to provide a plurality of openings in the semiconductor wafer, each opening in the semiconductor wafer exposing a surface of a corresponding light emitting diode; and depositing light transmissive material within the plurality of openings in the semiconductor wafer.

In some embodiments, a display panel may comprise a panel substrate and a plurality of semiconductor chips mounted on the panel substrate. Each semiconductor chip may comprise one of the LED modules described herein. The printed circuit board may interconnect some or all of various corresponding electrical nodes of a column or a row of LED modules in common to be driven by display drivers connected thereto.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A through 3D are cross-sectional views of the LED module of FIGS. 1 and 2;

FIGS. 25A through 25C are cross-sectional views of the LED module of FIGS. 23 and 24;

DETAILED DESCRIPTION

Figure 1:
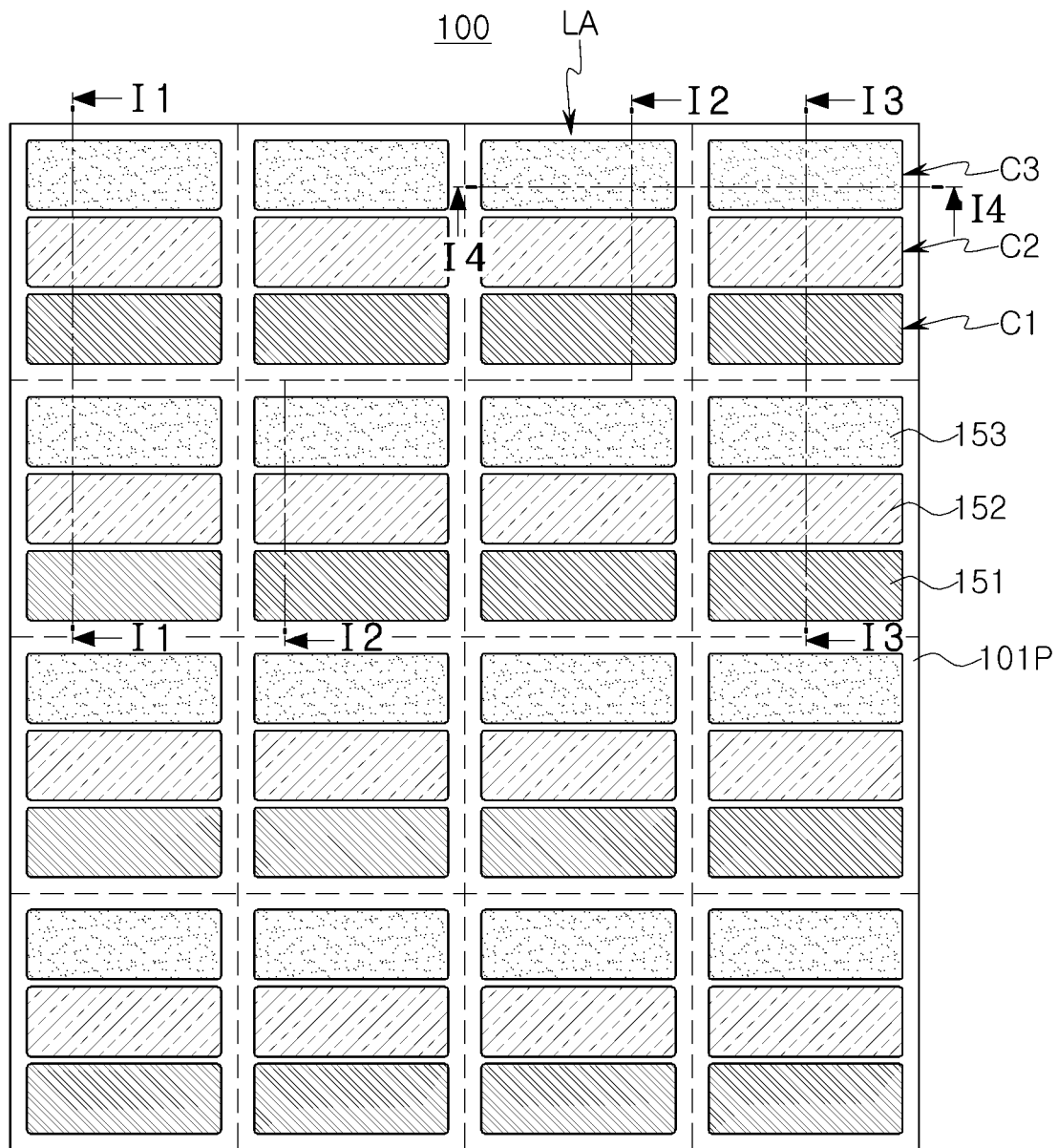
FIGS. 1 and 2 are a schematic top plan view and a schematic bottom plan view of a light emitting diode (LED) module according to an exemplary embodiment in the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Figure 2:
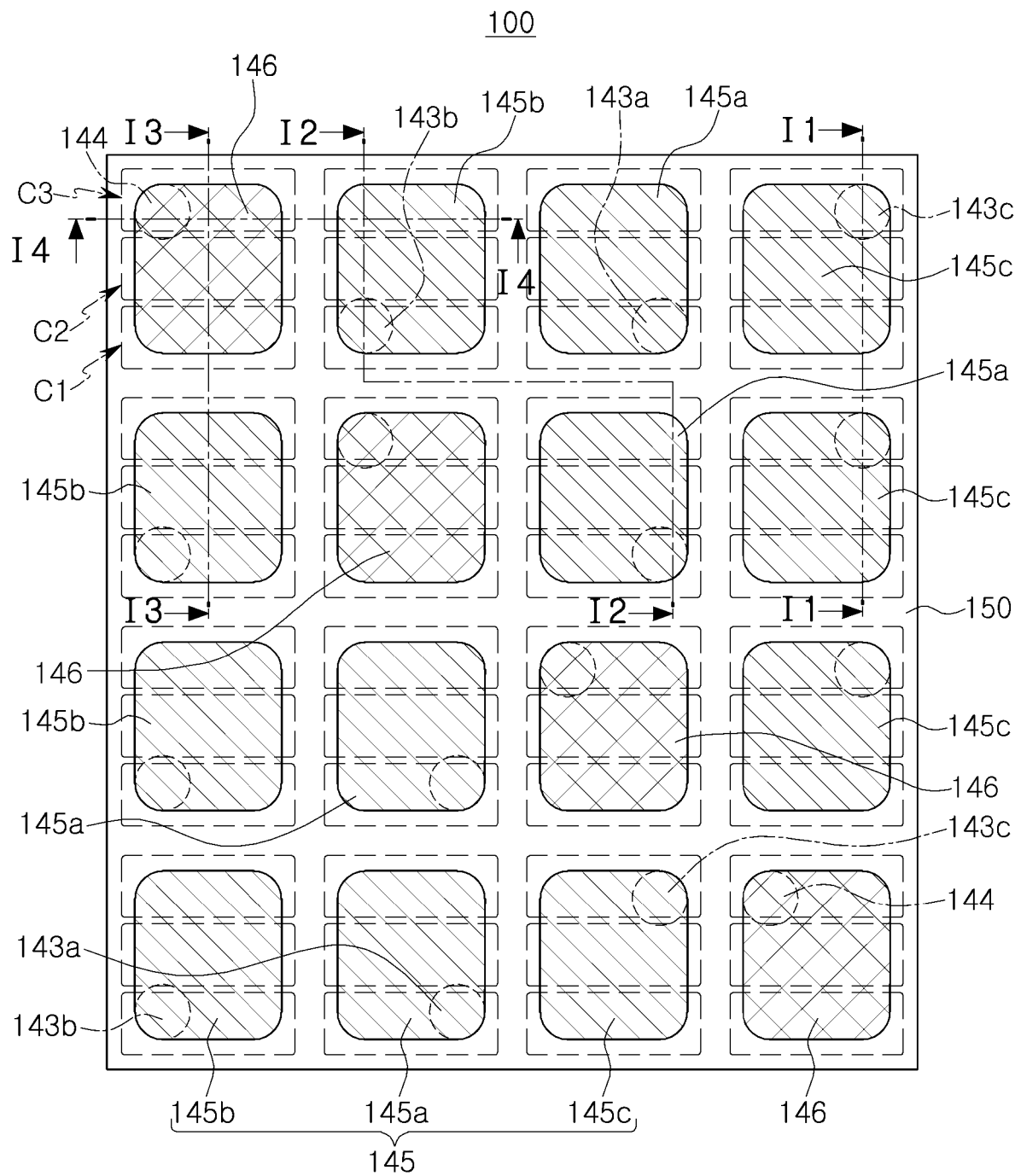

FIGS. 1 and 2 are atop plan view and a bottom plan view illustrating alight emitting diode (LED) 100 module according to an exemplary embodiment of the present disclosure.

Figure 3A:
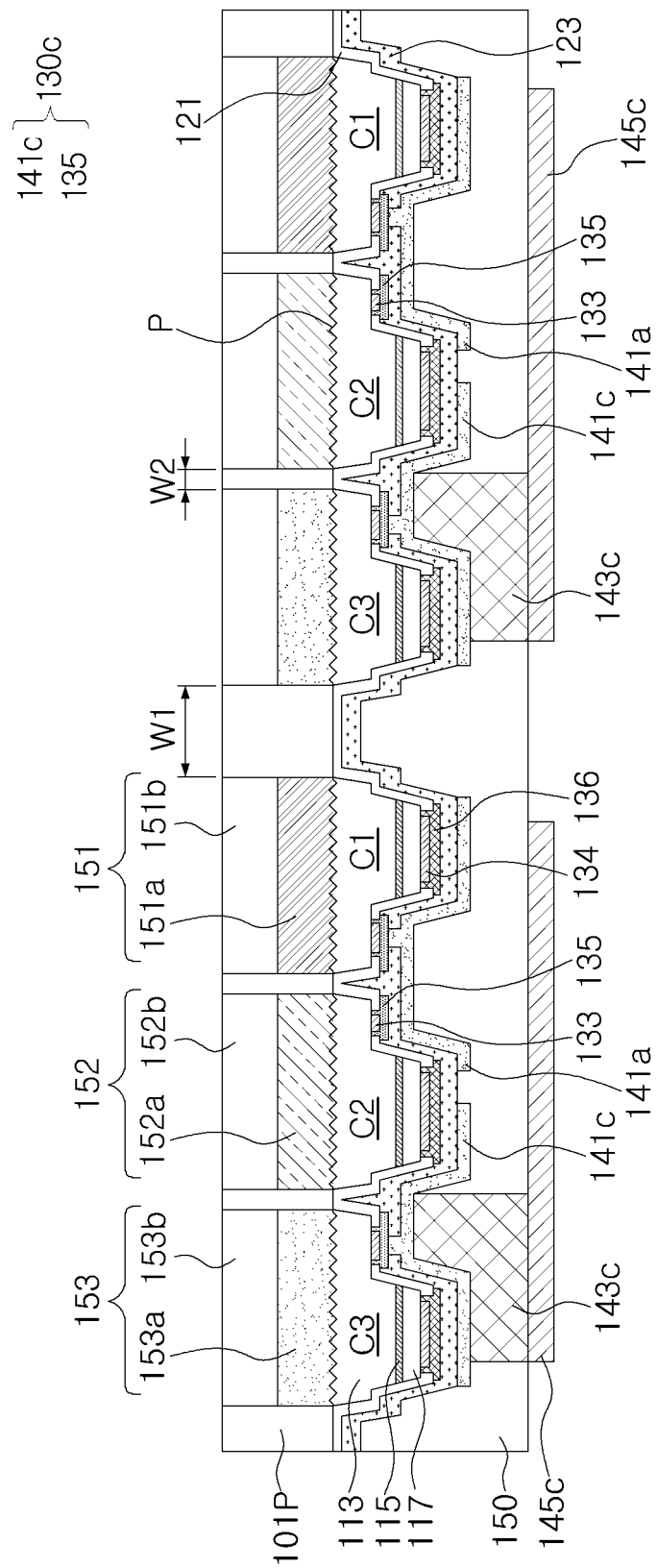
Figure 3C:
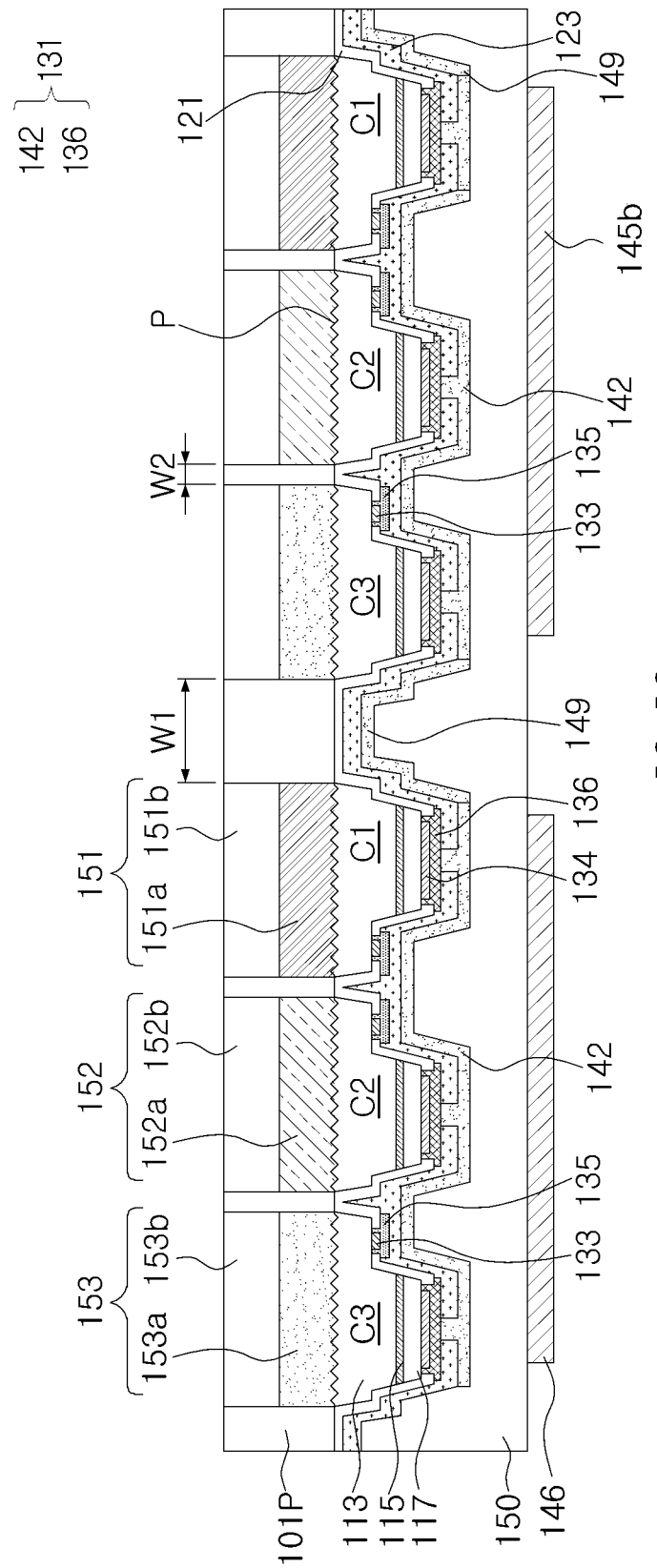

FIGS. 3A through 3D are cross-sectional views of the LED module illustrated in FIGS. 1 and 2. FIG. 3A is a cross-sectional view taken along line I1-I1 of FIGS. 1 and 2, FIG. 3B is a cross-sectional view taken along line I2-I2 of FIGS. 1 and 2, FIG. 3C is a cross-sectional view taken along line I3-I3 of FIGS. 1 and 2, and FIG. 3D is a cross-sectional view taken along line I4-I4 of FIGS. 1 and 2.

Referring to FIGS. 1, 2, and 3A through 3D, the LED module 100 may include a plurality of pixels, each pixel being formed of a plurality of sub-pixels (e.g., R, G, B). Each sub-pixel is formed of a light emitting cell C (in this example, one of C1, C2 and C3) and a light transmission portion (one of 151, 152 and 153). Each of the light emitting cells C1, C2 and C3 (generically referenced as "C") in this example is a light emitting diode. A group of light emitting cells (e.g., C1, C2 and C3) that are part of the same pixel is referred to herein as a "semiconductor light emitting element" LA.

The semiconductor light emitting elements LA that are part of the same light emitting module (e.g., 100) are referred to herein as a "light emitting unit." The light emitting modules and/or the light emitting units described herein may be embodied as a semiconductor chip. Plural light emitting modules and/or units (e.g., semiconductor chips) may be formed simultaneously on the same semiconductor wafer and singulated (cut) from each other.

The LED module 100 may comprise a light emitting unit as well as additional structure formed about the light emitting unit, such as wiring to drive the light emitting cells C, a plurality of light transmission portions 151, 152 and 153 to transmit and/or convert wavelengths of light emitted from the light emitting cells C, encapsulant 150 to provide a supporting structure, etc. The light transmission portions may be formed on corresponding light emitting cells C1, C2 or C3 after the light emitting unit is singulated (e.g. during assembly of a display panel formed of a plurality of light emitting units) or prior to the light emitting unit being singulated (e.g., while still integral with other light emitting units that were formed on the same wafer (e.g., as part of a semiconductor manufacturing process).

As shown in FIGS. 1 and 2, the LED module 100 comprises a light emitting unit formed of sixteen semiconductor light emitting elements LA arranged in a 4×4 matrix form. However, this is merely illustrative and the LED module 100 may include a light emitting unit including semiconductor light emitting elements LA arranged in a matrix form of m number of rows and n number of columns in a first direction (for example, in a traverse direction or row direction) and a second direction (for example, in a longitudinal direction or column direction) intersecting each other. Here, m and n are natural numbers equal to or greater than 2 and need not be equal to each other. In this example, each of the semiconductor light emitting elements LA comprises the light emitting diodes (light emitting cells C1, C2 and C3) of a single individual pixel and may be constitute part of a display panel 1000 (please refer to FIG. 50) to realize a spectrum of colors. In this example, each of the semiconductor light emitting elements LA include first to third light emitting cells C1, C2, and C3 which each constitute a light emitting diode of a corresponding one of three subpixels R, G, and B. The first to third light emitting cells C1, C2, and C3 each include a first conductivity-type (e.g., p-type or n-type) semiconductor layer 113, an active layer 115, and a second conductivity-type (different from the first conductivity-type) semiconductor layer 117. Total thickness (T) of the first conductivity-type semiconductor layer 113, the active layer 115, and the second conductivity-type semiconductor layer 117 may be less than 20 μm, such as less than 5 μm, or less than 1 μm. The active layer 115 may be disposed between the first conductivity-type semiconductor layer 113 and the second conductivity-type semiconductor layer 117, and may emit light having a specific wavelength. For example, the active layer 115 may emit blue light (having a wavelength ranging from 440 nm to 460 nm) or ultraviolet light (having a wavelength ranging from 380 nm to 440 nm). The active layers 115 of the first to third light emitting cells C1, C2, and C3 may be grown on a wafer or a substrate through the same process. The active layers 115 may emit the same color of light (e.g., light of the same wavelength).

In the below description, the surface of the light emitting unit emitting light (e.g., upper surfaces of first conductivity-type semiconductor layers 113) is referred to as a first surface and the other major surface of the light emitting unit opposite the light emitting surface (e.g., lower surfaces of second conductivity-type semiconductor layers 117) is referred to as a second surface.

The LED module 100 in this example includes first to third light transmission portions 151, 152, and 153 disposed on the first surface of the light emitting unit, and more specifically, are disposed on the first to third light emitting cells C1, C2, and C3, respectively. The first light transmission portion 151 is disposed on the first light emitting cell C1 (to form a red sub-pixel, e.g.), the second light transmission portion 152 is disposed on the second light emitting cell C2 (to formal green sub-pixel, e.g.), and the third light transmission portion 153 is disposed on the third light emitting cell C3 (to form a blue sub-pixel, e.g.). The one or more of the first to third light transmission portions 151, 152, and 153 may adsorb light emitted by the first to third light emitting cells C1, C2, C3, convert the same into light having a different color, and emit the converted light. For example, the first to third light transmission portions 151, 152, and 153 may convert adsorb light to red light, green light, and blue light, respectively and emit the same. Each of the first to third light transmission portions 151, 152 and 153 need not absorb and convert the wavelength of the absorbed light. For example, a transmission portion of one of the sub-pixels (e.g., 153 of sub-pixel B) may transmit the light emitted from the corresponding light emitting cell (e.g., C3) and need not contain a wavelength conversion layer nor a filter layer as described in the example below.

The first light transmission portion 151 may include a first wavelength conversion layer 151$a$ and a first filter layer 151$b$, the second light transmission portion 152 may include a second wavelength conversion layer 152$a$ and a second filter layer 152$b$, and the third light transmission portion 153 may include a third wavelength conversion layer 153$a$ and a third filter layer 153$b$.

The first to third wavelength conversion layers 151$a$, 152$a$, and 153$a$ may include various wavelength conversion materials such as one or more phosphors. Phosphor of the wavelength conversion materials may be part of a quantum dot (QD) (i.e., reference herein to the phosphor of the wavelength conversion material of the disclosed embodiments includes such phosphor alone or such phosphor that may be formed as quantum dots (QDs). The quantum dot may have a core-shell structure including Group II-VI or Group III-V compound semiconductors. For example, the quantum dot may have a core such as CdSe or InP and a shell such as ZnS or ZnSe. Also, the quantum dot may include a ligand to stabilize the core and shell. For example, the core may have a diameter ranging from about 1 nm to 30 nm, and preferably, about 3 nm to 10 nm in an example embodiment.

The shell may have a thickness ranging from about 0.1 nm to 20 nm, and preferably, about 0.5 nm to 2 nm in an example embodiment. The quantum dots may realize various colors according to their size. The use of quantum dots may be helpful to realize a narrow FWHM (e.g., 35 nm or less) of the converted light of the light converting part of the sub-pixel. The first to third wavelength conversion layers 151$a$, 152$a$, and 153$a$ may include different phosphors and/or quantum dots in order to emit light having different colors.

In one example, the first to third light emitting cells C1, C2, and C3 may emit UV light, the first wavelength conversion layer 151$a$ may include a red phosphor, the second wavelength conversion layer 152$a$ may include a green phosphor, and the third wavelength conversion layer 153$a$ may include a blue phosphor. In this example, the first to third filter layers 151$b$, 152$b$, and 153$b$ may selectively block UV light emitted by the light emitting cells C1, C2, and C3 that was not absorbed by the phosphors of the wavelength conversion layers 152$a$, 152$b$ and 152$c$. The first to third filter layers 151$b$, 152$b$, and 153$b$ may also be used to absorb a partial bandwidth of light converted by the first to third wavelength conversion layers 151$a$, 152$a$, and 153$a$ to narrow the bandwidth of the spectrum of light emitted by the sub-pixels (e.g., narrow a full width at half maximum (FWHM) of such spectrum), as well as to block UV light.

In another example, the first to third light emitting cells C1, C2, and C3 may emit blue light, the first wavelength conversion layer 151$a$ may include a red phosphor, the second wavelength conversion layer 152$a$ may include a green phosphor, and the third wavelength conversion layer 153$a$ may include a green phosphor having a concentration smaller than that of the second wavelength conversion layer 152$a$. Unless otherwise specified, generic reference to blue light, green light and red light herein refers respectively to light having respective wavelengths of 420 nm to 480 nm, 500 nm to 570 nm and 630 nm to 780 nm. Unless otherwise specified, generic reference to a blue sub-pixel, a green sub-pixel and a red sub-pixel refers to sub-pixels that emit light having a peak intensity of blue light, green light and red light, respectively. The green phosphor included in the third wavelength conversion layer 153$a$ may cause the blue sub-pixel B to emit green light at lower intensity than the blue light (e.g., less than 8% such as between 4% and 8% of the intensity of the blue light) may contribute to adjustment of color coordinates of blue light emitted by the third light emitting cell C3. In this example, the first and second filter layers 151$b$ and 152$b$ may selectively block blue light emitted by the light emitting cells C1 and C2. Layer 153 may be formed simply as a transmissive (transparent, translucent) layer or omitted entirely (i.e. without wavelength conversion and/or filtering as provided by 153$a$ and 153$b$).

Various materials such as a phosphor and/or quantum dots may be used as a wavelength conversion material for converting a wavelength of light emitted by a semiconductor light emitting element.

A non-exhaustive list of phosphors that may be used are set forth below with the following colors and empirical formulas:

Oxides Yellow and green: $Y_3Al_5O_{12}$:Ce,$Tb_3Al_5O_{12}$:
Ce,$Lu_3Al_5O_{12}$:Ce Silicates Yellow and green: $(Ba,Sr)_2SiO_4$:Eu, yellow and orange: $(Ba,Sr)_3SiO_5$:Ce Nitrides Green: β-SiAlON:Eu, yellow: $La_3Si_6N_{11}$:Ce, orange: α-SiAlON:Eu, red: $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$, where $0.5 \le x \le 3$, $0 < z < 0.3$, and $0 < y \le 4$. (Here, Ln may be at least one type of element selected from the group consisting of Group IIIa elements and rare earth elements, and M may be at least one type of element selected from the group consisting of calcium (Ca), barium (Ba), strontium (Sr), and magnesium (Mg)).

Fluorides KSF-based red: $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ Phosphor compositions may basically conform with stoichiometry, and respective elements of the phosphor may be substituted with different elements of respective groups of the periodic table. For example, strontium (Sr) may be substituted with barium (Ba), calcium (Ca), magnesium (Mg), and the like, of alkali earth elements, and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, and the like, may be additionally applied to change characteristics.

In particular, in order to enhance reliability at high temperatures and high humidity, the fluoride-based red phosphor may be coated with a fluoride not containing manganese (Mn) or may further include an organic substance coated on a surface of the fluoride coating not containing manganese (Mn). The fluoride-based red phosphor may realize a light spectrum having narrow full width at half maximum (FWHM) equal to or less than 40 nm, and thus, it may be desirable to use in forming high resolution TVs such as UHD TVs.

Table 1 below is a non-exhaustive list of the types of phosphors that may be used in example systems of the present disclosure, including in application fields of white light emitting devices using a blue LED chip of the present disclosure (e.g., having an active region emitting light at a wavelength of 440 nm to 460 nm) or a UV LED chip of the present disclosure (e.g., having an active region emitting light at a wavelength of 380 nm to 440 nm).

TABLE 1

| Purpose | Phosphor |
|---|---|
| LED TV | $\beta$-SiAlON:$Eu^{2+}$, (Ca, Sr)AlSiN$_3$:$Eu^{2+}$, La$_3$Si$_6$N$_{11}$:$Ce^{3+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Lighting Devices | $LU_3Al_5O_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Side viewing (Mobile devices, Laptop PCs) | $Lu_3Al_5O_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, $Y_3Al_5O_{12}$:$Ce^{3+}$, (Ca, Mg)$_2$SiO$_4$:$Eu^{2+}$, $K_2SiF_6$:$Mn^{4+}$, SrLiAl$_3$N$_4$: Eu, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Electrical components (Headlamps, etc.) | $Lu_3Al_5O_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$), $K_2TiF_6$:$Mn^{4+}$, $NaYF_4$:$Mn^{4+}$, $NaGdF_4$:$Mn^{4+}$, $K_3SiF_7$:$Mn^{4+}$ |

Also, quantum dots (QD) may replace use of a phosphor by itself or may be mixed with a phosphor (such as those described herein) and may also be employed as a wavelength conversion material for the embodiments described herein.

The LED module 100 may include a partition structure 101P disposed among the first to third light emitting cells C1, C2, and C3 on the first surface of the light emitting unit. The partition structure 101P may have a lattice structure accommodating the first to third light transmission portions 151, 152, and 153. As shown in FIG. 3B (as well as FIGS. 1, 3A, 3C and 3D), a width (W2) of the partition structure 101P disposed between the first to third light transmission portions 151, 152, and 153 in each of the semiconductor light emitting elements LA may be smaller than a width (W1, W3) of the partition structure 101P disposed at the boundary between the plurality of semiconductor light emitting elements LA. In an example embodiment, a width (W2) of the partition structure 101P disposed among the first to third light transmission portions 151, 152, and 153 in each of the semiconductor light emitting elements LA may be the same as a width (W1, W3) of the partition structure 101P disposed on the boundary between the plurality of semiconductor light emitting elements LA. The width (W1, W2, W3) of the partition structure 101P may be less than 100 μm, such as less than 20 μm, or less than 1 μm, such as less than 200 nm. Height (H) of the partition structure 101P may less than 500 μm, such as less than 100 μm, such as less than 20 μm, or less than 1 μm, such as less than 200 nm. In the present exemplary embodiment, the partition structure 101P may be a grid formed of a semiconductor crystalline material, such as silicon. For example, the partition structure 101P may be formed by etching openings in a silicon (Si) or other semiconductor crystalline wafer (e.g., etching the backside of the wafer) used as a growth substrate for forming the light emitting unit, but the present invention is not limited thereto.

The LED module 100 may include wiring electrodes disposed on the second surface of the light emitting unit internal to the LED module 100 such that each of the first to third light emitting cells C1, C2, and C3 of the semiconductor light emitting elements LA arranged within the LED module 100 may be independently driven.

The wiring electrodes may include first cell electrodes 130a each connected to a corresponding a first conductivity-type semiconductor layer 113 of a corresponding first light emitting cell C1, with first cell electrodes 130a of each of the semiconductor light emitting elements LA arranged in a first row extending in a first direction (e.g., left to right with respect to FIGS. 1 and 2) being commonly connected together. The wiring electrodes may include a second cell electrodes 130b each connected to a first conductivity-type semiconductor layer 113 of a corresponding second light emitting cell C2, with second cell electrodes 130b of each of the semiconductor light emitting elements LA arranged in a second row extending in the first direction being commonly connected together. The wiring electrodes may include a third cell electrodes 130c each connected to a first conductivity-type semiconductor layer 113 of a corresponding third light emitting cell C3, with third cell electrodes 130c of each of the semiconductor light emitting elements LA arranged in a third row extending the first direction being commonly connected together. Wiring electrodes also include a plurality of common cell electrodes 131 each connected to a second conductivity-type semiconductor layer 117 of a corresponding one of the first to third light emitting cells C1, C2, and C3, with common cell electrodes 131 of each of the semiconductor light emitting elements LA arranged in a column extending in the second direction being commonly connected together.

In this example, first cell electrodes 130a each comprise a first electrode 135 and a first base pad 141a, the second cell electrodes 130b each comprise a first electrode 135 and a second base pad 141b, and the third cell electrodes 130c each comprise a first electrode 135 and third base pad 141c. The first electrodes 135 each respectively connect to first conductivity-type semiconductor layers 113 of a corresponding one of the first to third light emitting cells C1, C2, and C3 of each of the semiconductor light emitting elements LA. Each first electrode 135 may extend in the row direction (e.g., left to right in FIGS. 1 and 2) and be electrically connected to neighboring light emitting cells (e.g., one of C1, C2 or C3) at their first conductivity-type semiconductor layer 113 (see FIG. 3D, e.g.). Thus neighboring first light emitting cells C1 in the row direction may have their first conductivity-type semiconductor layer 113 electrically connected together (e.g., to the same electrical node) via their corresponding first electrodes 135, neighboring second light emitting cells C2 in the row direction may have their first conductivity-type semiconductor layer 113 electrically connected together via their corresponding first electrodes 135, and neighboring third light emitting cells C3 in the row direction may have their first conductivity-type semiconductor layer 113 electrically connected together via their corresponding first electrodes 135 (see FIG. 3D). The first electrode 135 may be connected to a corresponding first conductivity-type semiconductor layer 113 by a first contact electrode 133.

The wiring electrodes may further include second electrodes 136 each connected to the second conductivity-type semiconductor layer 117 of a corresponding one of the first to third light emitting cells C1, C2, and C3. The second electrodes 136 may be connected to a corresponding second conductivity-type semiconductor layer 117 by a second contact electrode 134.

The wiring electrodes may include a first base pad 141a electrically connected to the first electrode 135 connected to neighboring (in the row direction) first light emitting cells C1, a second base pad 141b electrically connected to the first electrode 135 of connected to neighboring (in the row direction) second light emitting cells C2, and a third base pad 141c electrically connected to the first electrode 135 of connected to neighboring (in the row direction) third light emitting cells C3. The wiring electrodes may include a common base pad 142 commonly connected to the second electrodes 136 of the first to third light emitting cells C1, C2, and C3 arranged in a column direction (up and down with respect to FIGS. 1 and 2). Each common base pad 142 may electrically connect (e.g., to a corresponding same electrical node) the second conductivity-type semiconductor layers 117 of the first to third light emitting cells C1, C2, and C3 of a semiconductor light emitting element LA. Every semiconductor light emitting device LA may have first to third base pads 141a, 141b, and 141c and a common base pad 142.

The first cell electrode 130a of a first light emitting cell C1 may include the first electrode 135 at the first light emitting cell C1 and the first base pad 141a. The second cell electrode 130b of a second light emitting cell C2 may include the first electrode 135 at the second light emitting cell C2 and the second base pad 141b. The third cell electrode 130c of a third light emitting cell C3 may include the first electrode 135 at the third light emitting cell C3 and the third base pad 141c.

The first cell electrodes 130a (and their corresponding first electrodes 135) of the first light emitting cells C1 arranged in the first direction (row direction in FIGS. 1 and 2) may be electrically connected to each other as part of a corresponding electrical node. The second cell electrodes 130b (and their corresponding first electrodes 135) of the second light emitting cells C2 arranged in the first direction may be electrically connected to each other as part of a corresponding electrical node. The third cell electrodes 130c (and their corresponding first electrodes 135) of the third light emitting cells C3 arranged in the first direction may be electrically connected to each other as part of a corresponding electrical node. In this example, these electrical nodes of each row of light emitting cells are different nodes and are electrically isolated from each other (i.e., they are not part of the same electrical node). The first electrodes 135 corresponding to one of the neighboring first to third light emitting cells C1, C2, and C3 groups may be connected to each other by a corresponding first electrode connection part 139 (which may be made of the same material from the same conductive layer as the first electrodes 135). See e.g., FIG. 3D.

Rows of first cell electrodes 130a may be commonly connected to the first conductivity-type semiconductor layer 113 of each of the first light emitting cells C1 arranged in the first direction by corresponding first electrode connection parts 139. Rows of second cell electrodes 130b may be commonly connected to the first conductivity-type semiconductor layer 113 of each of the second light emitting cells C2 arranged in the first direction by corresponding first electrode connection parts 139. Rows of third cell electrodes 130c may be commonly connected to the first conductivity-type semiconductor layer 113 of each of the third light emitting cells C3 arranged in the first direction by corresponding first electrode connection parts 139.

The common cell electrode 131 may include the second electrodes 136 of the first to third light emitting cells C1, C2, and C3 and the common base pad 142 commonly connected to each second electrode 136 of a semiconductor light emitting elements LA.

In the present exemplary embodiment, the common base pads 142 of neighboring semiconductor light emitting elements LA in the second direction may be connected to each other by a corresponding metal connection part 149. Common cell electrodes 131 of a column of light emitting cells arranged in the second direction (including first to third light emitting cells C1, C2, and C3) of a plurality of light emitting elements may be commonly connected to each other and to the second conductivity-type semiconductor layer 117 of each of these first to third light emitting cells C1, C2, and C3 arranged in the second direction by the metal connection parts 149.

The LED module 100 may further include a first cell pad 143a connected to the first cell electrode 130a, a second cell pad 143b connected to the second cell electrode 130b, a third cell pad 143c connected to the third cell electrode 130c, and a common cell pad 144 connected to the common cell electrode 131. The first cell pad 143a may be in contact with the first base pad 141a, the second cell pad 143b may be in contact with the second base pad 141b, and the third cell pad 143c may be in contact with the third base pad 141c. The common cell pad 144 may be in contact with the common base pad 142.

In the light emitting module 100 of the present exemplary embodiment, one common cell pad 144 is disposed in each column of the semiconductor light emitting elements LA arranged in the second direction, and thus, a total of four common cell pads 144 are provided. The four common cell pads 144 may be disposed below mutually different semiconductor light emitting elements LA and arranged in a diagonal direction of the LED module 100. The first to third cell pads 143a, 143b, and 143c may be disposed in each row of the semiconductor light emitting elements LA arranged in the first direction, and may be disposed below mutually different semiconductor light emitting elements LA in each row.

The LED module 100 may further include first to third bonding pads 145a, 145b, and 145c respectively connected to the first to third cell pads 143a, 143b, and 143c, and may further include common bonding pads 146 respectively connected to the common cell pads 144. The bonding pads 145a, 145b, 145c and 146 may be chip pads and form external terminals of the LED module 100 to provide an electrical connection to an external system (e.g., a printed circuit board via solder bump connections to these chip pads). In the present exemplary embodiment, each of the first to third bonding pads 145a, 145b, and 145c and the common bonding pad 146 may be integrally formed below a different one of the first to third light emitting cells C1, C2, and C3 of the semiconductor light emitting elements LA. With respect to a top down view (or bottom up view, as shown in FIG. 2) of the first to third bonding pads 145a, 145b, and 145c and the common bonding pad 146 may have an area larger than the area of a single light emitting cell C. In this example, as shown in FIG. 2, each of the bonding pads 145a, 145b, 145c, 146 overlaps each of the light emitting cells (C1, C2 and C3) of a light emitting element (corresponding to a single pixel). In this example, the area of each of the bonding pads 145a, 145b, 145c, 146 approximates the area of the light emitting cells C1, C2 and C3 of the light emitting element it overlaps (here, each bonding pad is greater than 50% of the area of the smallest rectangle able to bound the light emitting cells C1, C2 and C3 of a light emitting element, i.e., a rectangle with two sides coextensive with the sides of cells C1, C2 and C3, a top coextensive with the top side of cell C3 and a bottom side coextensive with the bottom side of call C1, which may be referred to as a "bounding rectangle" of cells C1, C2 and C3). Each bonding pad may be greater than ⅔ of such a rectangular area. In other examples, the area of each of the bonding pads 145a, 145b, 145c, 146 may be substantially equal to or greater than the area of the smallest convex polygon (which may be referred to herein as a "bounding convex polygon", which may be a bounding rectangle) that bounds the light emitting cells C1, C2 and C3 of a light emitting element. In other examples, the bonding pads 145a, 145b, 145c, 146 may be offset from the area of light emitting element so that some of the edges of such bonding pads extend outside the bounding rectangle (or other bounding convex polygon) while other edges extend within the bounding rectangle (or other bounding convex polygon).

Figure 41:
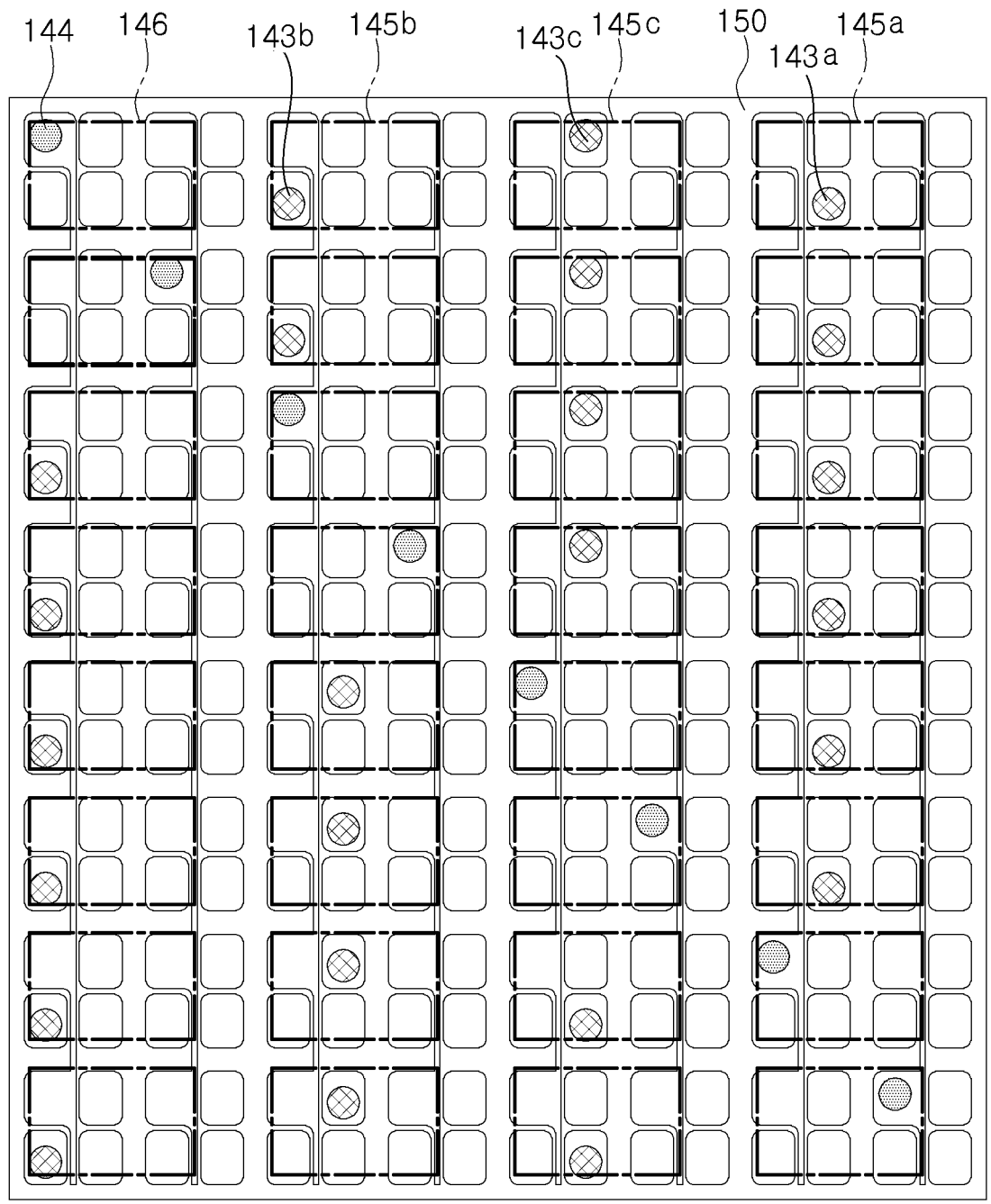
FIGS. 41 and 42 are schematic views illustrating an LED module according to an exemplary embodiment in the present disclosure.
Figure 42:
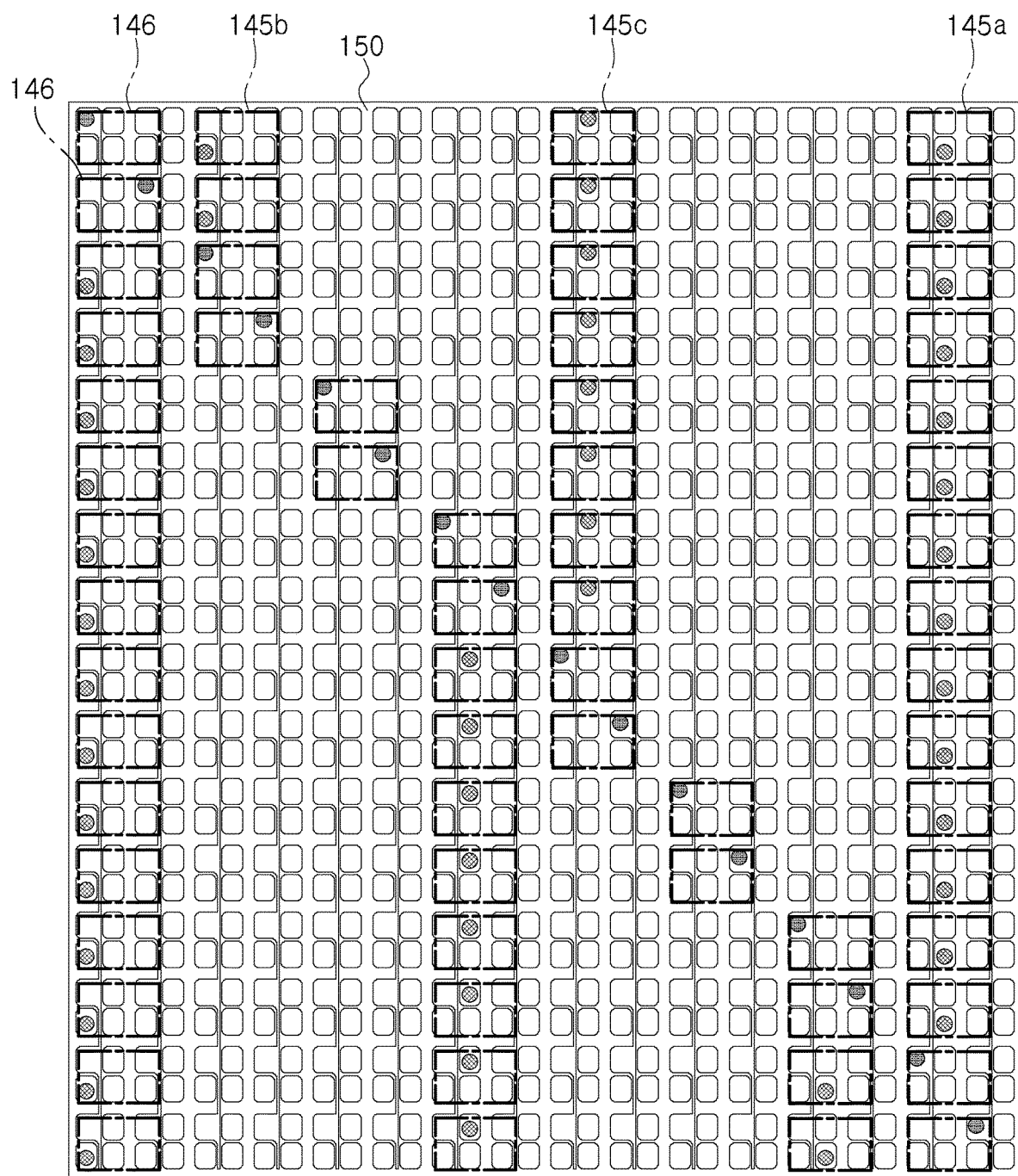

In an exemplary embodiment, as illustrated in FIGS. 41 and 42, in a case in which the LED module comprises a minimum sized repetitive structure corresponding to light emitting elements arranged in a 8×8 matrix (as in FIG. 41) or to semiconductor light emitting elements arranged in a 16×16 matrix (as in FIG. 42), bonding pads may be formed to be relatively larger (as compared to the size of the single light emitting cell C and/or light emitting element) than that of the exemplary embodiment of FIGS. 1, 2 and 3A-3D. For example, each of the first to third bonding pads 145a, 145b, and 145c and the common bonding pad 146 may be integrally formed and extend below two adjacent semiconductor light emitting elements LA. In the examples of FIGS. 41 and 42, each of the first to third bonding pads 145a, 145b, and 145c and the common bonding pad 146 have side edges (left and right side edges in this example) that extend below different light emitting elements LA, and have an area of about 150% of the bounding rectangle of cells C1, C2 and C3 (not shown in FIGS. 41 and 42) of a light emitting element (approximately equal to the area of the bounding rectangle of base pads 141, 142 of a light emitting element), although it will be recognized that such an area may be greater than 150% of the area of bounding rectangle of cells C1, C2 and C3 (and/or greater than 150% of the area of the bounding rectangle of cells C1, C2 and C3 of a light emitting element). As the area of cells C are the same (from a top down view) as the area of the corresponding subpixel that they form (and constitute a light emitting diode in these examples), the relative sizes of the bonding pads described herein with respect to the area of bounding convex polygons bounding light emitting cells is the same with respect to the area of bounding convex polygons bounding corresponding subpixels and/or light emitting diodes.

The LED module 100 includes first and second insulating layers 121 and 123 surrounding each of the first to third light emitting cells C1, C2, and C3. The first and second insulating layers 121 and 123 may separate the first to third light emitting cells C1, C2, and C3 from each other in the first and second directions. As illustrated in FIGS. 3A through 3D, the first insulating layer 121 may be in contact with the partition structure 101P among the first to third light emitting cells C1, C2, and C3. The second insulating layer 123 may be disposed between the first and second electrodes 135 and 136 and the base pads 141a, 141b, 141c, and 142. Through a portion from which a portion of the second insulating layer 123 has been removed, the first electrode 135 and the first to third base pads 141a, 141b, and 141c may be connected or the second electrode 136 and the common base pad 142 may be connected.

The LED module 100 may include an encapsulant 150 encapsulating a space between the semiconductor light emitting elements LA to support the light emitting unit including the semiconductor light emitting elements LA through which the first to third cell pads 143a, 143b, and 143c and the common cell pad 144 may have a bottom surface exposed (with respect to the encapsulant). The first to third cell pads 143a, 143b, and 143c, and the common cell pad 144 may extend through the encapsulant 150 to respectively contact and electrically connect to the first to third bonding pads 145a, 145b, and 145c, and the common bonding pad 146 of different light emitting elements LA. The first to third cell pads 143a, 143b, and 143c, and the common cell pad 144 may respectively extend between (and contact to provide an electrical connection) first to third base pads 141a, 141b, 141c and 142 of different light emitting elements LA, one of first to third bonding pads 145a, 145b, and 145c, and a common bonding pad 146. In the example of FIG. 2, the first to third cell pads 143a, 143b, and 143c, and the common cell pad 144 are shown as having a circular shape (from a bottom up or top down view) representing a pillar shape of the cell pads. Each of the first to third cell pads 143a, 143b, and 143c, provide a direct electrical connection between (and contacts) the bonding pad (one of 145a, 145b, 145c) which overlaps such cell pad in FIG. 2, and a base pad (141a, 141b, 141c—not shown in FIG. 2) of the light emitting cell C1, C2 or C3 which overlaps such cell pad. Common cell pad 144 provides a direct electrical connection between (and contacts) the bonding pad 146 which overlaps such common cell pad 144 and the common base pad 142 of the light emitting cell C which overlaps such common cell pad 144.

The first to third bonding pads 145a, 145b, and 145c, and the common bonding pad 146 may form the external terminals of the LED module 100 and be used to electrically connect the LED module 100 to a system printed circuit board or other system substrate. Outer surfaces of the first to third bonding pads 145a, 145b, and 145c, and the common bonding pad 146 may comprise an adhesive layer in order to enhance adhesion when mounted on a circuit board. The adhesive layer may include gold (Au), tin (Sn), silver (Ag), nickel (Ni), and the like.

The present exemplary embodiment relates to the LED module 100 including the plurality of light emitting cells C1, C2, and C3 operated in a passive matrix manner. In this case, a pixel (having a single light emitting element LA, having plural sub-pixels R, G, B corresponding to cells C1, C2 and C3) may be driven by itself (without driving any other pixels of the LED module 100) or may be driven as part of driving a column of such pixels simultaneously by applying the appropriate voltages across the signal lines (including the wiring discussed herein) connected to the cells C1, C2 and C3. According to the present exemplary embodiment, the number of electrode pads required for independently driving the plurality of light emitting cells C1, C2, and C3 within the LED module 100 may be reduced. In addition, since the electrode pads may be formed to be larger, defective bonding when mounted on a circuit board may be reduced. In particular, a single LED module 100 (which may be formed as a single LED semiconductor chip and/or single LED package) may comprise a m×n array of pixels, with each pixel comprising s sub-pixels for a total of m×n×s subpixels in the entire LED module 100 (where m, n and s are integers greater than 1). In considering a comparative example LED module that uses a single common bonding pad for all sub-pixels and a separate bonding pad for each of the sub-pixels, the number of bonding pads required would equal m×n×s+1. However, the number of bonding pads of the LED module 100 of the present embodiment is m×n (or 16), or less than ⅓ of m×n×s+1, while still providing the ability to drive each pixel individually (e.g., with different selected driving voltages applied across the sub-pixels of a pixel that do not cause other pixels to operate), or even to drive each sub-pixel individually (although these individual operations of driving a pixel and sub-pixel may be less preferable than simultaneously driving a column of pixels of the LED module 100 with selected drive voltages applied across all of the corresponding sub-pixels in the column of pixels, which the LED module 100 is also configured to be driven in such a manner). It will be appreciated that even further reductions in the ratio of pads/sub-pixels of the LED module 100 may be implemented in other examples, such as less than ⅙ of m×n×s+1 as implemented in the embodiments of FIGS. 41 and 42. It will be appreciated that in certain examples, s may equal 1 (i.e., each pixel is not formed of multiple sub-pixels but comprises a single light emitting diode (e.g., single light emitting cell), such as when used to form a monochromatic display).

Figure 50:
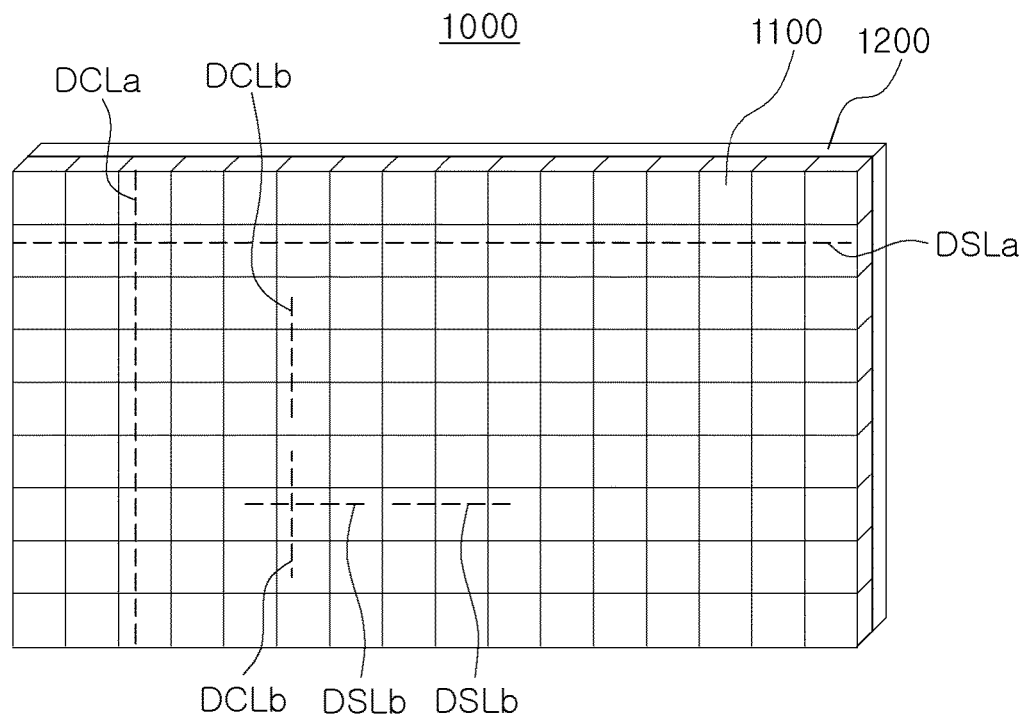
FIG. 50 is a view schematically illustrating a display panel according to an exemplary embodiment in the present disclosure.

Also, using the LED module 100 according to the present exemplary embodiment in which semiconductor light emitting elements realizing full colors are arranged in a matrix form, a process of manufacturing an LED display panel 1000 illustrated in FIG. 50 may be simplified, whereby a manufacturing time may be shortened and manufacturing costs may be reduced.

FIGS. 4 through 22 are views illustrating a method for manufacturing the LED module 100 according to an exemplary embodiment in the present disclosure. In FIGS. 4 through 22, evenly numbered drawings are plan views, and oddly numbered drawings are cross-sectional views taken along line II-II of the plan views. A method for manufacturing an LED module according to the present exemplary embodiment is performed by a wafer level package process, and light emitting elements of a 4×4 matrix formed in a partial region of a wafer are illustrated for the purposes of description.

Figure 4:
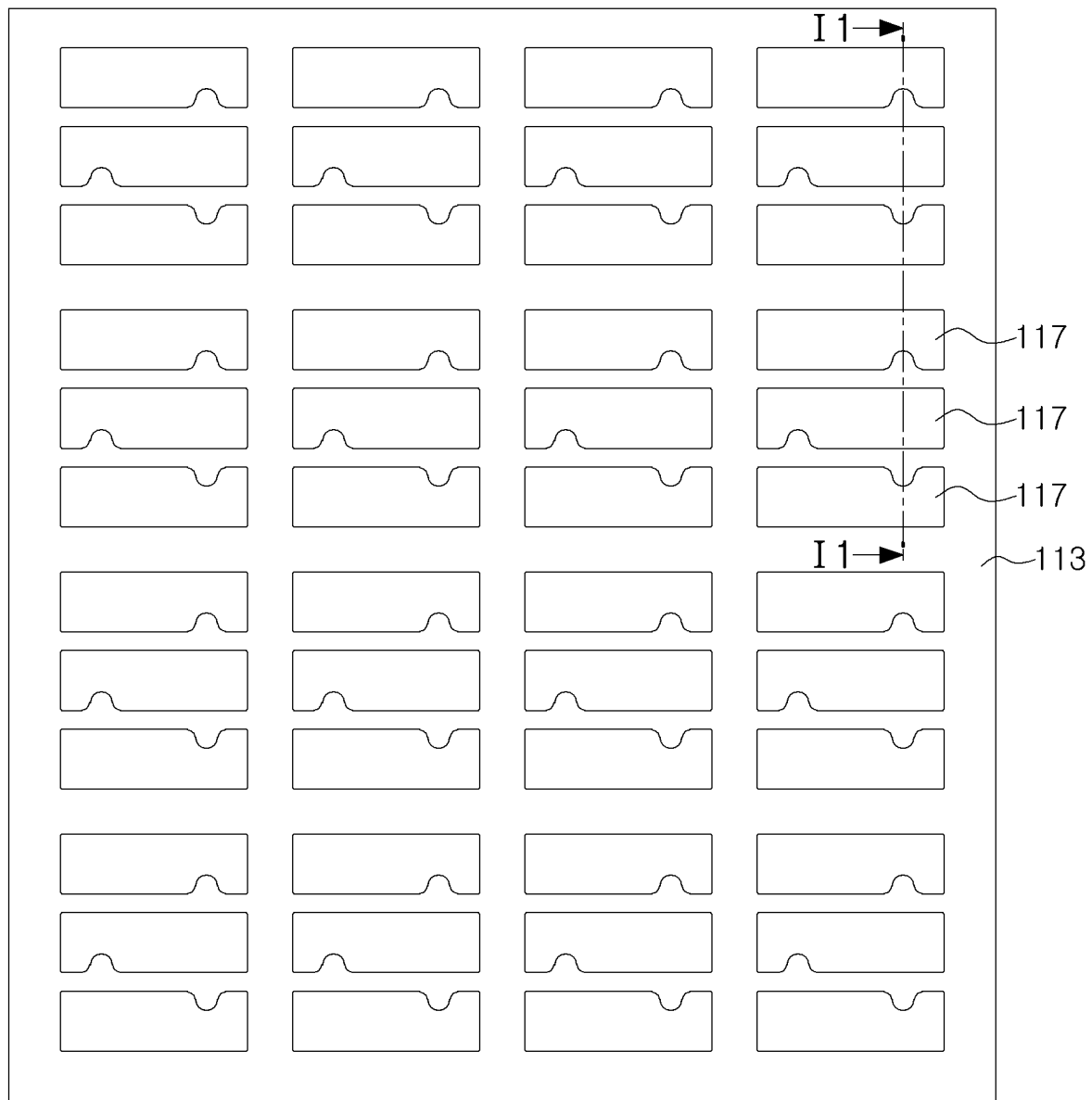
FIGS. 4 through 22 are views illustrating a method for manufacturing an LED module according to an exemplary embodiment of the present disclosure.
Figure 5:
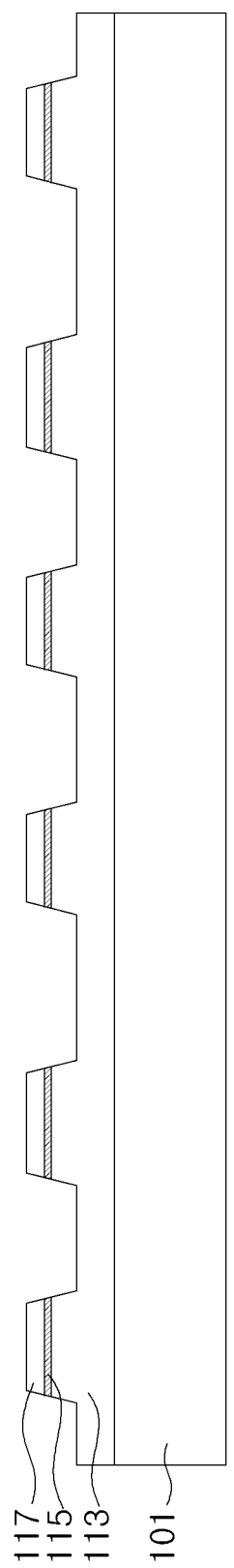

Referring to FIGS. 4 and 5, a method for manufacturing an LED module 100 may start by forming a light emitting structure including a first conductivity-type semiconductor layer 113, an active layer 115, and a second conductivity-type semiconductor layer 117 stacked on a substrate 101.

As the substrate 101, an insulating, conductive, or semiconductor substrate may be used as necessary. The substrate 101 may be a crystalline wafer comprising sapphire, SiC, Si, $MgAl_2O_4$, MgO, $LiAlO_2$, $LiGaO_2$, GaN, and the like and be a growth substrate used to epitaxially grow the PIN light emitting diodes described herein. In the present exemplary embodiment, the substrate 101 may be, for example, a crystalline silicon (Si) wafer substrate.

The first conductivity-type semiconductor layer may be a crystalline nitride semiconductor satisfying n-type $In_xAl_yGa_{1-x-y}N$, where $0 \leq x<1$, $0 \leq y<1$, and $0 \leq x+y<1$, and an n-type impurity may be Si, Ge, Se, or Te. The active layer 115 may have a multi-quantum well (MQW) structure in which quantum well layers and quantum barrier layers are alternately stacked. For example, the quantum well layers and the quantum barrier layers may be formed of crystalline $In_xAl_yGa_{1-x-y}N$, where $0 \leq x<1$, $0 \leq y \leq 1$, and $0 \leq x+y \leq 1$, having different compositions. In a specific example, the quantum well layers may be formed of crystalline $In_xGa_{1-x}N$, where $0<x \leq 1$, and the quantum barrier layers may be formed of crystalline GaN or crystalline AlGaN. The active layer 115 may be an intrinsic layer. The second conductivity-type semiconductor layer 117 may be a crystalline nitride semiconductor layer satisfying p-type $In_xAl_yGa_{1-x-y}N$, where $0 \leq x<1$, $0 \leq y<1$, and $0 \leq x+y<1$, and a p-type impurity may be Mg, Zn, or Be. The first conductivity-type semiconductor layer 113, the active layer (or the intrinsic layer) 115, and the second conductivity-type semiconductor layer 117 may be epitaxially grown and may form a multi-layered structure.

A buffer layer may be formed between the substrate 101 and the first conductivity-type semiconductor layer 113. The buffer layer may be formed of $In_xAl_yGa_{1-x-y}N$, where $0 \leq x \leq 1$ and $0 \leq y \leq 1$. The buffer layer may be formed of crystalline semiconductor, such as AlN, AlGaN, or InGaN. If necessary, the buffer layer may be formed by combining a plurality of layers having different compositions or may be formed of a single layer in which compositions are gradually changed.

Thereafter, the multi-layered structure comprising first conductivity-type semiconductor layer 113, the active layer (or the intrinsic layer) 115, and the second conductivity-type semiconductor layer 117 may be etched. Portions of the second conductivity-type semiconductor layer 117 and the active layer 115 may be etched to form a mesa structure using a photolithography process and an etching process such that a portion of the first conductivity-type semiconductor layer 113 is exposed. Here, in order to secure a region in which an electrode is formed in the first conductivity-type semiconductor layer in a follow-up process, a region in which the first conductivity-type semiconductor layer 113 is further locally exposed may be formed in each mesa structure.

Figure 6:
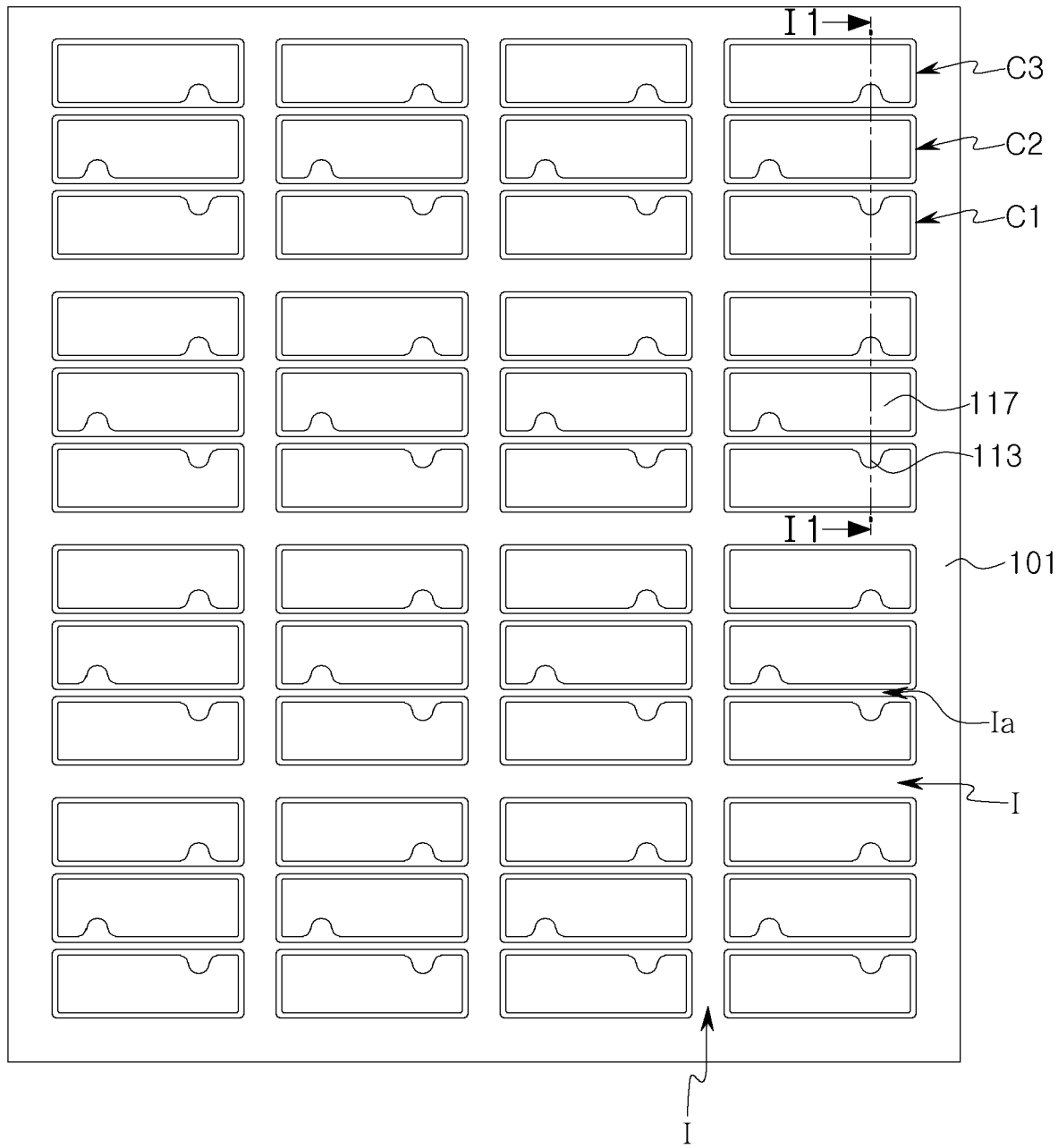
Figure 7:
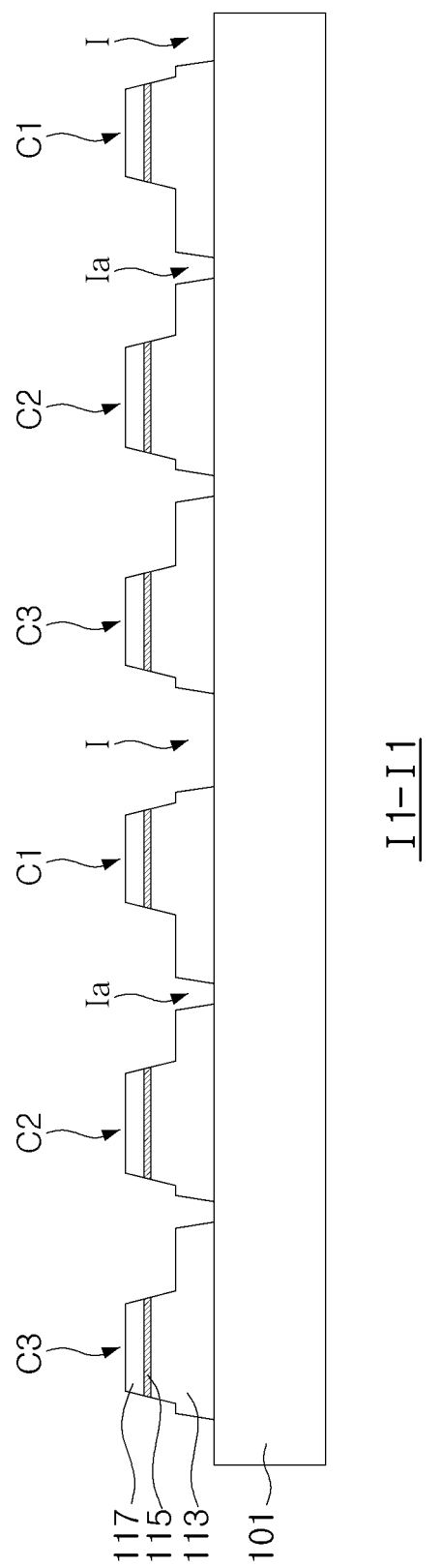

Referring to FIGS. 6 and 7, an isolation process may be performed to isolate the light emitting structure into a plurality of light emitting cells.

The exposed first conductivity-type semiconductor layer 113 may be etched to form an isolation region I and a sub-isolation region Ia exposing portions of the substrate 101. Through this process, the light emitting structure may be isolated into a plurality of light emitting cells C1, C2, and C3. The isolation region I may be formed in every three light emitting cells. The sub-isolation region Ia may be formed between the three light emitting cells C1, C2, and C3. The plurality of light emitting cells C1, C2, and C3 may have sloped side surfaces with respect to an upper surface of the substrate 101. The isolation region I may serve as a boundary demarcating an individual pixel of the display panel 1000 (please refer to FIG. 50), for example. The sub-isolation region Ia may serve as a boundary demarcating sub-pixels in an individual pixel of the display panel 1000.

Through this process, the light emitting structure may be divided into a plurality of light emitting elements arranged at predetermined intervals in a plurality of rows and a plurality of columns. Each of the plurality of light emitting elements includes the first to third light emitting cells C1, C2, and C3.

Figure 8:
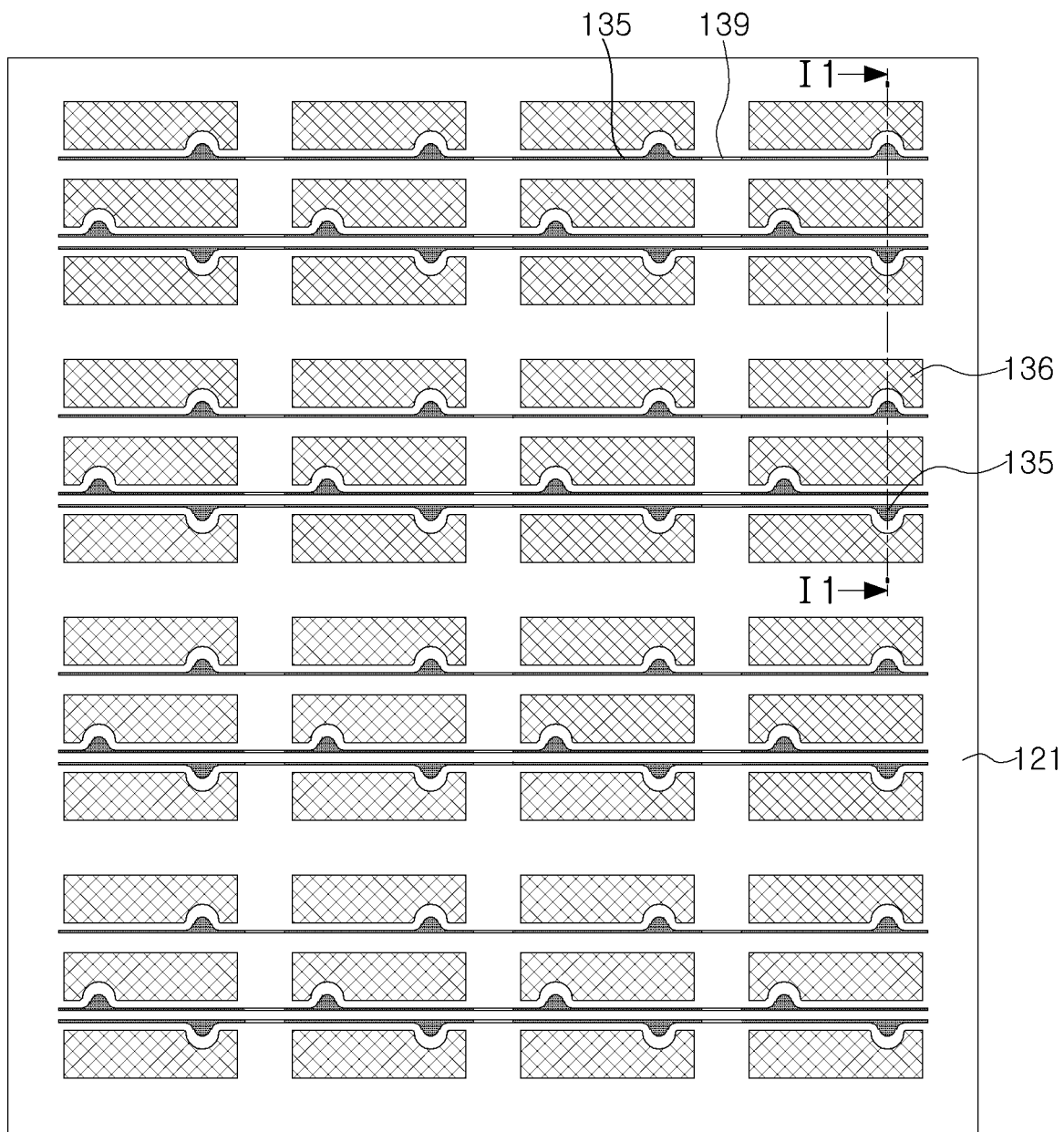
Figure 9:
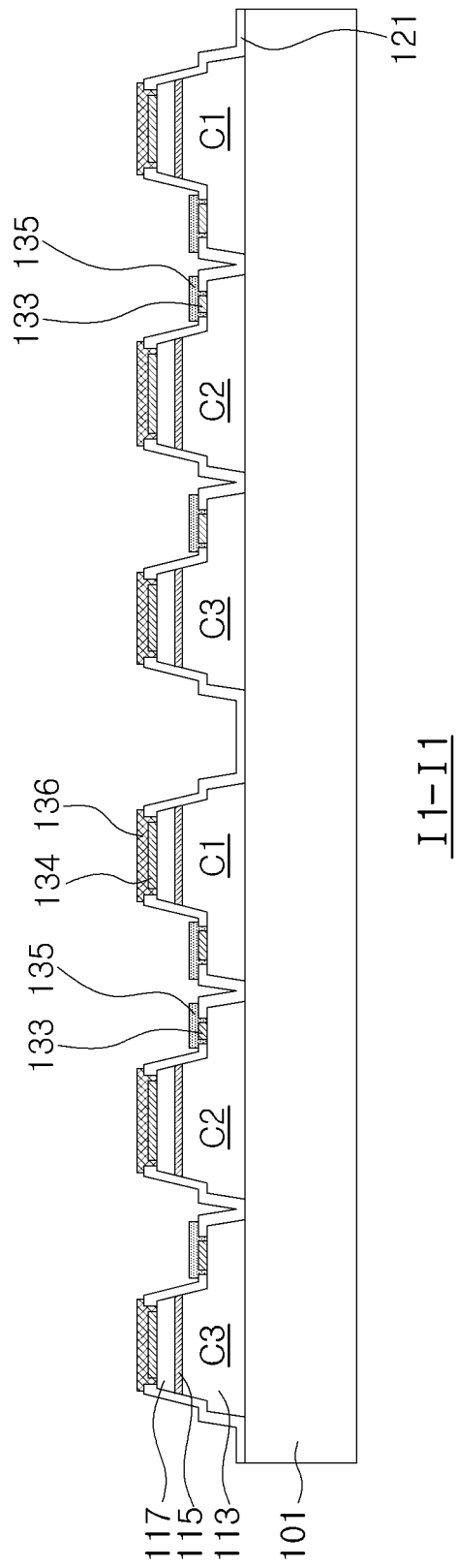

Referring to FIGS. 8 and 9, a first insulating layer 121 covering the plurality of light emitting cells C1, C2, and C3 may be formed. A first contact electrode 133 connected to the first conductivity-type semiconductor layer 113 through the first insulating layer 121 and a first electrode 135 may be formed. A second contact electrode 134 connected to the second conductivity-type semiconductor layer 117 through the first insulating layer 121 and a second electrode 136 may be formed.

The first insulating layer 121 may separate the light emitting cells C1, C2, and C3 formed in the isolation region I and the sub-isolation region Ia. The first insulating layer 121 may be formed on a side wall of the mesa structure to electrically isolate the first electrode 135 and the second electrode 136. The first insulating layer 121 may be formed of any material having electrically insulating properties, and may be formed of a material having low light absorption. The first insulating layer 121 may be formed of, for example, a silicon oxide, a silicon oxynitride, and a silicon nitride. Alternatively, in an exemplary embodiment, the first insulating layer 121 may be reflective. For example, the first insulating layer 121 may have a multilayer reflective structure in which a plurality of insulating films having different refractive indices are alternately stacked. The multilayer reflective structure may be a distributed Bragg reflector (DBR) in which a first insulating film having a first refractive index and a second insulating film having a second refractive index are alternately stacked. The multilayer reflective structure may be formed by stacking a plurality of insulating films having different refractive indices two to one hundred times. The insulating films forming the multi-reflective structure may be formed of $SiO_2$, $SiN$, $SiO_xN_y$, $TiO_2$, $Si_3N_4$, $Al_2O_3$, $ZrO_2$, $TiN$, $AlN$, $TiAlN$, or $TiSiN$.

The first insulating layer 121 may be conformally formed over the entire surface of the structure shown in FIGS. 6 and 7. Thereafter, a portion of the first insulating layer 121 is removed, and first and second contact electrodes 133 and 134 formed of a conductive material may subsequently be formed. A portion of the first insulating layer 121 formed on the first conductivity-type semiconductor layer 113 may be removed, and a first contact electrode 133 may be formed to be electrically connected to the first conductivity-type semiconductor layer 113. A portion of the first insulating layer 121 formed on the second conductivity-type semiconductor layer 117 may be removed, and a second contact electrode 134 may be formed to be electrically connected to the second conductivity-type semiconductor layer 117.

The first and second contact electrodes 133 and 134 may be reflective electrodes including one or more of the following: Ag, Al, Ni, Cr, Cu, Au, Pd, Pt, Sn, W, Rh, Ir, Ru, Mg, Zn, and an alloy material including at least one of Ag, Al, Ni, Cr, Cu, Au, Pd, Pt, Sn, W, Rh, Ir, Ru, Mg, Zn.

Thereafter, a first electrode 135 covering the first contact electrode 133 and a second electrode 136 covering the second contact electrode 134 may be formed. A plurality of first electrodes 135 respectively formed in the plurality of light emitting cells C1, C2, and C3 disposed in the first direction (for example, a traverse direction or a row direction—left to right in FIG. 8) in a region (hereinafter, referred to as a "module region") to be provided as a single LED module may be connected to each other by the first electrode connection part 139 disposed between the light emitting cells C1, C2, and C3. The first electrode 135 and the first electrode connection part 139 may be simultaneously formed from the same conductor in the same process steps and together may form a single wiring patterned from the same conductive layer. Thus, a boundary between the first electrode 135 and the first electrode connection part 139 may not be apparent. Each wiring comprising a combination of electrically connected first electrodes 135 and first electrode connection parts 139 (forming part of the same electrical node) may electrically connect the first conductivity-type semiconductor layer 113 of all or some of the light emitting cells C arranged in the row direction. A plurality of such wiring (135/139) may be formed so that all cells C arranged in a row direction have their first conductivity-type semiconductor layer 113 connected in common. Such wiring (135/139) may correspond to a signal line (SL1, SL2 or SL3) of FIG. 49.

The second electrode 136 may be discretely formed on each of the light emitting cells C1, C2, and C3 and remain unconnected at this stage. The second electrode 136 may be formed from the same material and with the same process steps as the first electrodes 135 and first electrode connection parts 139 (e.g., electrodes 135, 136 and connector 139 may be simultaneously formed from patterning same conductor layer in the same process steps).

Figure 10:
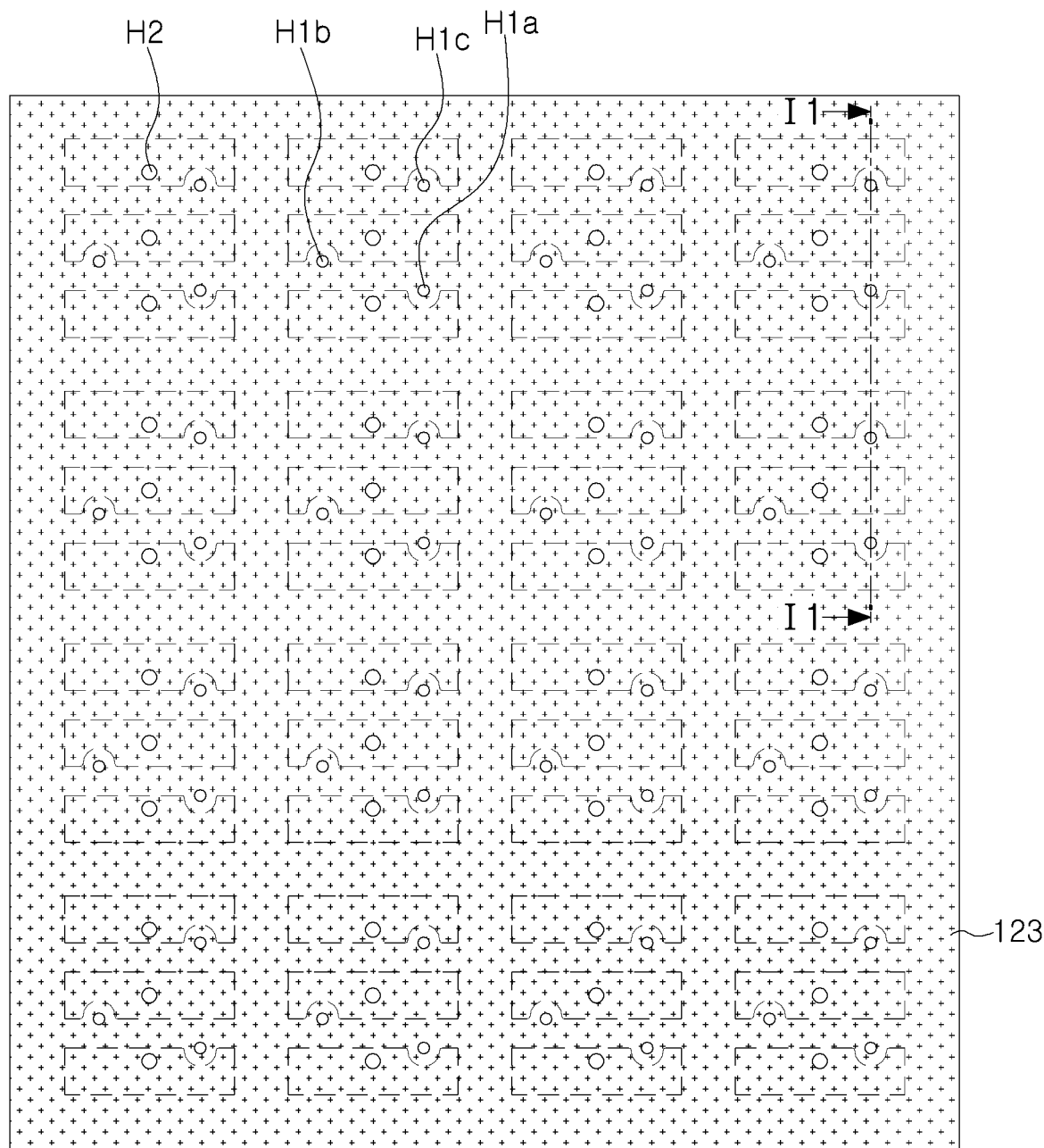
Figure 11:
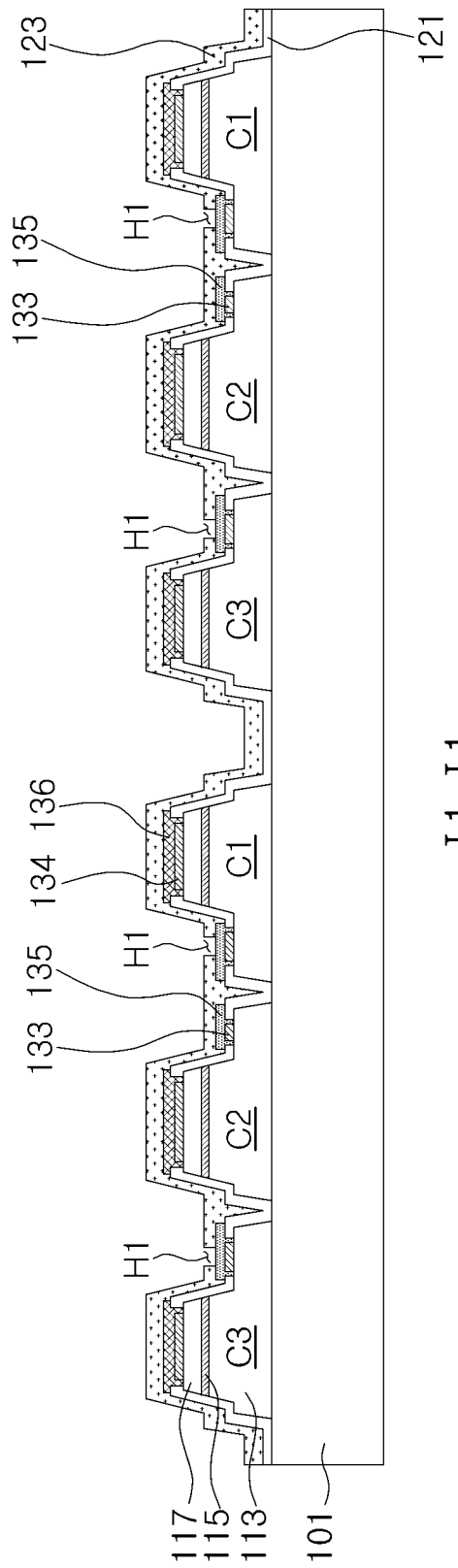

Referring to FIGS. 10 and 11, first and second contact holes H1a, H1b, H1c, and H2 may be formed within a subsequently deposited second insulating layer 123 that conformally covers the first insulating layer 121, the first electrode 135, and the second electrode 136.

The second insulating layer 123 covering the first insulating layer 121, the first electrode 135, and the second electrode 136 may be formed through a deposition process. The second insulating layer 123 may be formed of a material having electrically insulating properties (an insulator) and low light absorption. The second insulating layer 123 may be formed of a material the same as or similar to that of the first insulating layer 121.

Thereafter, a portion of the second insulating layer 123 may be removed to form the first contact holes H1a, H1b, and H1c and the second contact hole H2 of each of the first to third light emitting cells C1, C2, and C3. The first contact holes H1a, H1b, and H1c may expose a portion of the first electrode 135 of each of the first to third light emitting cells C1, C2, and C3, and the second contact hole H2 may expose a portion of the second electrode 135 of each of the first to third light emitting cells C1, C2, and C3.

Figure 12:
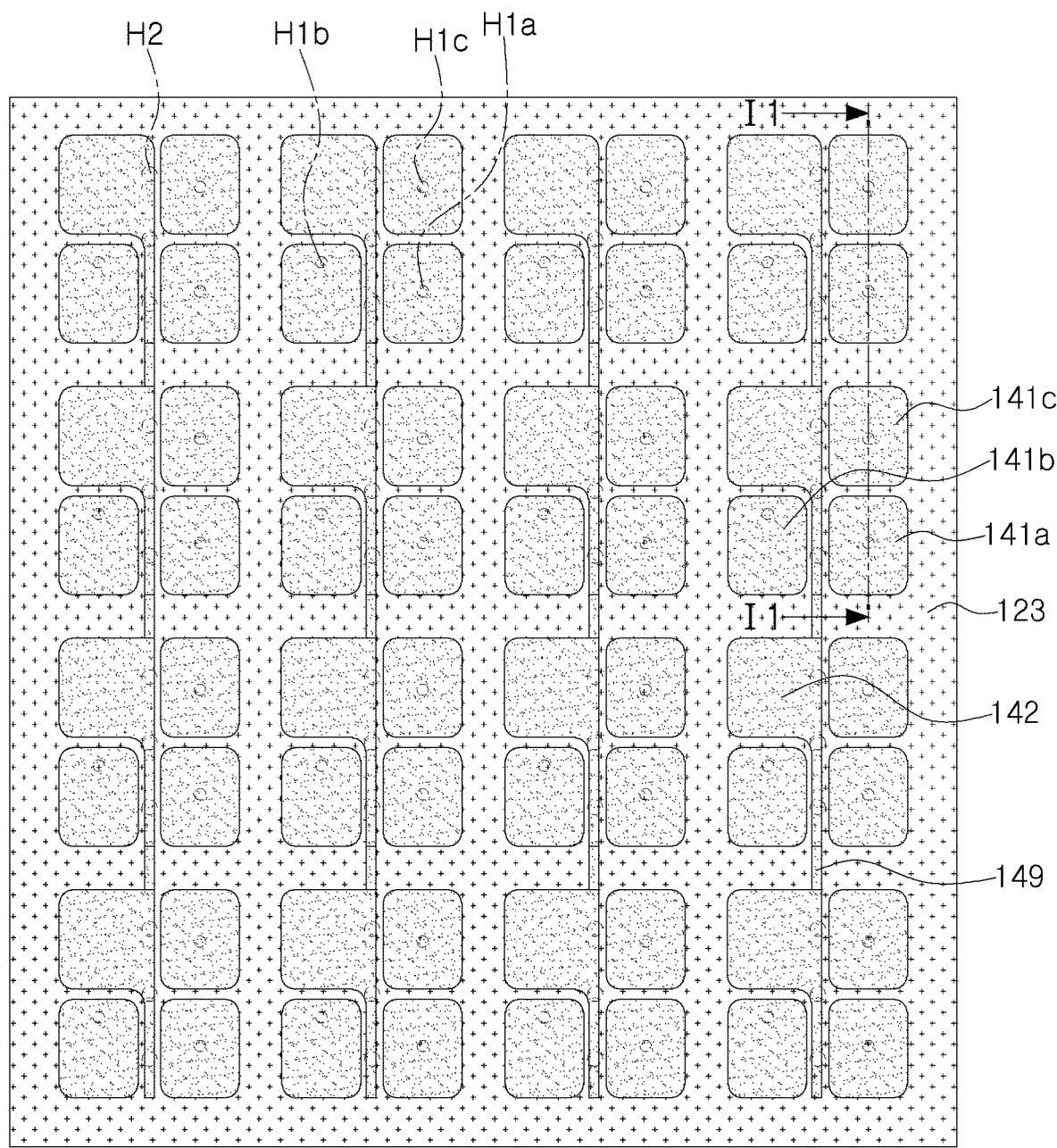
Figure 13:
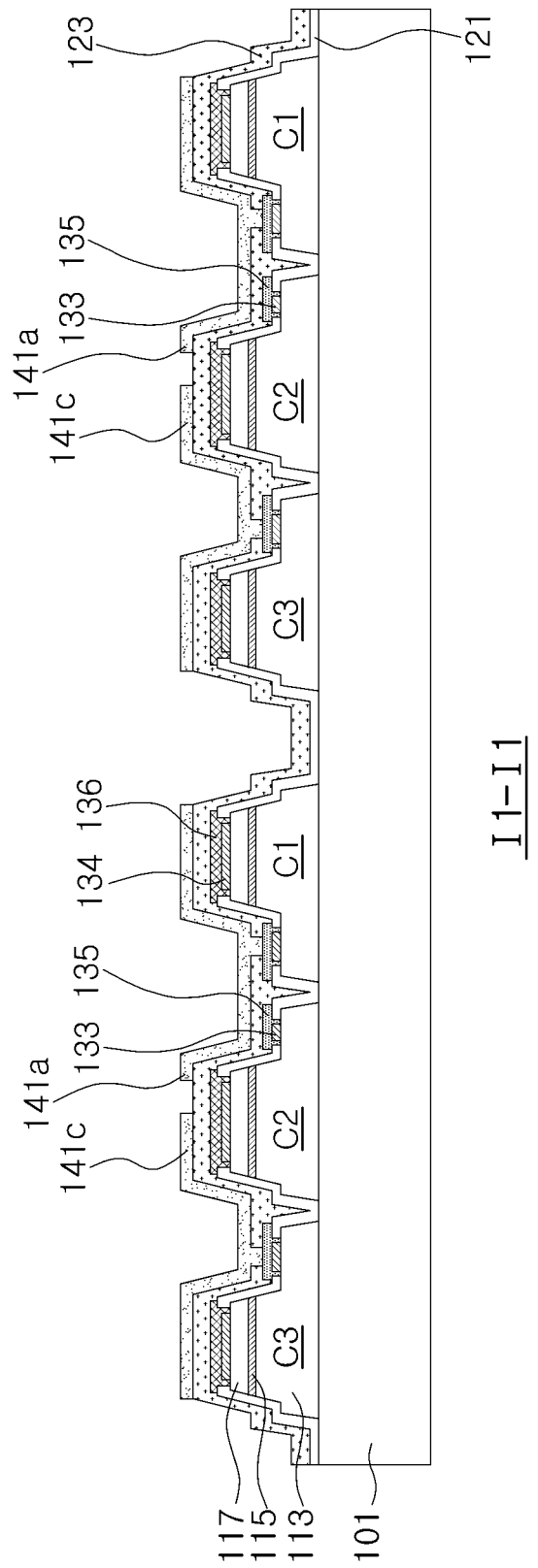

Referring to FIGS. 12 and 13, first to third base pads 141a, 141b, and 141c connected to the first electrode 135 of each of the first to third light emitting cells C1, C2, and C3 through the first contact holes H1a, H1b, and H1c and a common base pad 142 connected to the second electrode 136 of each of the first to third light emitting cells C1, C2, and C3 through the second contact hole H2 may be formed.

The first to third base pads 141a, 141b, and 141c may be formed on each of the first to third light emitting cells C1, C2, and C3 on the substrate 101. That is, for each light emitting element LA, a first base pad 141a connected to a first electrode 135 of a first light emitting cell C1, a second base pad 141b connected to a first electrode 135 of a second light emitting cell C2, and a third base pad 141c connected to the first electrode 135 of a third light emitting cell C3 may be formed.

The common base pads 142 may be connected to the second electrodes 136 of the first to third light emitting cells C1, C2, and C3 of each of the light emitting elements. The common base pads 142 of all of the first to third light emitting cells C1, C2, and C3 disposed in the second direction (for example, a longitudinal direction or a column direction) within the module region may be connected to each other by the metal connection part 149. The common base pad 142 and the metal connection part 149 may be simultaneously formed through a single process. The common base pad 142 and the metal connection part 149 may be simultaneously formed from the same conductor in the same process steps and together may form a single wiring patterned from the same conductive layer. Thus, a boundary of the common base pad 142 and the metal connection part 149 (although represented in FIG. 12) may not be apparent.

The first to third base pads 141a, 141b, and 141c and the common base pad 142 may be formed from the same conductive layer deposited through a plating process, such as forming a conductive layer conformally over the surface of the structure shown in FIG. 11 and patterning the conductive layer. The first to third base pads 141a, 141b, and 141c and the common base pad 142 may be formed of copper (Cu), but a material of the first to third base pads 141a, 141b, and 141c and the common base pad 142 is not limited thereto and the first to third base pads 141a, 141b, and 141c and the common base pad 142 may be formed of a conductive material other than copper.

Figure 14:
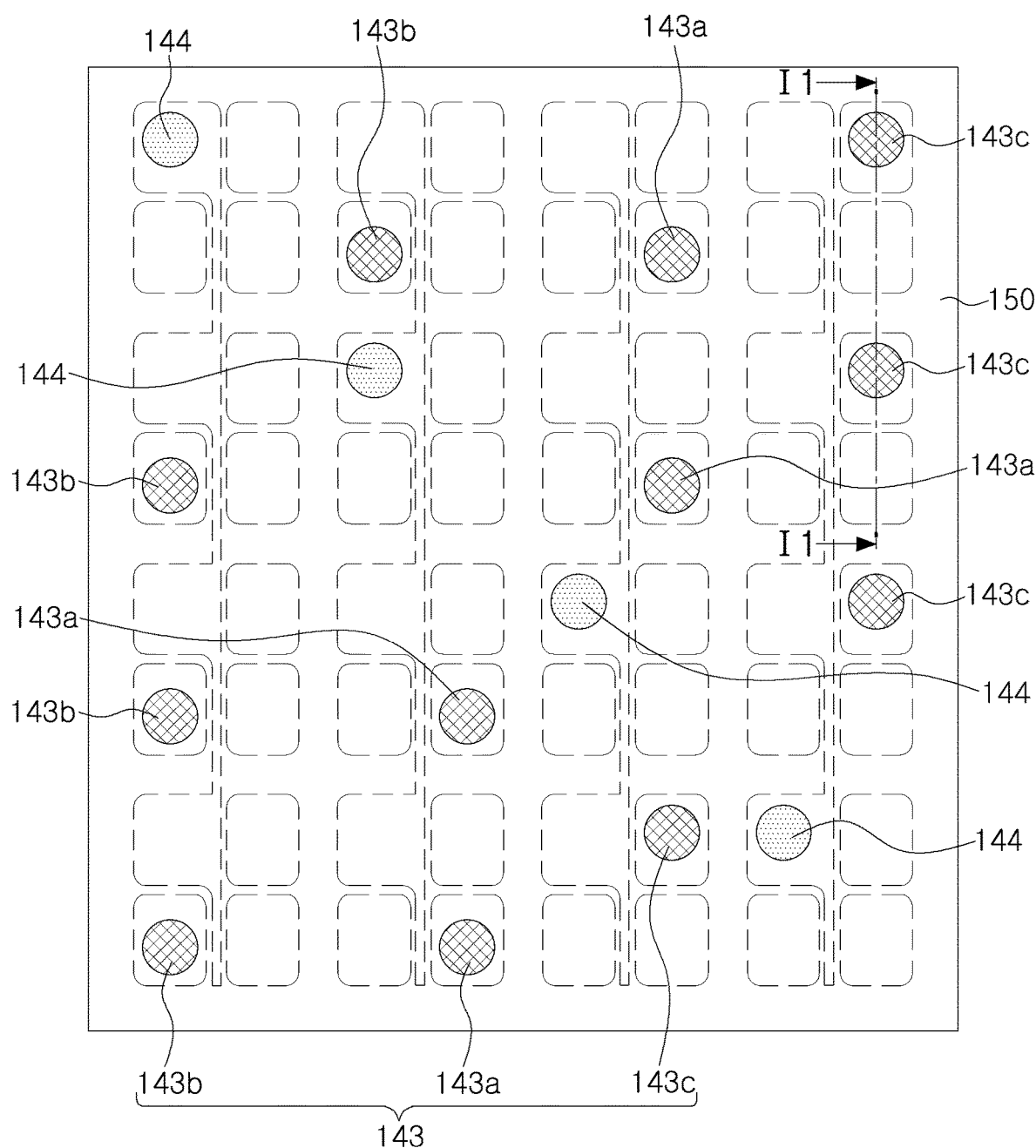
Figure 15:
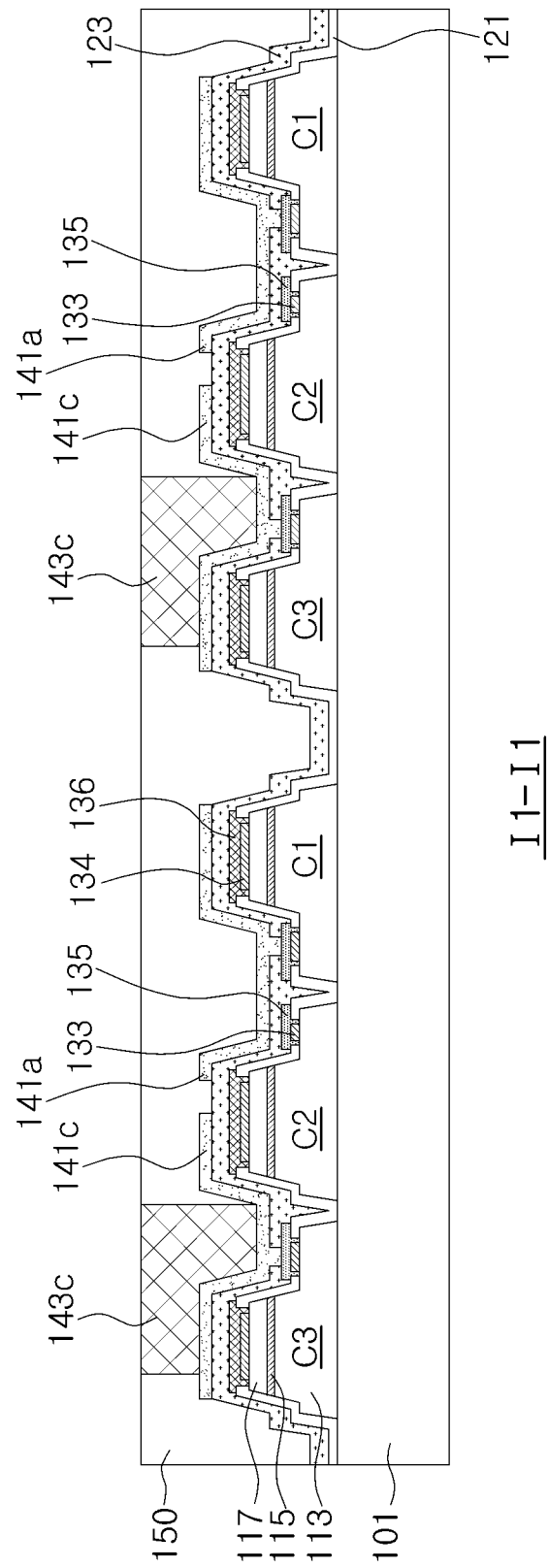

Referring to FIGS. 14 and 15, first to third cell pads 143a, 143b, and 143c respectively connected to respective ones of first to third base pads 141a, 141b, and 141c and a common cell pad 144 connected to the common base pad 142 may be formed and its sides surrounded by the encapsulant 150.

Each first cell pad 143a is commonly connected to the first light emitting cells c1 of the plurality of light emitting elements arranged in a row in the first direction within the module region, each second cell pad 143b is commonly connected to the second light emitting cells C2 arranged in a row, and each third cell pad 143c is commonly connected to the third light emitting cells C3 arranged in a row. Each row of light emitting elements (comprising the first to third light emitting cells C1, C2 and C of single pixel) may have a single first to third cell pads 143a, 143b, and 143c, where the first to third cell pads 143a, 143b and 143c disposed in each row of light emitting elements may be disposed on mutually different light emitting elements among the plurality of light emitting elements of each row of light emitting elements.

The common cell pad 144 commonly connected to Each column of the first to third light emitting cells C1, C2, and C3 (arranged in each in the second direction) of the module region may be connected to single common pad 144. Only one common pad 144 may be formed for each column of third to third light emitting cells C1, C2 and C3 in the module region. Each common cell pad 144 may be disposed on a light emitting element of a different row of light emitting elements. In this example, the common cell pads 144 are disposed along a diagonal line across the array of light emitting elements of the module region.

The first to third cell pads 143a, 143b, and 143c and the common cell pad 144 may be formed through a plating process. The first to third cell pads 143a, 143b, and 143c and the common cell pad 144 may be formed of copper (Cu), but a material of the first to third cell pads 143a, 143b, and 143c and the common cell pad 144 is not limited thereto and the first to third cell pads 143a, 143b, and 143c and the common cell pad 144 may be formed of a conductive material other than copper.

An encapsulant 150 encapsulating a space between the light emitting elements to support the light emitting elements and surround sides of the first to third cell pads 143a, 143b, and 143c and the common cell pad 144 may be formed. The encapsulant 150 may be formed through a process of applying a polymer resin material to cover the first to third cell pads 143a, 143b, and 143c and the common cell pad 144 and a planarization process such as grinding, or the like. During this process, the first to third cell pads 143a, 143b, and 143c and the common cell pad 144 may be partially exposed to one surface of the encapsulant 150. Alternatively, the first to third cell pads 143a, 143b, and 143c and the common cell pad 144 may be formed with a damascene process, comprising depositing the encapsulant 150, forming holes in the encapsulant at locations and sizes corresponding to the first to third cell pads 143a, 143b, and 143c and the common cell pad 144, depositing a conductive layer on the patterned encapsulant 150 including filling the holes formed therein, and performing a chemical-mechanical polishing of the structure to planarize the bottom surface of the structure and expose the encapsulant what had been covered by the conductive layer while leaving the portions of the conductive layer in the holes to form first to third cell pads 143a, 143b, and 143c and the common cell pad 144. In order to support the light emitting elements, the encapsulant 150 needs to have a high Young's modulus, and in order to dissipate heat generated by the light emitting elements, the encapsulant 150 may be formed of a material having high heat conductivity. The encapsulant 150 may be formed of an epoxy resin or a silicone resin, for example. Also, the encapsulant 150 may include light-reflective particles for reflecting light. The light-reflective particles may be formed of titanium dioxide ($TiO_2$) and/or an aluminum oxide ($Al_2O_3$), but a material thereof is not limited thereto.

Figure 16:
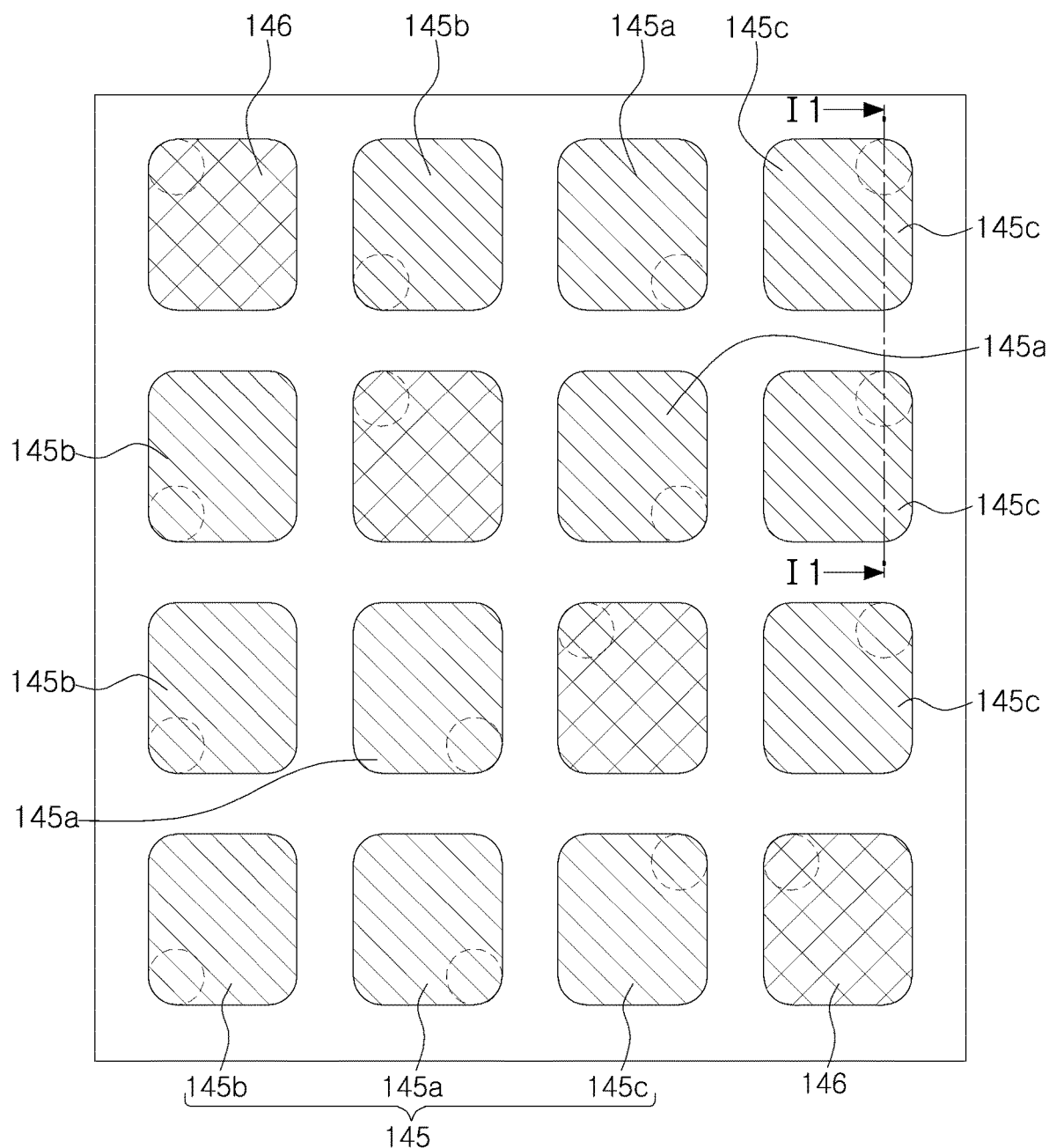
Figure 17:
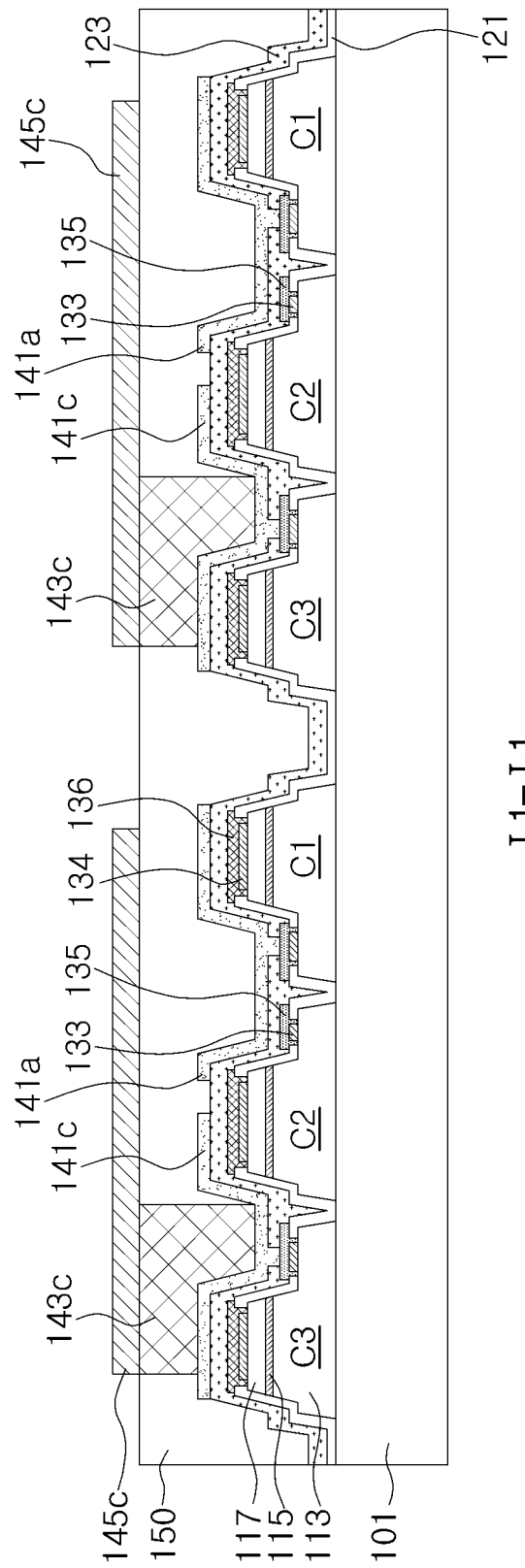

Referring to FIGS. 16 and 17, first to third bonding pads 145a, 145b, and 145c and a common bonding pad 146 formed on a surface of the encapsulant 150 and respectively connected to the first to third cell pads 143a, 143b, and 143c and the common cell pad 144 may be formed.

Within the module region, the first to third bonding pads 145a, 145b, and 145c may be disposed in each row in the first direction, and may be disposed over mutually different light emitting elements among the plurality of light emitting elements in each row.

For each column of first to third light emitting cells C1, C2, and C3 (arranged in in the second direction) a single common bonding pad 146 is disposed, and may be disposed over a different light emitting element of a different row than the other common bonding pads 146 and in this example, in a diagonal direction of the module region. In this example, each of the first to third bonding pads 145a, 145b, and 145c and a common bonding pad 146 may extend only over light emitting cells C of one light emitting element.

The first to third bonding pads 145a, 145b, and 145c and the common bonding pad 146 may be formed through a plating process. The first to third bonding pads 145a, 145b, and 145c and the common bonding pad 146 may be formed of copper (Cu), but a material of the first to third bonding pads 145a, 145b, and 145c and the common bonding pad 146 is not limited thereto and the first to third bonding pads 145a, 145b, and 145c and the common bonding pad 146 may be formed of a conductive material other than copper.

Figure 18:
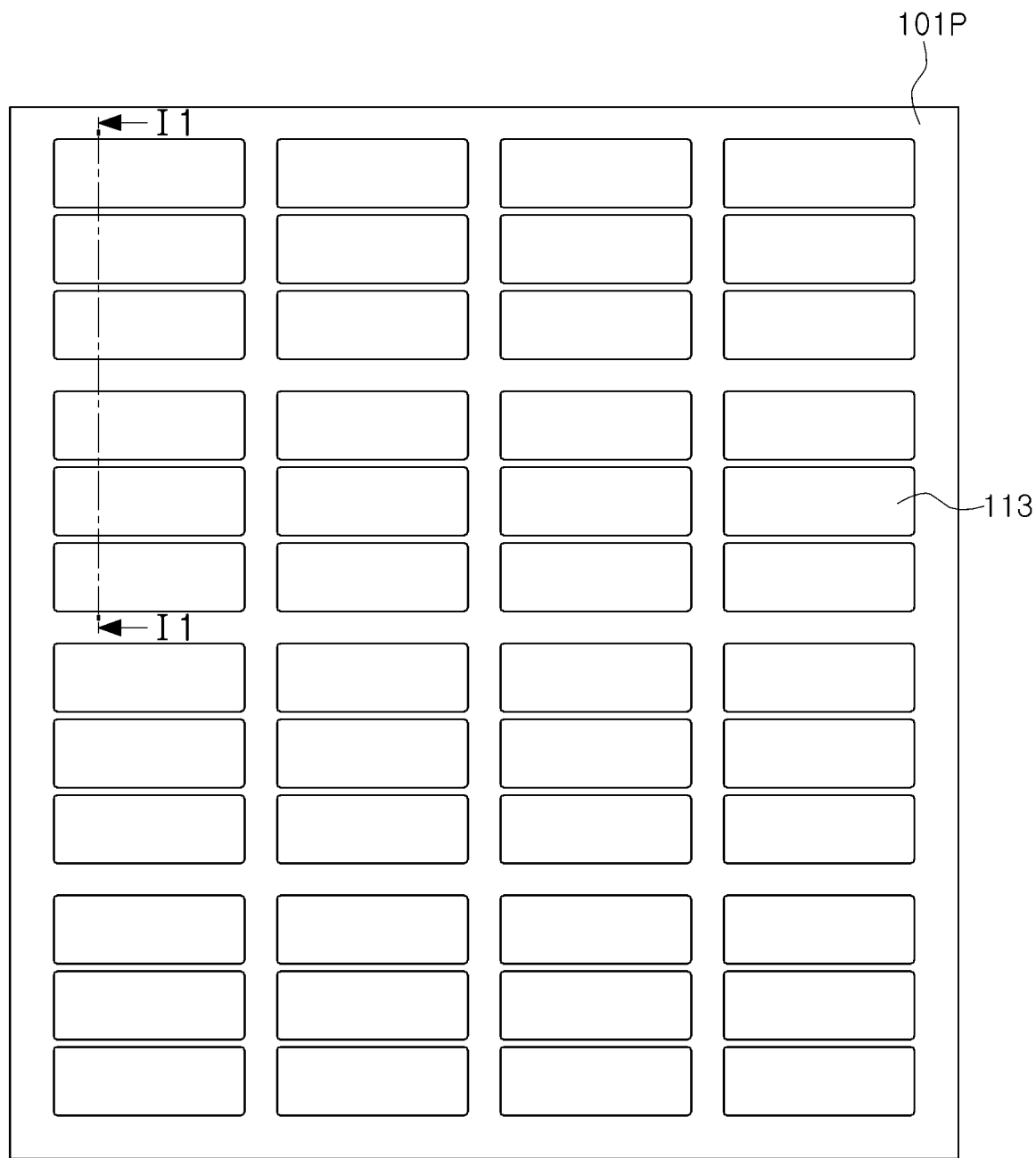
Figure 19:
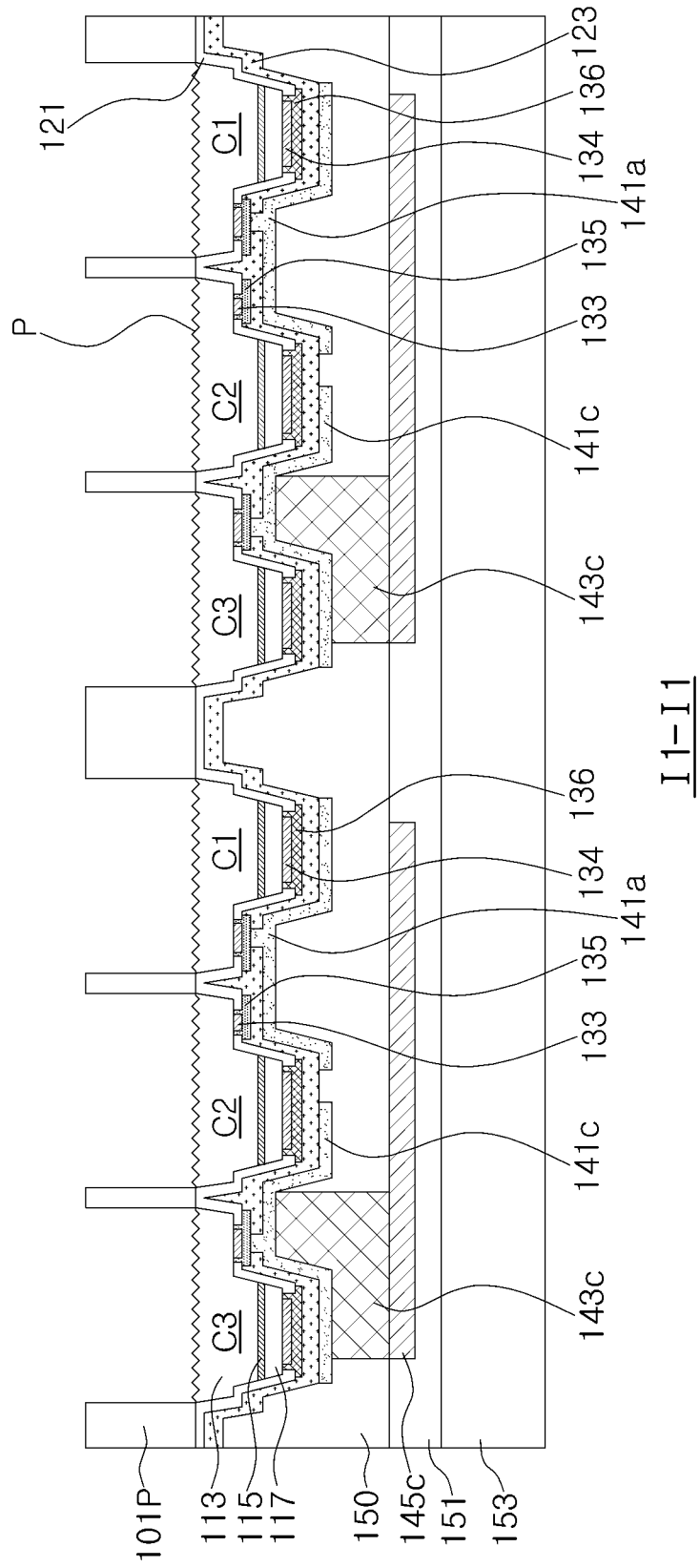

Referring to FIGS. 18 and 19, a partition structure 101p may be formed at a boundary between the plurality of light emitting cells C1, C2, and C3 and in a boundary between the plurality of light emitting elements.

A support substrate 154 may be attached to the first to third bonding pads 145a, 145b, and 145c and the common bonding pad 146. A bonding layer 155 such as a UV-curing film or wax may be formed to bond the support substrate 154. The support substrate 154 is temporarily attached to support the structure shown in FIGS. 16 and 17 while subsequent processes are performed.

Thereafter, a backside of the wafer may be etched so that portions of the substrate 101 (in this example, a crystalline silicon (Si) substrate of awafer) are removed (e.g., by etching the wafer using a patterned mask) in such a manner that the first conductivity-type semiconductor layers 113 are exposed by respective openings formed over the first conductivity-type semiconductor layers 113. The remaining substrate 101 may form a partition structure 101P between the plurality of light emitting cells C1, C2, and C3 and a boundary between the plurality of light emitting elements. The partition structure 101P may have a lattice or grid structure in which holes of the lattice expose the first conductivity-type semiconductor layer 113. A width of the partition structure disposed on the boundary between the plurality of light emitting cells C1, C2, and C3 of the same light emitting element may be smaller than a width of the partition structure disposed in the boundary between the plurality of light emitting elements.

After the partition structure 101P is formed, an irregular pattern P may be formed on an upper surface of the first conductivity-type semiconductor layer 113 in order to increase light emission efficiency. The irregular pattern P may be formed using an etchant different from an etchant used to expose the first conductivity-type semiconductor layer 113 (and form the partition structure 101P. The irregular pattern P may be formed through a wet etching method using a solution including KOH or NaOH or a dry etching method using an etchant gas including a $BCl_3$ gas. The irregular pattern P may be formed by a crystallographic etching process such that different crystalline faces of the first conductivity-type semiconductor layer 113 etch at different rates. The irregular pattern P may comprise grooves and/or protrusions having surfaces at an angle with respect to the surface of the first conductivity-type semiconductor layer 113 prior to this etch.

Alternatively, in an exemplary embodiment, the partition structure 101P may be formed through a separate process which is attached to the structure of FIGS. 16 and 17. After the substrate 101 is completely removed from the same such that the first conductivity-type semiconductor layer 113 is exposed. The partition structure 101P may comprise a black matrix resin.

In a case in which the substrate 101 is a transparent substrate such as sapphire, the substrate 101 may be separated from the light emitting regions through laser lift-off (LLO). A laser used in the LLO process may be any one of a 193 nm excimer laser, a 248 nm excimer laser, a 308 nm excimer laser, an Nd:YAG laser, a He—Ne laser, and an Ar ion laser. Also, in a case in which the substrate 101 is an opaque substrate such as silicon (Si), the substrate 101 may be removed through grinding, polishing, dry etching, or any combinations thereof.

Figure 20:
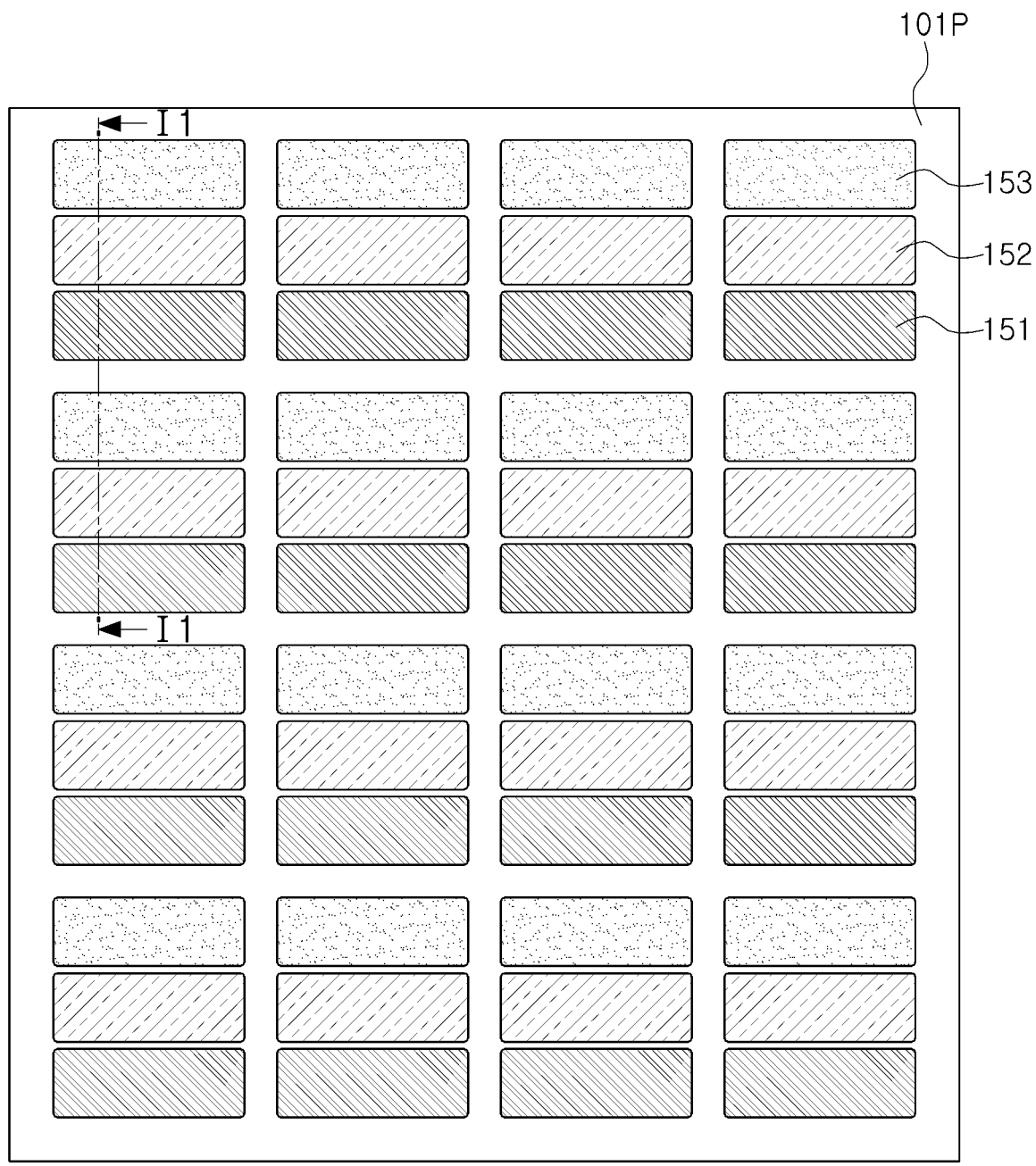
Figure 21:
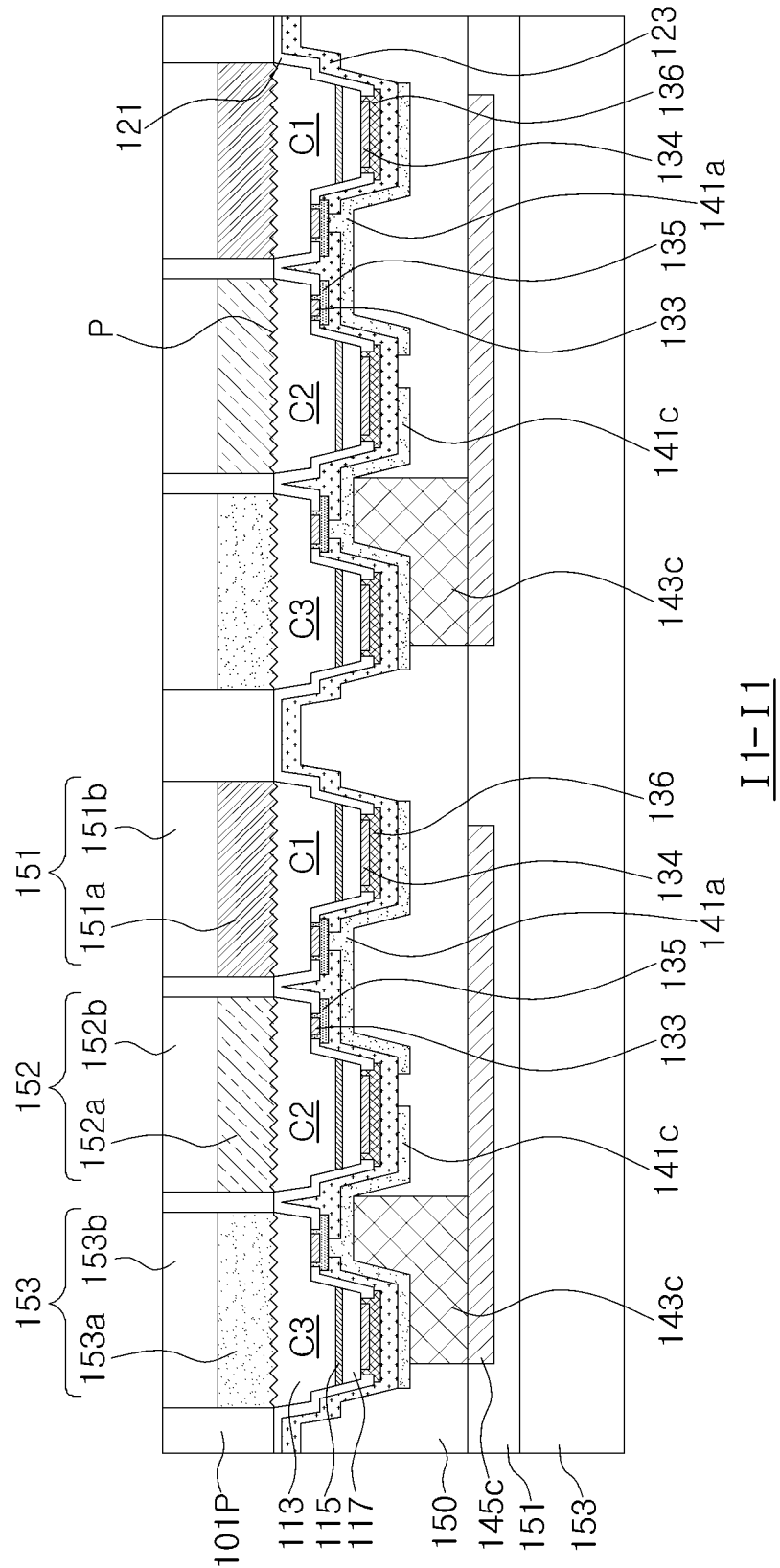

Referring to FIGS. 20 and 21, first to third light emission portions 151, 152, and 153 emitting light having different colors may be formed on the first conductivity-type semiconductor layer 113. The first light emission portion 151 may include a first wavelength conversion layer 151a and a first filter layer 151b, the second light transmission portion 152 may include a second wavelength conversion layer 152a and a second filter layer 152b, and the third light transmission portion 153 may include a third wavelength conversion layer 153a and a third filter layer 153b. Alternatively, one of the first to third light emission portions 151, 152, and 153 may be formed without a wavelength conversion layer, or a without a wavelength conversion layer to convert absorbed light to a wavelength corresponding to the color of the sub-pixel with which it is part of, as discussed elsewhere herein.

The first to third wavelength conversion layers 151a, 152a, and 153a may include different phosphors and/or quantum dots in order to emit light having different colors.

Figure 22:
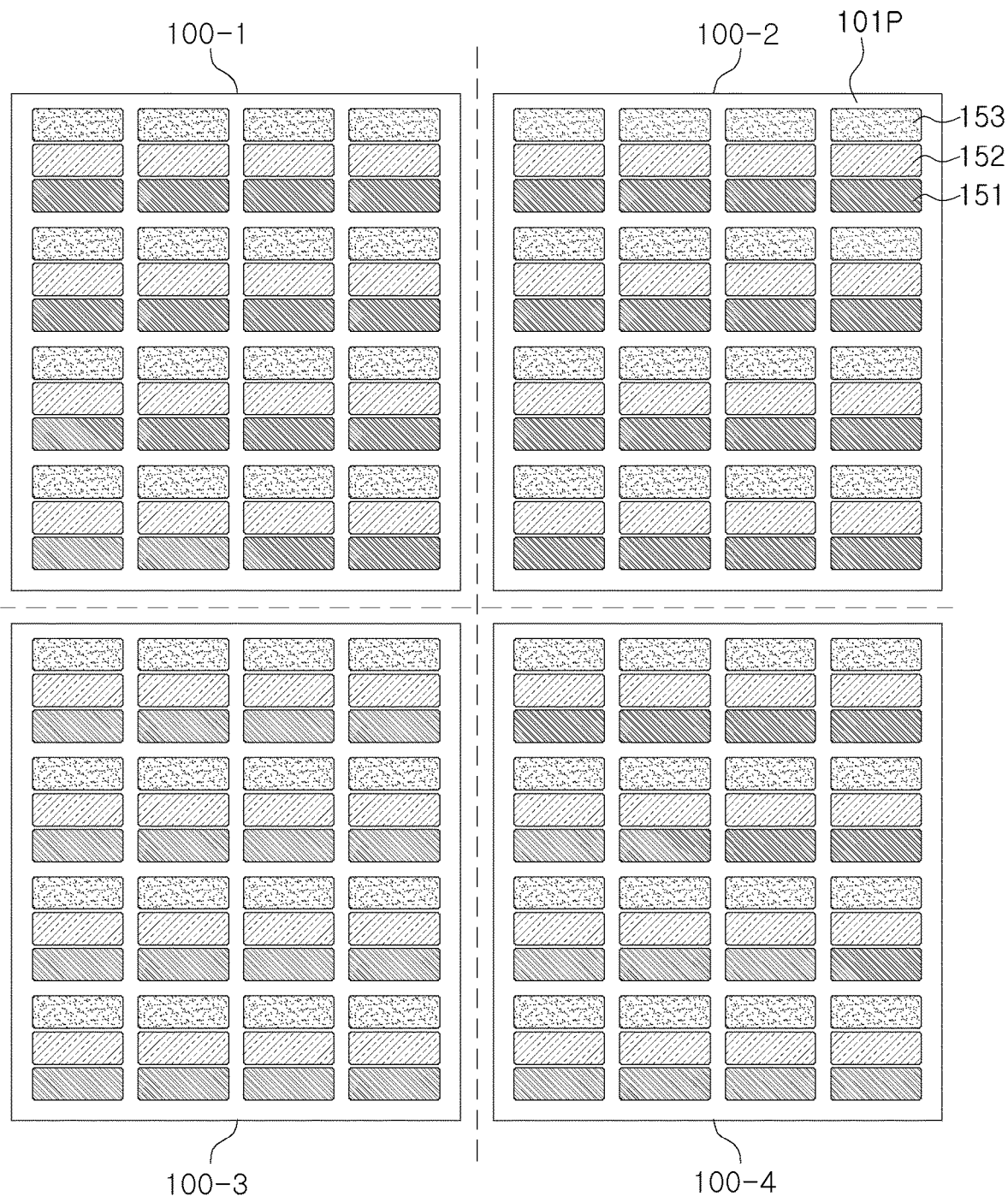

Referring to FIG. 22, a process of cutting module units is performed to manufacture the LED module 100.

The cutting process may be performed in such a manner that the support substrate 154 is removed, an adhesive tape is attached, and a cutting operation is subsequently performed with a blade. As shown in FIG. 22, multiple LED modules 100 (100-1, 100-2, 100-3 and 100-4) may be formed simultaneously with the processes described with respect to FIGS. 4-22 including the structure formed on substrate 101, and with use of the same support substrate 154. The cutting process of FIG. 22 may thus comprise singulating the plural LED modules 100 from one another. The cutting process of FIG. 22 may comprise cutting portions of partition structure 101P (formed from patterning growth substrate 101) and encapsulant 150 that, prior to the cutting, bound the plurality of LED modules 100 in a single monolithic structure (e.g. a wafer level structure having the spatial relationship shown in FIG. 22) resulting from the manufacturing process of FIGS. 4-22. It will be apparent that the number and arrangement of LED modules may vary depending on the size of the wafer substrate and size of the LED modules 100.

Figure 23:
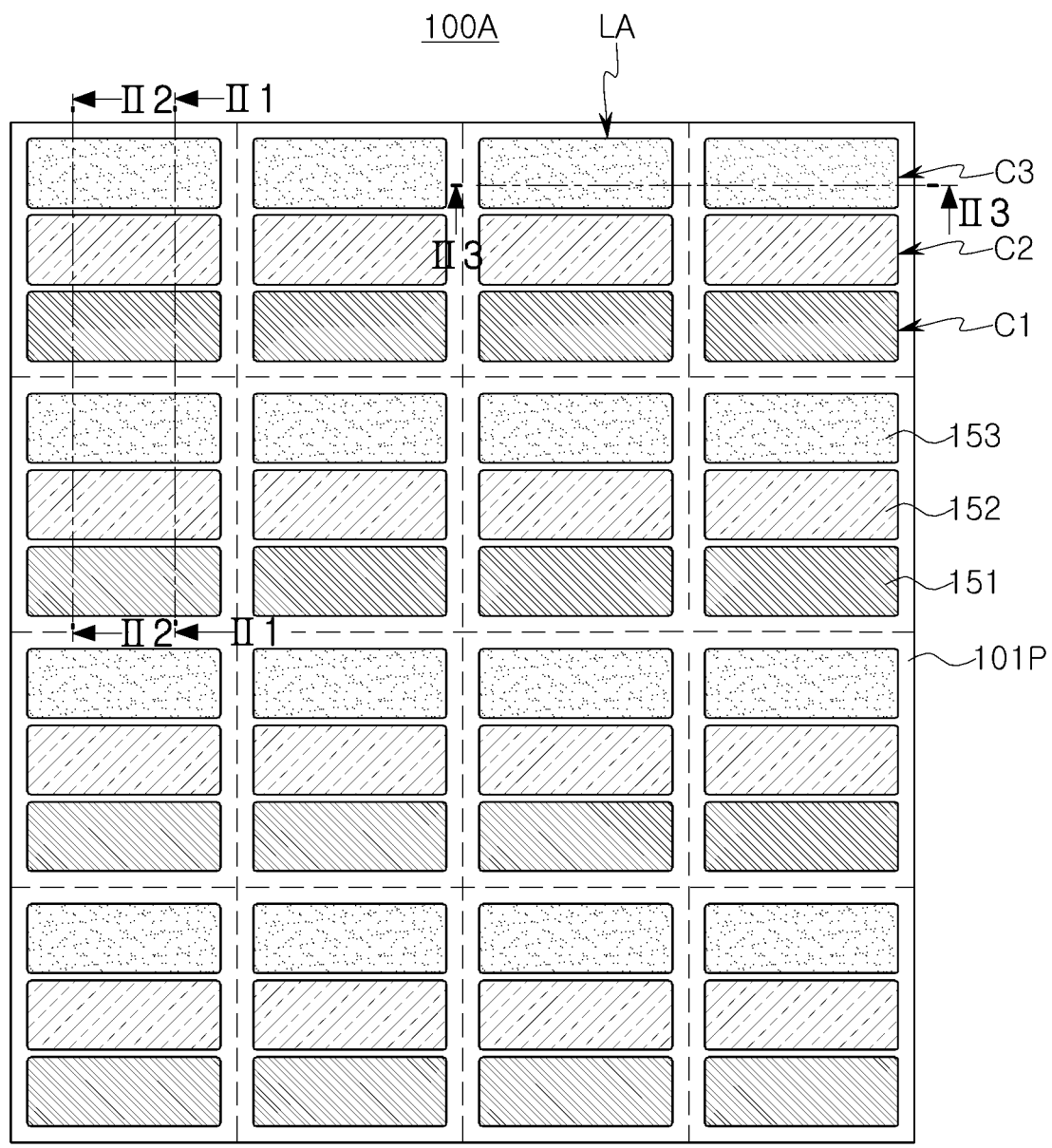
FIGS. 23 and 24 are a schematic top plan view and a schematic bottom plan view of an LED module according to an exemplary embodiment of the present disclosure.
Figure 24:
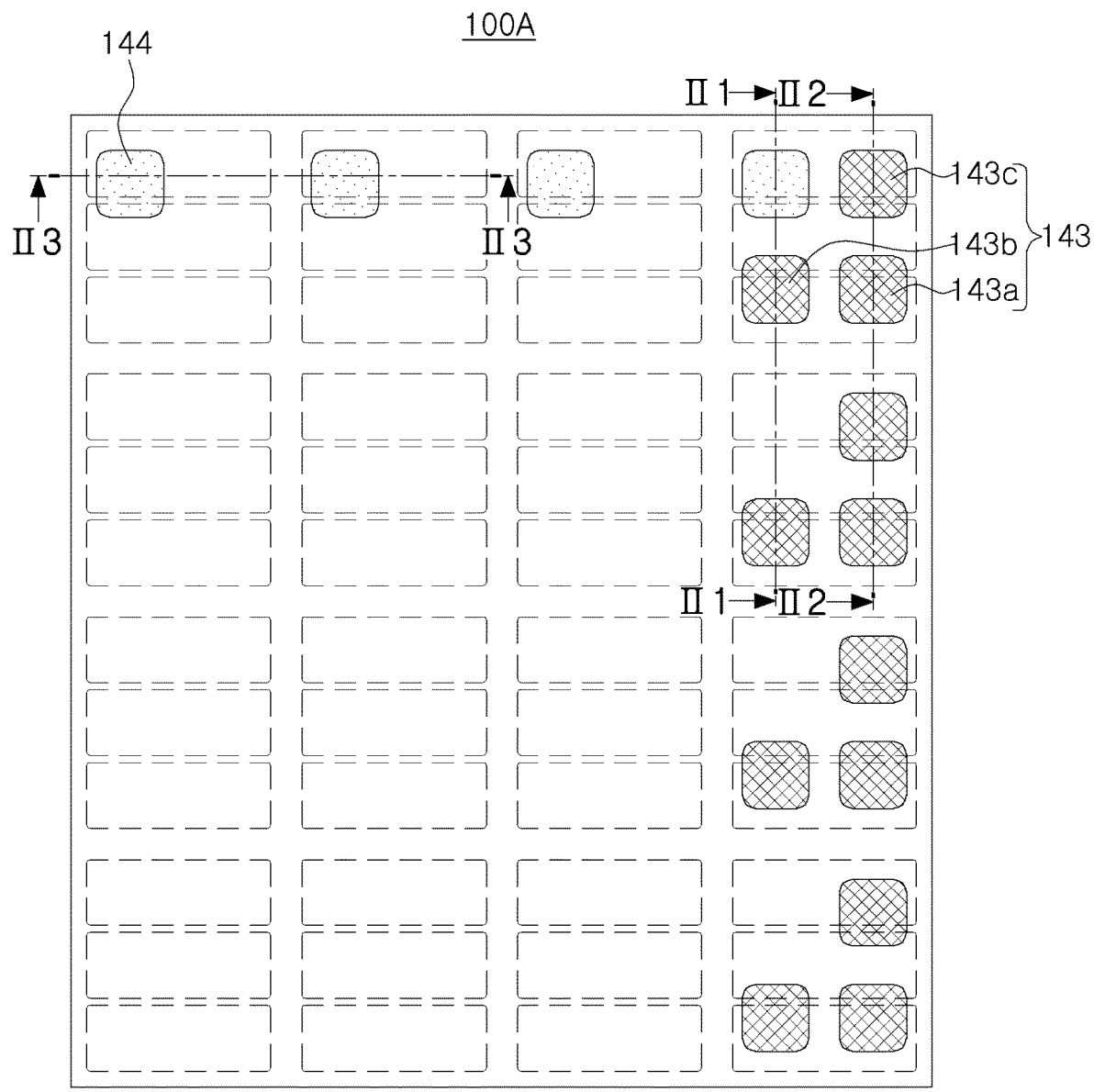

FIGS. 23 and 24 are a plan view and a schematic bottom view schematically illustrating an LED module 100A according to an exemplary embodiment in the present disclosure.

Figure 25A:
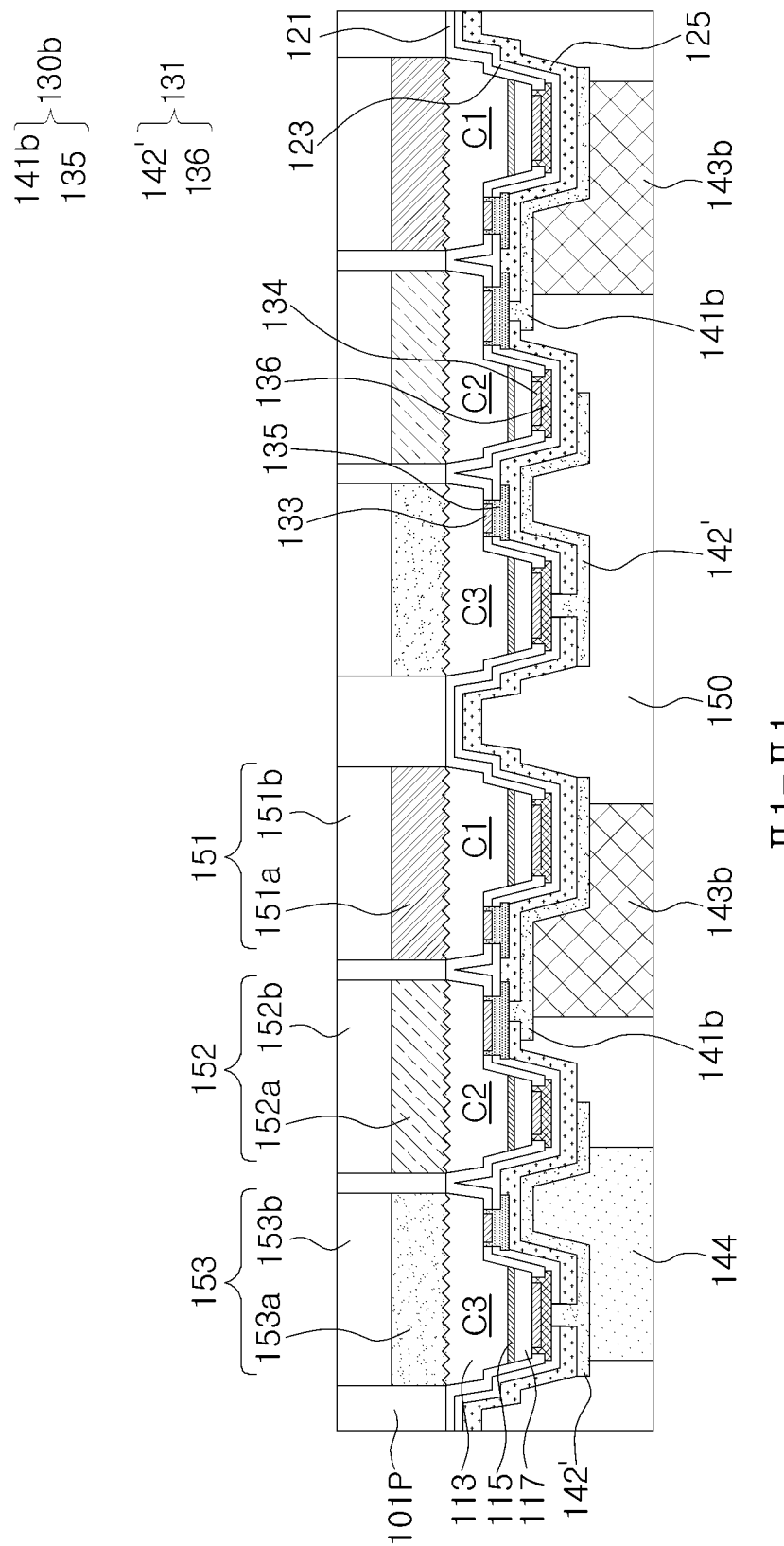
Figure 25C:
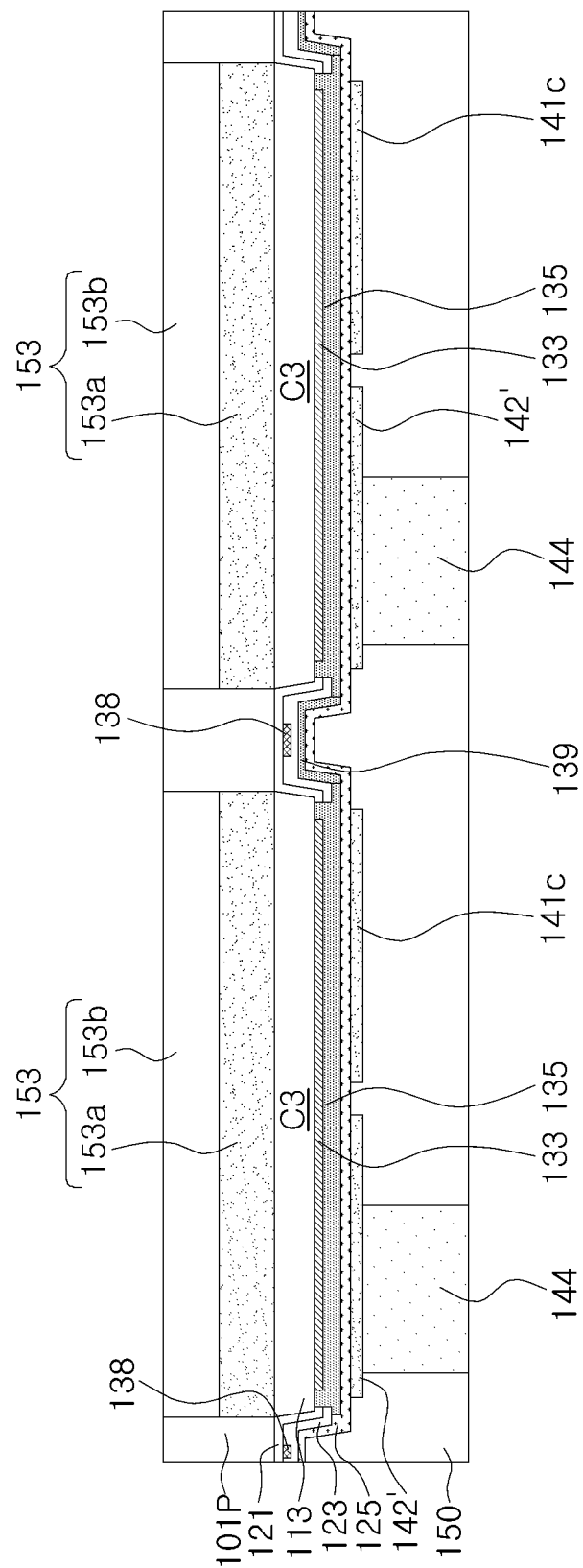

FIGS. 25A through 25C are cross-sectional views of a LED module 100A of FIGS. 23 and 24. FIG. 25 is a cross-sectional view taken along line II1-II1 of FIG. 24, FIG. 25B is a cross-sectional view taken along line II2-II2 of FIG. 24, and FIG. 25C is a cross-sectional view taken along line II3-II3 of FIG. 24.

Referring to FIGS. 23, 24, and 25A through 25C, the LED module 100A may include a light emitting unit including semiconductor light emitting elements LA of a 4×4 matrix. However, this is merely illustrative and the LED module 100 may include a light emitting unit including semiconductor light emitting elements LA arranged in a matrix form of m number of rows and n number of columns in a first direction (for example, in a traverse direction or row direction) and a second direction (for example, in a longitudinal direction or column direction) intersecting each other. Here, m and n are natural numbers equal to or greater than 2. Each of the semiconductor light emitting elements LA may include first to third light emitting cells C1, C2, and C3. The first to third light emitting cells C1, C2, and C3 may each include a first conductivity-type semiconductor layer 113, an active layer 115, and a second conductivity-type semiconductor layer 117. The active layer 115 may be disposed between the first conductivity-type semiconductor layer 113 and the second conductivity-type semiconductor layer 117, and may emit light having a specific wavelength.

The LED module 100A may include first to third light transmission portions 151, 152, and 153 disposed on the first surface of the light emitting unit, which correspond to the first to third light emitting cells C1, C2, and C3, respectively. In the present exemplary embodiment, the first to third light transmission portions 151, 152, and 153 may emit red light, green light, and blue light, respectively. Contents regarding the first to third light transmission portions 151, 152, and 153 are the same as described above with reference to FIGS. 1 through 3D, so a description thereof will be omitted.

The LED module 100A may include a partition structure 101P disposed among the first to third light emitting cells C1, C2, and C3 on the first surface of the light emitting unit. The partition structure 101P may have a lattice structure accommodating the first to third light transmission portions 151, 152, and 153, and a width of the partition structure 101P disposed about the first to third light transmission portions 151, 152, and 153 in each of the semiconductor light emitting elements LA may be smaller than a width of the partition structure 101P disposed on the boundary between the plurality of semiconductor light emitting elements LA.

The LED module 100A may include a wiring electrode disposed on the second surface of the light emitting unit and configured such that the first to third light emitting cells C1, C2, and C3 of the semiconductor light emitting elements LA arranged within the LED module 100A are independently driven.

The wiring electrode may include a first cell electrode 130a commonly connected to the first conductivity-type semiconductor layer 113 of the first light emitting cell C1 of each of the semiconductor light emitting elements LA arranged in the first direction, a second cell electrode 130b commonly connected to the first conductivity-type semiconductor layer 113 of the second light emitting cell C2 of each of the semiconductor light emitting elements LA arranged in the first direction, a third cell electrode 130c commonly connected to the first conductivity-type semiconductor layer 113 of the third light emitting cell C3 of each of the semiconductor light emitting elements LA arranged in the first direction, and a common cell electrode 131 commonly connected to the second conductivity-type semiconductor layer 117 of each of the first to third light emitting cells C1, C2, and C2 of each of the semiconductor light emitting elements LA arranged in the second direction.

Contents regarding the first to third cell electrodes 130a, 130b, and 130c are the same as described above with reference to FIGS. 1 through 3D, so a description thereof will be omitted.

The common cell electrodes 131 may include the second electrodes 136 of the first to third light emitting cells C1, C2, and C3 and a common base pad 142'. Common cell electrodes 131 of groups of the semiconductor light emitting elements LA arranged in the second direction may be commonly connected together to form a corresponding electrical node. In the present exemplary embodiment, the second electrodes 136 of the semiconductor light emitting elements LA arranged in the second direction may be connected to each other. The second electrodes 136 of the semiconductor light emitting elements LA arranged in the second direction may be connected to each other by a second electrode connection part (wiring) 138. This may be clearly understood with reference to FIGS. 25C and 26 together showing second electrode connection part 138 extending in the second (column) direction under a portion of partition structure 101P separating neighboring light emitting elements LA.

The LED module 100A may further include a first cell pad 143a connected to the first cell electrode 130a, a second cell pad 143b connected to the second cell electrode 130b, a third cell pad 143c connected to the third cell electrode 130c, and a common cell pad 144 connected to the common cell electrode 131. The first cell pad 143a may be in contact with the first base pad 141a, the second cell pad 143b may be in contact with the second base pad 141b, and the third cell pad 143c may be in contact with the third base pad 141c. The common cell pad 144 may be in contact with the common base pad 142'.

In the present exemplary embodiment, the common cell pad 144 is disposed in each column of the semiconductor light emitting elements LA arranged in the second direction, and thus, a total of four common cell pads 144 are provided. The four common cell pads 144 may be disposed below mutually different semiconductor light emitting elements LA in the first direction along one edge of the LED module 100A. The first to third cell pads 143a, 143b, and 143c may be disposed in each row of the semiconductor light emitting elements LA arranged in the first direction, and may be disposed together below one semiconductor light emitting element LA in each row. The first to third cell pads 143a, 143b, and 143c may be disposed below the semiconductor light emitting element LA along an edge of the LED module 100A. As will be appreciated, the structure, manufacture, operation and use in a larger system (e.g., a display) of LED module 100A may be the same as that of LED module 100 (including its alternatives) with the exception of the use of second electrode connection part (wiring) 138 to connect common cell electrodes 131 arranged of light emitting cells C arranged in the second (column) direction and the arrangement and/or sizes of cell pads 143a, 143b, 143c and 144 and bonding pads 144, 145a, 145b and 145c.

Alternatively, the LED module 100A may have the cell pads and the bonding pads disposed as illustrated in FIG. 2.

The LED module 100A includes first and second insulating layers 121 and 123 surrounding each of the first to third light emitting cells C1, C2, and C3. The first and second insulating layers 121 and 123 may separate the first to third light emitting cells C1, C2, and C3 from each other in the first and second directions. As illustrated in FIGS. 25A through 25D, the first insulating layer 121 may be in contact with the partition structure 101P among the first to third light emitting cells C1, C2, and C3. A second electrode connection part 138 may be disposed below the first insulating layer 121 among the first to third light emitting cells C1, C2, and C3. The second insulating layer 123 covering the second electrode connection part 138 may be formed on the first insulating layer 121. The second electrode 136 may be connected to the second conductivity-type semiconductor layer 117 through a portion from which portions of the first insulating layers 121 have been removed. The first electrode 135 may be connected to the first conductivity-type semiconductor layer 113 through a portion from which portions of the first and second insulating layers 121 and 123 have been removed. A third insulating layer 125 may be disposed between the first and second electrodes 135 and 136 and the base pads 141a, 141b, 141c, and 142'. Through a portion from which a portion of the third insulating layer 125 has been removed, the first electrode 135 and the first to third base pads 141*a*, 141*b*, and 141*c* may be connected and the second electrode 136 and the common base pad 142' may be connected.

The LED module 100A may include an encapsulant 150 encapsulating a space between the semiconductor light emitting elements LA to support the light emitting unit and partially exposing the first to third cell pads 143*a*, 143*b*, and 143*c* and the common cell pad 144. The first to third cell pads 143*a*, 143*b*, and 143*c*, and the common cell pad 144 may be connected to the semiconductor light emitting elements LA through the encapsulant 150.

The present exemplary embodiment relates to the LED module 100A including the plurality of light emitting cells C1, C2, and C3 operated in a passive matrix manner (e.g., as described herein with respect to LED module 100). According to the present exemplary embodiment, the number of electrode pads required for independently driving the plurality of light emitting cells C1, C2, and C3 within the LED module 100A may be reduced. In addition, since the electrode pads are positioned at the edge of the LED module 100A, common connections between multiple LED modules 100A on a circuit board (e.g., form a display panel) may be improved.

Also, using the LED module 100A according to the present exemplary embodiment in which semiconductor light emitting elements realizing full colors are arranged in a matrix form, for example, a process of manufacturing the LED display panel 1000 illustrated in FIG. 50 may be simplified, whereby a manufacturing time may be shortened and manufacturing costs may be reduced.

FIGS. 26 through 35 are views illustrating a method for manufacturing the LED module 100A according to an exemplary embodiment in the present disclosure. In FIGS. 26 through 35, evenly numbered drawings are plan views, and oddly numbered drawings are cross-sectional views taken along line II1-II1 of the corresponding plan views. A method for manufacturing an LED module according to the present exemplary embodiment is performed by a wafer level package process, and light emitting elements of a 4×4 matrix formed in a partial region of a wafer are illustrated for the purposes of description.

After the processes described above with reference to FIGS. 4 through 7 are completed, the following processes may be performed.

Figure 26:
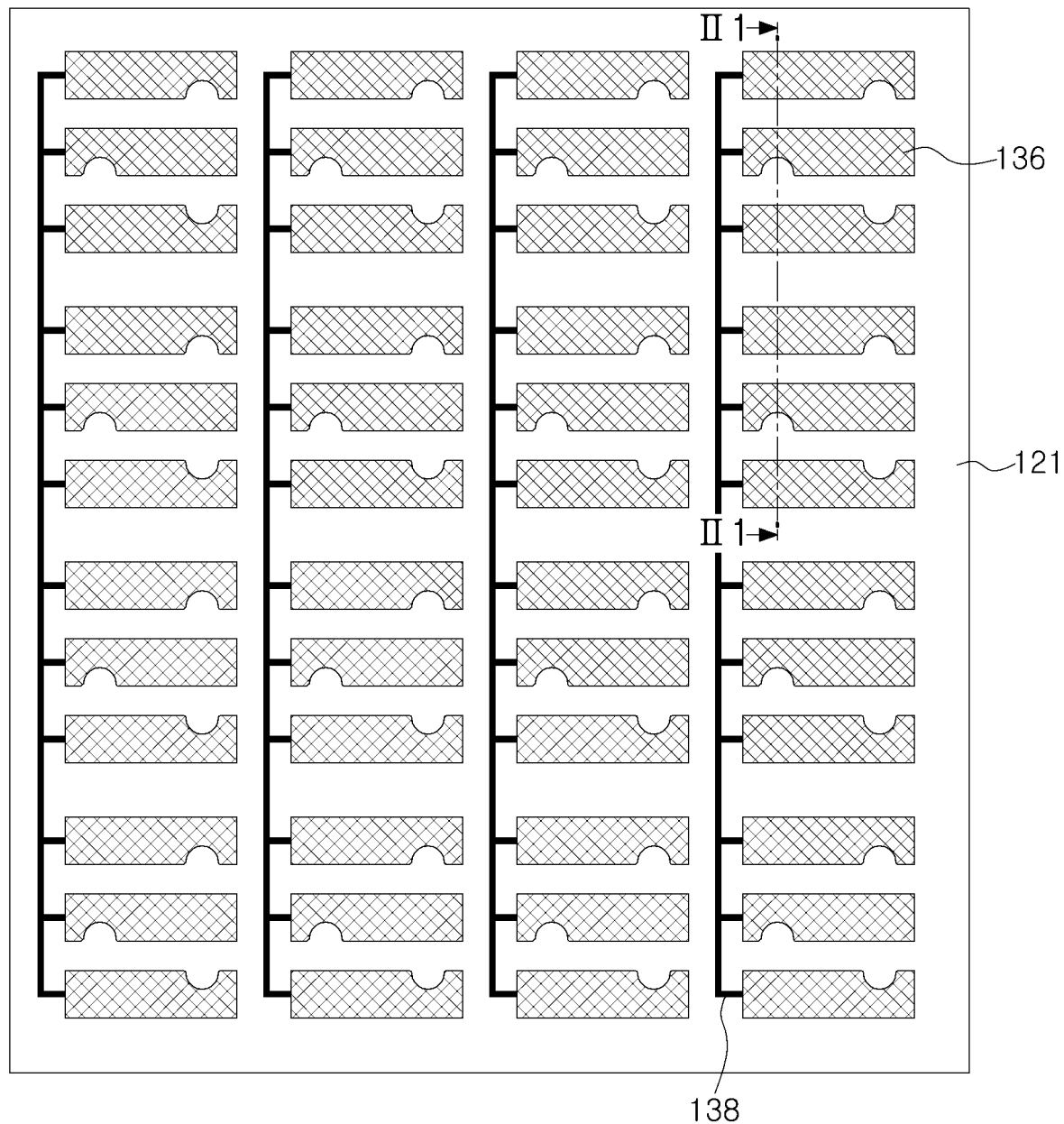
FIGS. 26 through 35 are views illustrating a method for manufacturing an LED module according to an exemplary embodiment of the present disclosure.
Figure 27:
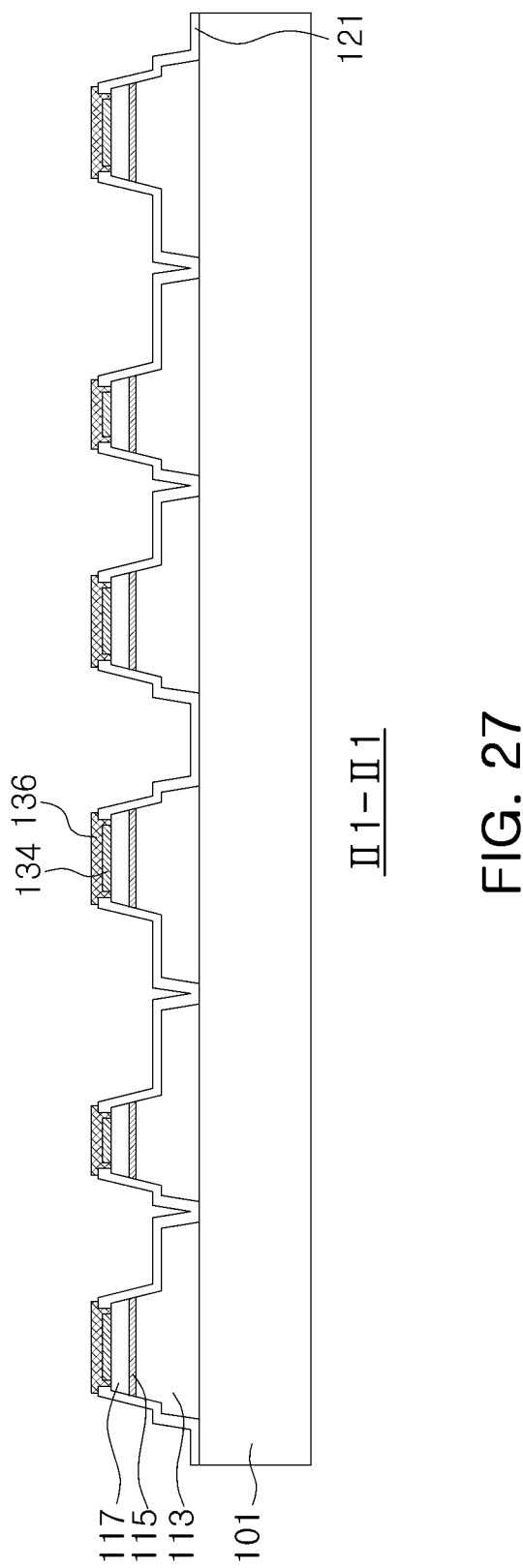

Referring to FIGS. 26 and 27, a first insulating layer 121 covering the light emitting cells C1, C2, and C3 may be formed, and a second contact electrode 134 and a second electrode 136 connected to the second conductivity-type semiconductor layer 117 through the first insulating layer 121 are formed. Also, a plurality of second electrode connection parts 138 each connecting a group of the second electrodes 136 that are arranged in the second (column) direction to each other are formed.

The first insulating layer 121 may be formed on the substrate 101 to cover the light emitting cells C1, C2, and C3. The first insulating layer 121 may be formed within an isolation region I and a sub-isolation region Ia to electrically isolate the light emitting cells C1, C2, and C3.

A portion of the first insulating layer 121 formed on the second conductivity-type semiconductor layer 117 may be removed, and a second contact electrode 134 may be formed to be electrically connected to the second conductivity-type semiconductor layer 117.

Thereafter, a second electrode 136 covering the second contact electrode 134 may be formed. The second electrodes 136 formed in the light emitting cells C1, C2, and C3 disposed in the column direction (longitudinal direction) in each of the module regions of the substrate 101 may be connected to each other by a corresponding second electrode connection part 138 disposed to one side of the light emitting cells C1, C2, and C3.

The second electrodes 136 and the second electrode connection parts 138 may be simultaneously formed with the same process. For example, the second electrodes 136 and second electrode connection parts 138 may be formed by patterning the same conductive (e.g., metal) layer.

Figure 28:
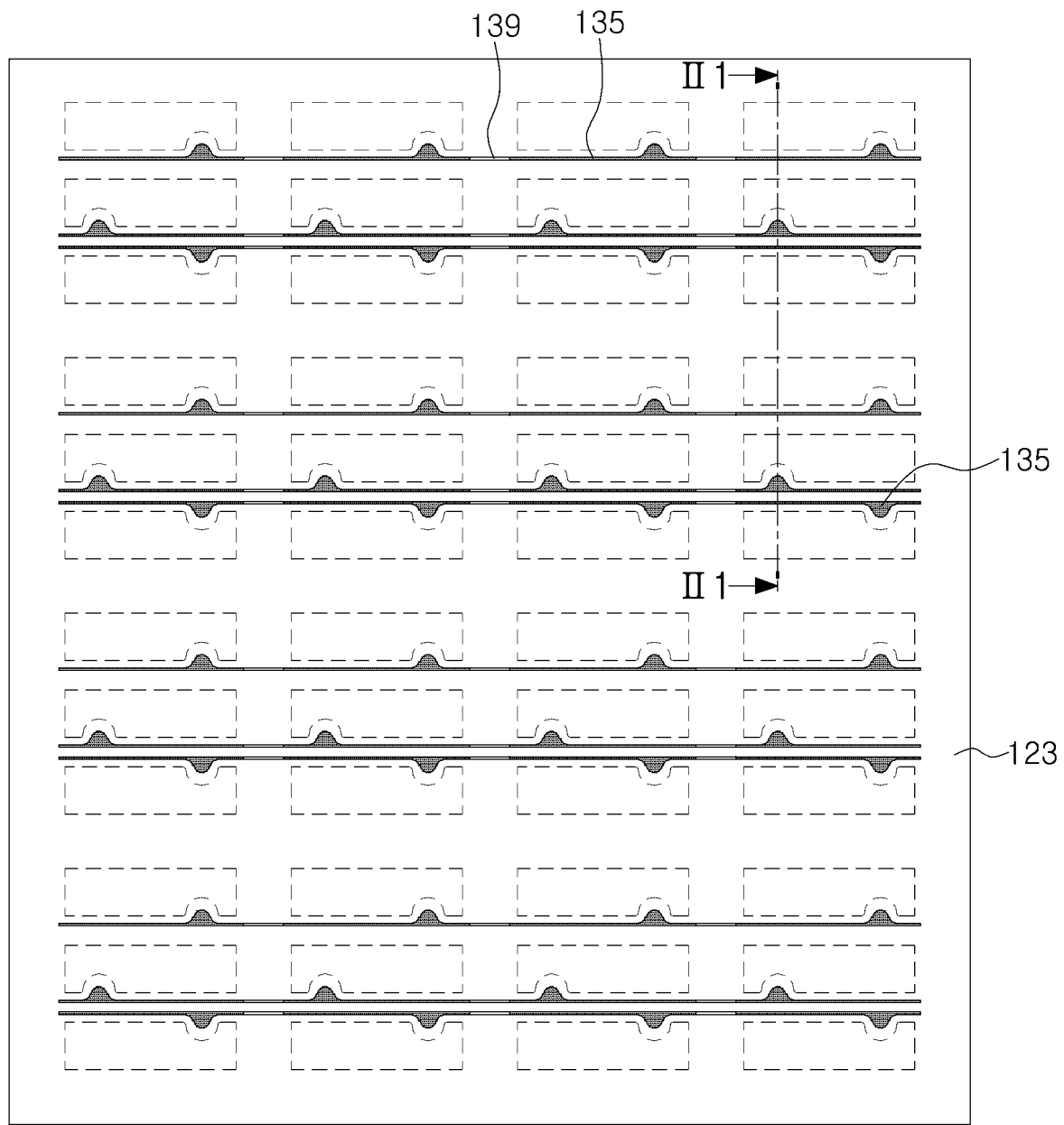
Figure 29:
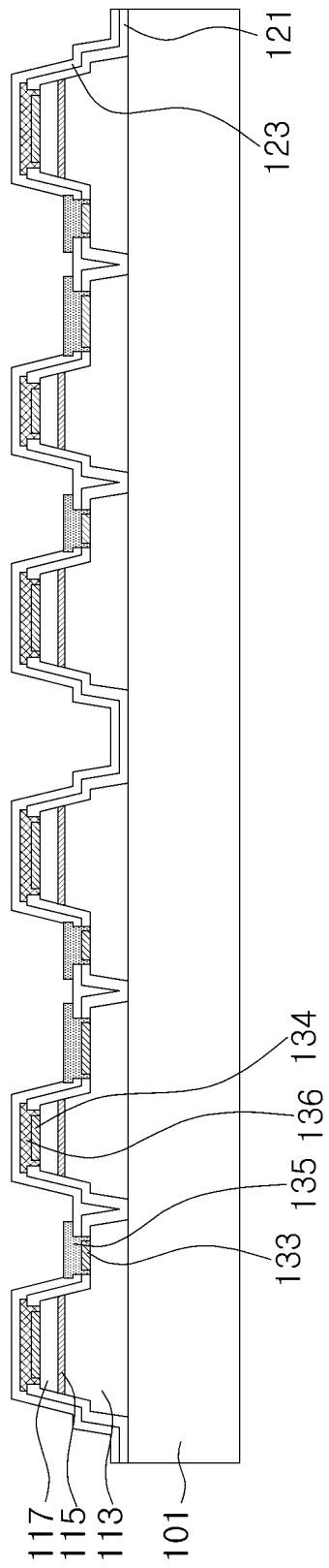

Referring to FIGS. 28 and 29, the second insulating layer 123 covering the second electrodes 136 and the second electrode connection parts 138, and a first contact electrode 133 and a first electrode 135 connected to the first conductivity-type semiconductor layer through the second insulating layer 121 may be formed. Also, a first electrode connection part 139 connecting the first electrodes 135 to each other may be formed.

The second insulating layer 123 may be formed on the first insulating layer 121 to cover the second electrode 136 and the second electrode connection part 138. The second insulating layer 123 may be formed of a material having electrically insulating properties and low light absorption. The second insulating layer 123 may be formed of a material the same as or similar to that of the first insulating layer 121.

Portions of the first and second insulating layers 121 and 122 formed on the first conductivity-type semiconductor layer 113 may be removed, and the first contact electrode 133 may be formed to be electrically connected to the first conductivity-type semiconductor layer 113.

Thereafter, the first electrodes 135 covering the first contact electrodes 133 may be formed. The first electrodes 135 formed in the light emitting cells C1, C2, and C3 disposed in the row direction (traverse direction) within each of the module regions may be connected to each other by the first electrode connection part 139 disposed between the light emitting cells C1, C2, and C3. The first electrodes 135 and the first electrode connection part 139 may be simultaneously formed through a single process.

Figure 30:
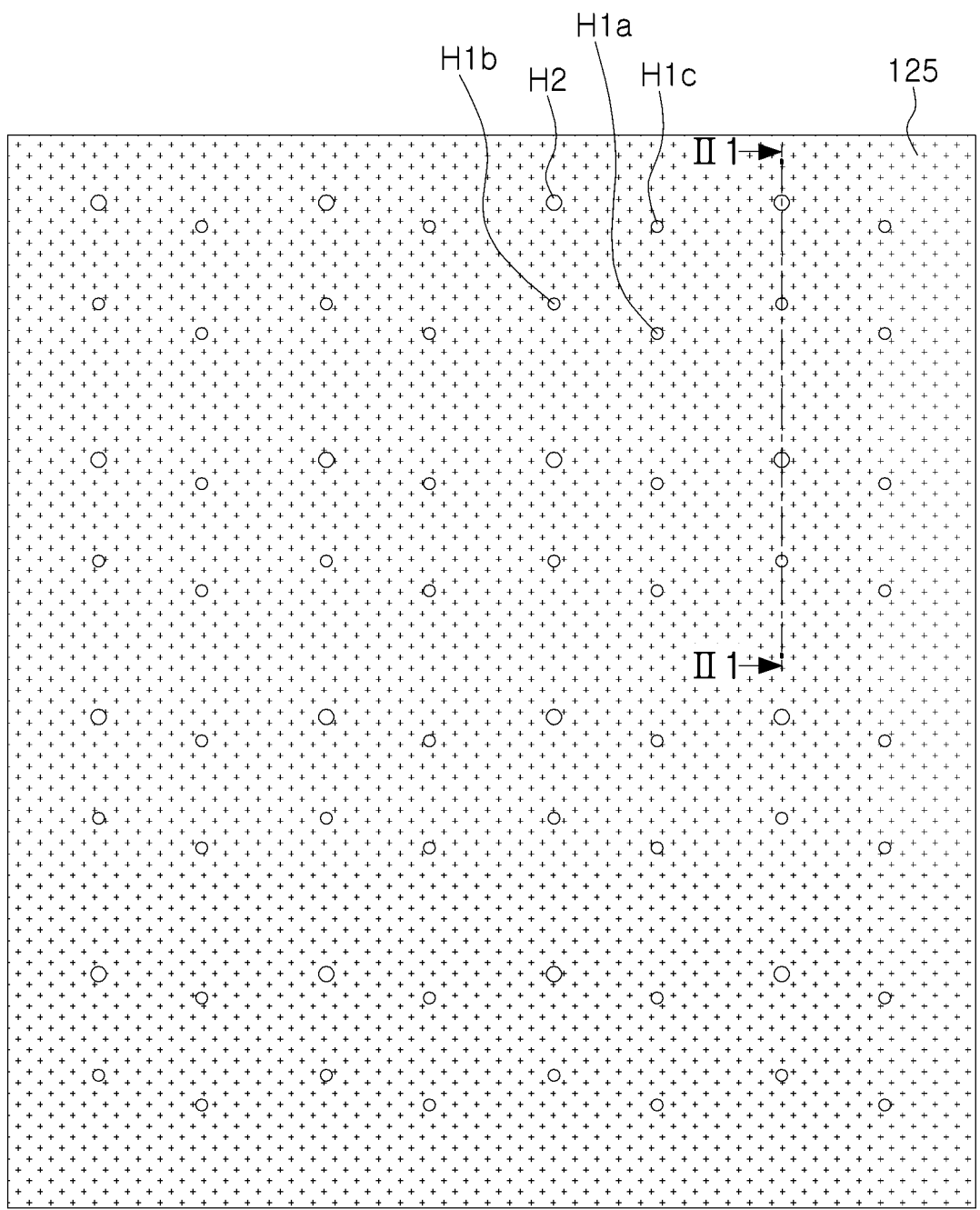
Figure 31:
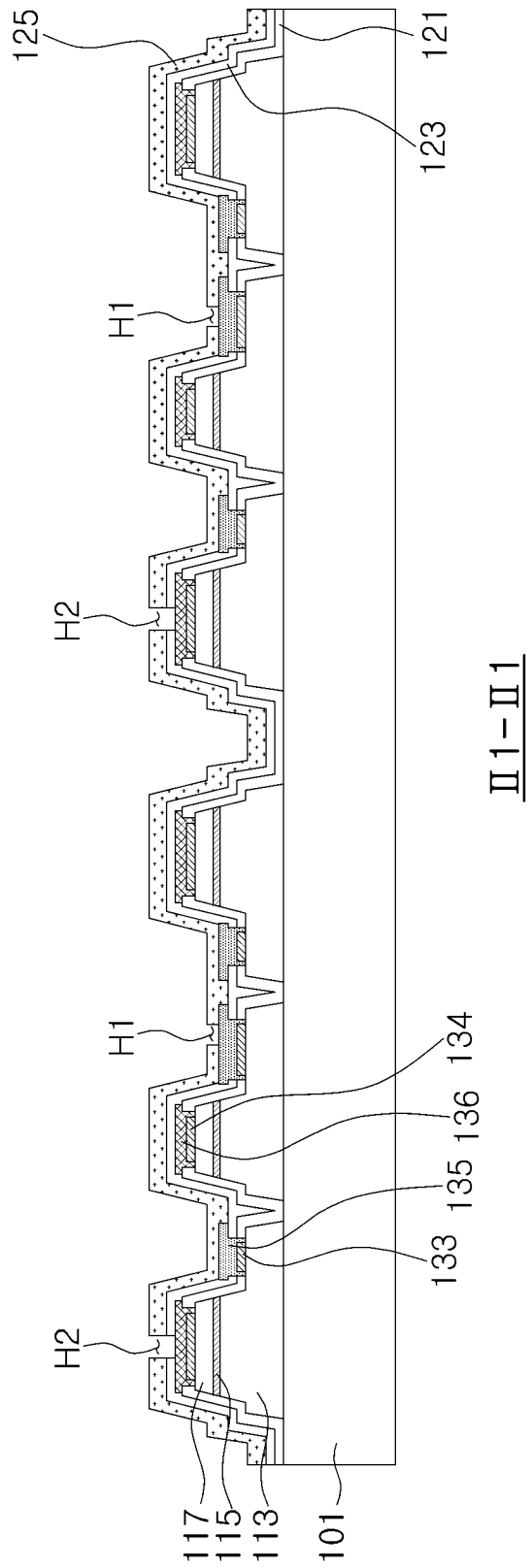

Referring to FIGS. 30 and 31, a third insulating layer 125, first contact holes H1*a*, H1*b*, and H1*c* penetrating through the third insulating layer 125, and a second contact hole H2 may be formed.

The second insulating layer 123, and the third insulating layer 125 covering the first electrode 135 may be formed. The third insulating layer 125 may be formed of a material having electrically insulating properties and low light absorption. The third insulating layer 125 may be formed of a material the same as or similar to that of the first insulating layer 121.

A portion of the third insulating layer 125 may be removed to form the first contact holes H1*a*, H1*b*, and H1*c* exposing the first electrode 135 in each of the light emitting cells C1, C2, and C3. Also, portions of the second insulating layer 123 and the third insulating layer 125 may be removed to form a second contact hole H2 exposing the second electrode 136 in a partial light emitting cell (for example, C3).

Figure 32:
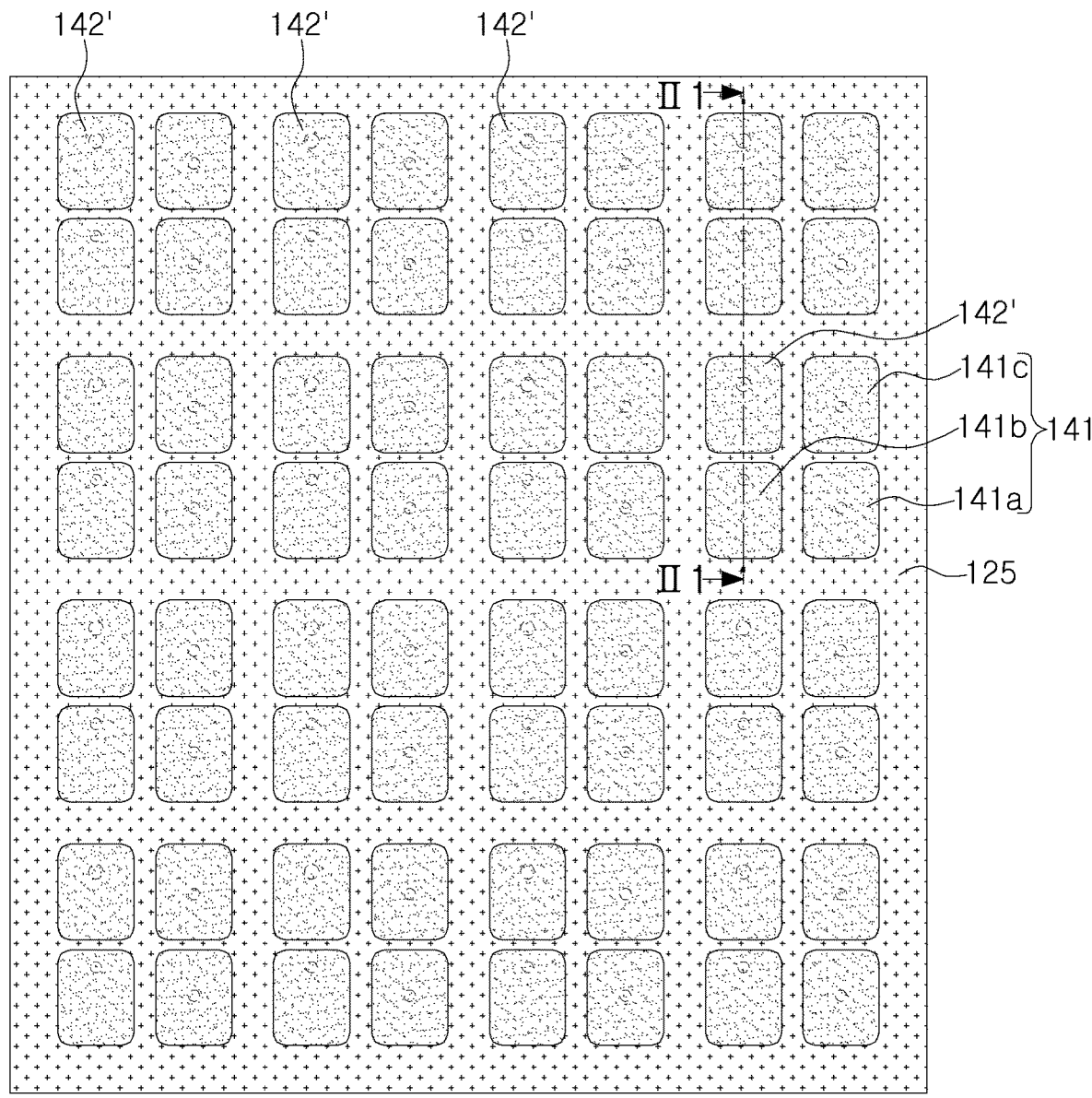
Figure 33:
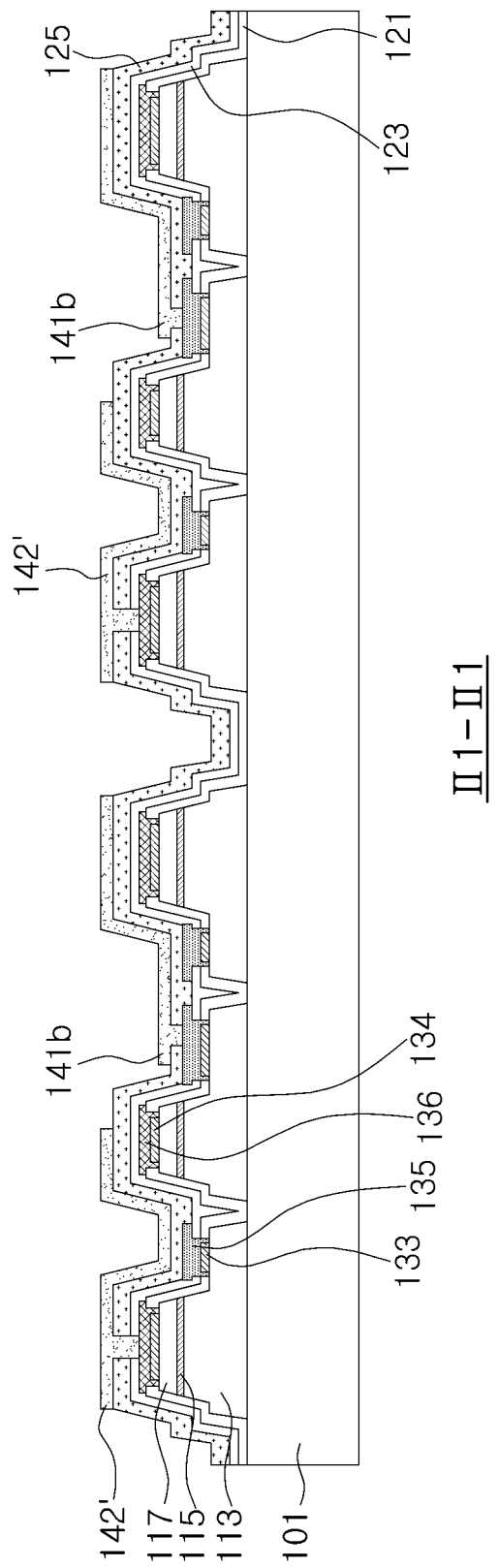

Referring to FIGS. 32 and 33, first to third base pads 141*a*, 141*b*, and 141*c* connected to the first electrodes 135 through the first contact holes H1*a*, H1*b*, and H1*c* and a common base pad 142 connected to the second electrodes 136 through the second contact hole H2 may be formed.

The first to third base pads 141*a*, 141*b*, and 141*c* may be formed to correspond to the first to third light emitting cells C1, C2, and C3. That is, the first base pad 141*a* connected to the first electrode 135 of the first light emitting cell C1, the second base pad 141b connected to the first electrode 135 of the second light emitting cell C2, and the third base pad 141c connected to the first electrode 135 of the third light emitting cell C3 may be formed.

The common base pad 142 may be commonly connected to the second electrodes 136 of the first to third light emitting cells C1, C2, and C3 within each of the light emitting elements. Since the second electrodes 136 of all the light emitting cells C1, C2, and C3 disposed in a column direction (longitudinal direction) within the module region are connected to each other by the second electrode connection part 138, the common base pads 142' may be electrically connected to each other. Since the first electrodes 135 of all the first light emitting cells C1 disposed in a row direction (traverse direction) within the module region of the substrate 101 are connected to each other by the first electrode connection part 139, the first base pads 141a may be electrically connected to each other. Since the first electrodes 135 of all the second light emitting cells C2 disposed in a row direction (traverse direction) within the module region are connected to each other by the first electrode connection part 139, the second base pads 141b may be electrically connected to each other. Since the first electrodes 135 of all the third light emitting cells C3 disposed in a row direction (traverse direction) within the module region are connected to each other by the first electrode connection part 139, the third base pads 141c may be electrically connected to each other.

The first to third base pads 141a, 141b, and 141c and the common base pad 142' may be formed through a plating process.

Figure 34:
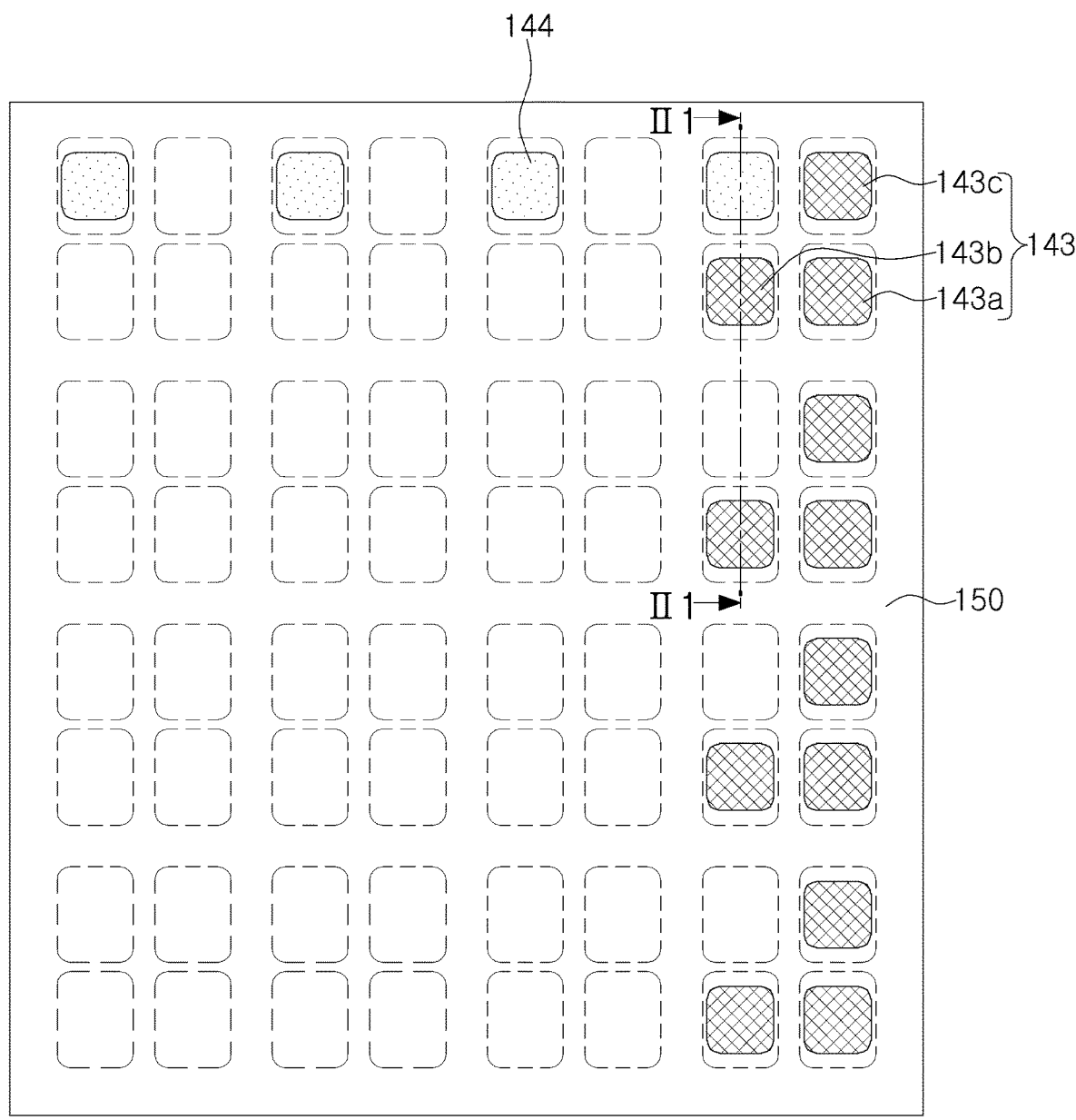
Figure 35:
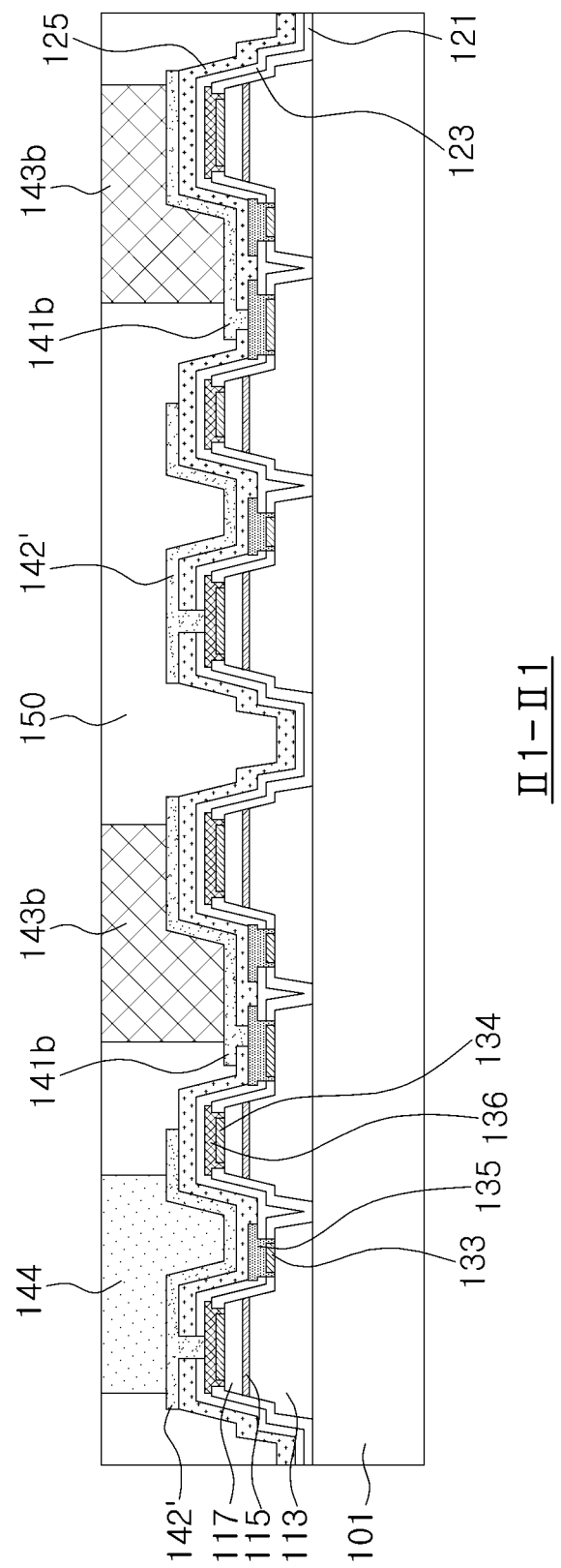

Referring to FIGS. 34 and 35, first to third cell pads 143a, 143b, and 143c respectively connected to the first to third base pads 141a, 141b, and 141c and a common cell pad 144 connected to the common base pad 142' may be formed and surrounded by the encapsulant 150.

The first cell pads 143a commonly connected to the first light emitting cells C1 of the light emitting elements arranged in each row, the second cell pads 143b commonly connected to the second light emitting cells C2 arranged in each row, and the third cell pads 143c commonly connected to the third light emitting cells C3 arranged in each row may be formed. The first to third cell pads 143a, 143b, and 143c may be disposed in each row, and may be disposed together in the light emitting element positioned at the end of each row. That is, all of the first to third cell pads 143a, 143b, and 143c of the LED module 100A may be disposed on the light emitting elements LA that are arranged in a single column (in this example, the fourth column) positioned at an edge of the module region (corresponding to the edge of the module 100A after it is singulated from other modules 100A).

The common cell pads 144 commonly connected to the first to third light emitting cells C1, C2, and C3 disposed along each column are disposed singly in each column, and may be disposed in mutually different light emitting elements positioned in a single row (for example, a first row) positioned at an edge of the module region.

The cell pads 143a, 143b, 143c, and 144 may be formed through a plating process.

Thereafter, an encapsulant 150 filling a space between the light emitting elements and surrounding the cell pads 143a, 143b, 143c, and 144 may be formed.

Figure 36:
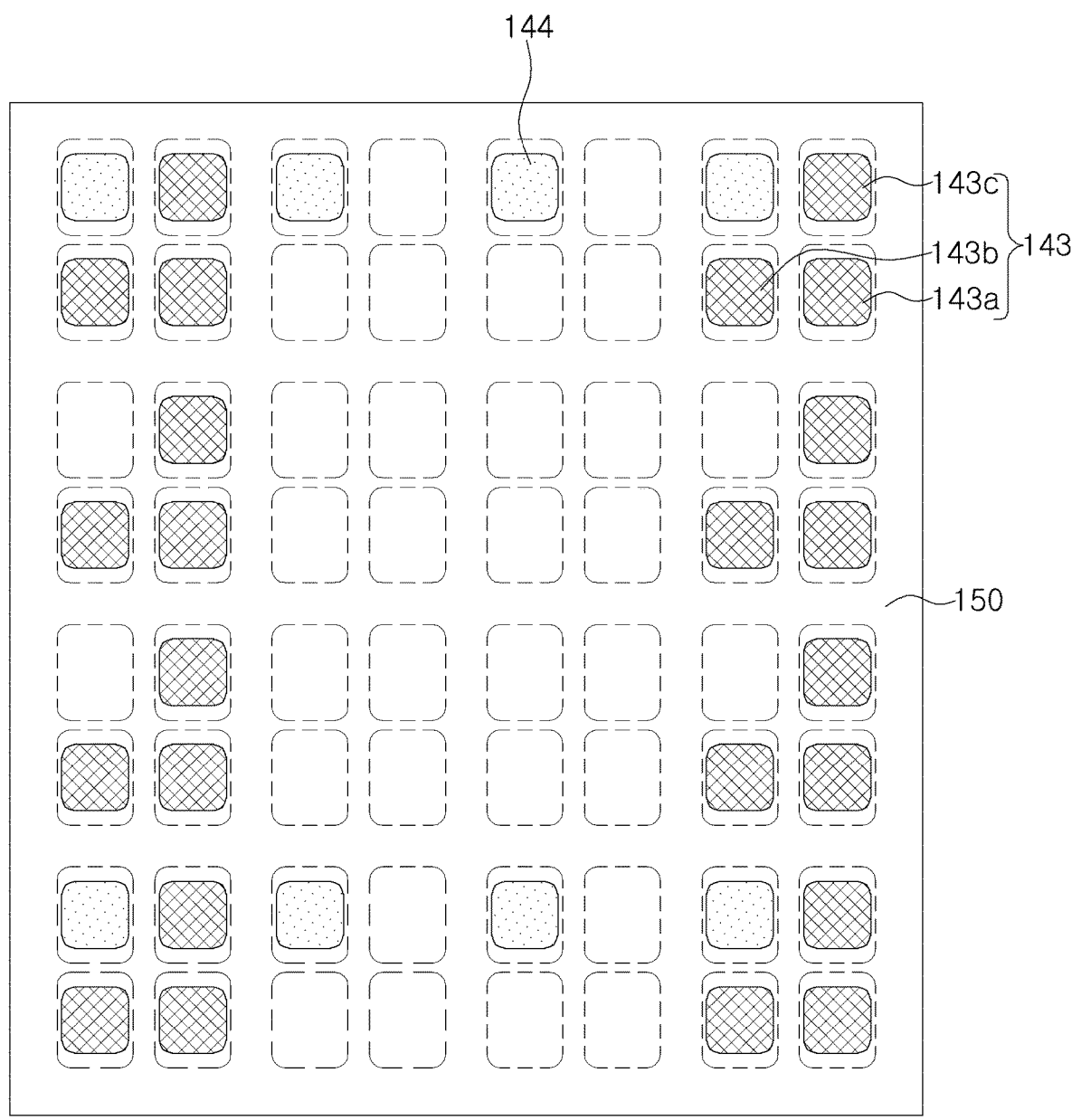
FIG. 36 is a view illustrating an LED module according to an exemplary embodiment of the present disclosure.

A disposition of the cell pads 143a, 143b, 143c, and 144 may be modified to ensure proper conductivity and bonding stability. For example, referring to FIG. 36, the first to third cell pads 143a, 143b, and 143c may be disposed in the light emitting elements along a first column and a last column in the module region. The common cell pad 144 commonly connected to the first to third light emitting cells C1, C2, and C3 may be disposed such that two common cell pads 144 re disposed in each column, and may be disposed in different light emitting elements positioned in the first row and in the last row in the module region.

Thereafter, the LED module 100A may be manufactured by performing the processes described above with reference to FIGS. 18 through 22. It will be appreciated that the manufacture of LED module 100A may be the same as described herein with respect to LED module 100 (including its alternatives), with the exception of the formation of second electrode connection part (wiring) 138 to connect common cell electrodes 131 and the arrangement and/or sizes of cell pads 143a, 143b, 143c and 144 and bonding pads 144, 145a, 145b and 145c.

In an exemplary embodiment, after the processes of FIGS. 32 and 33 are completed, the processes of FIGS. 14 through 22 are performed, thus manufacturing the LED module having the cell pads and the bonding pads disposed as illustrated in FIG. 3.

Figure 37:
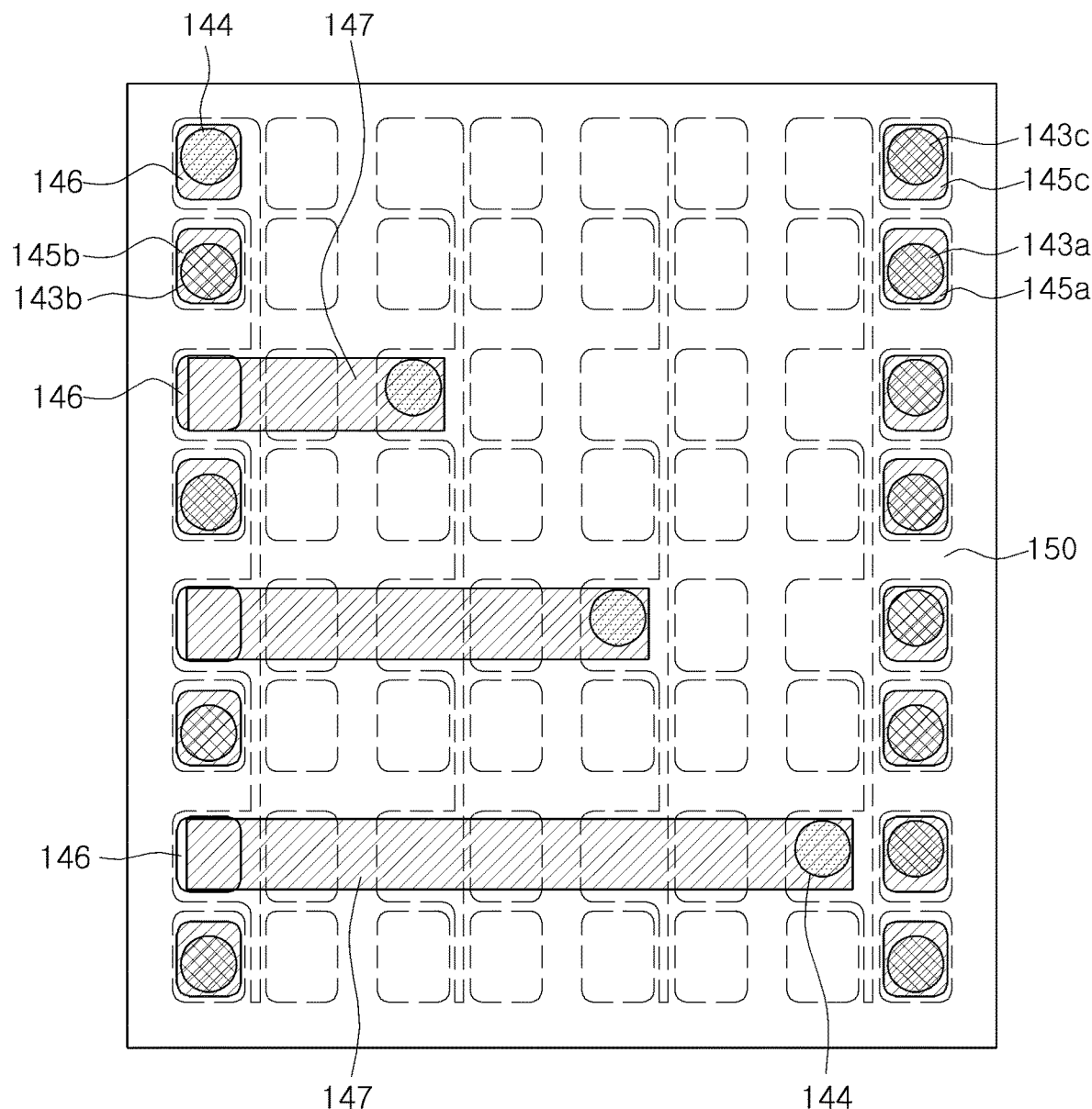
FIG. 37 is a schematic view illustrating an LED module according to an exemplary embodiment of the present disclosure.

FIG. 37 is a view schematically illustrating an LED module according to an exemplary embodiment in the present disclosure. The LED module 100B illustrated in FIG. 37 is obtained by modifying a portion of the LED module 100 illustrated in FIGS. 1 through 22.

In the LED module 100B according to the exemplary embodiment of FIG. 37, dispositions of the first to third cell pads 143a, 143b, and 143c, and the common cell pad 144 are different and dispositions of the first to third bonding pads 145a, 145b, and 145c, and the common bonding pad 146 are different, compared with the LED module 100 described above with reference to FIGS. 1 through 22. Other features of the embodiment of FIG. 37 (including its structure, manufacture, operation and assembly as part of a larger system, such as a display) may be the same as described with respect to LED module 100.

Referring to FIG. 37, the LED module 100B includes common bonding pads 146 connected to the common cell pads 144, respectively, and disposed in a light emitting element positioned at one end of each row, and the common bonding pads 146 may be connected to the common cell pads 144 through a pad extending part 147.

The first to third cell pads 143a, 143b, and 143c may be disposed in each row of the light emitting elements arranged in the first direction, and may be disposed below two light emitting elements positioned at both ends of each row. First to third bonding pads 145a, 145b, and 145c connected to the first to third cell pads 143a, 143b, and 143c, respectively, may be included. As will be appreciated, all of the common bonding pads 146 and bonding pads 145a, 145b and 145c of the LED module 100B include a portion at an edge of the LED module (e.g., located under an outermost light emitting cell C, and in this example under an outermost base pad 141, 142) of the LED module 100).

Figure 38:
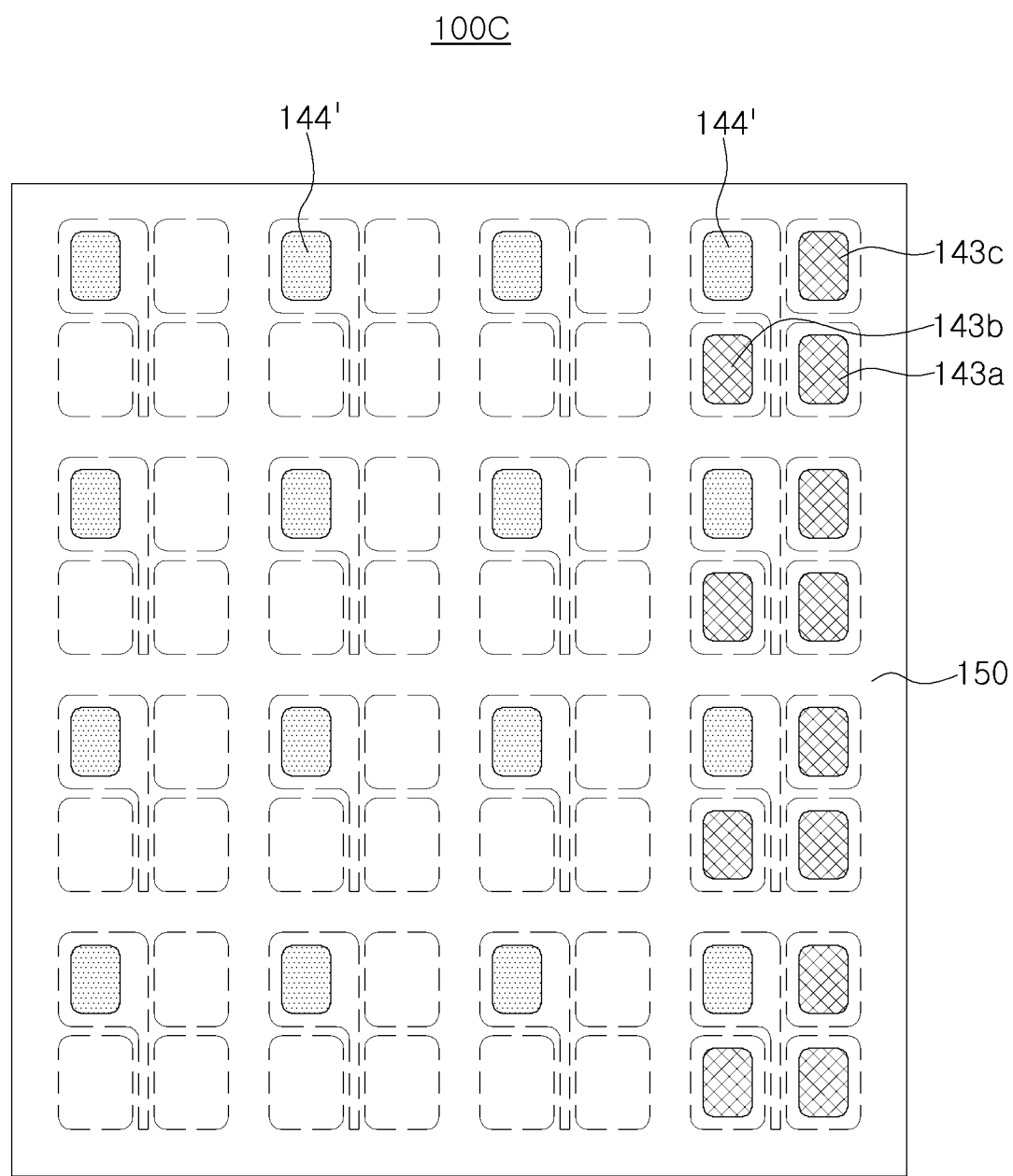
FIG. 38 is a schematic view illustrating an LED module according to an exemplary embodiment in the present disclosure.

FIG. 38 is a schematic view illustrating an LED module according to an exemplary embodiment in the present disclosure.

The LED module 100C illustrated in FIG. 38 is a modified example having a structure in which the common base pads 142 are not connected to each other in the second direction (longitudinal direction or column direction), unlike the LED module 100 described above with reference to FIGS. 1 through 22. Thus, in the LED module 100C, common cell pads 144' are disposed differently, compared with the LED module 100.

In the present exemplary embodiment, the first to third cell pads 143*a*, 143*b*, and 143*c* may be disposed below one light emitting element positioned at an end of each row. The LED module 100C may include fourth cell pads 144' connected to a corresponding one of the common base pads 142 of light emitting elements. That is, the fourth cell pad 144' may be provided with each of the light emitting elements. This alternative structure may be applied to all of the embodiments described herein (although it will be appreciated that when applied to the LED module 100B, some of the bonding pads 146 will not be located at the edge of LED module 100B). Also, in the present exemplary embodiment, separately formed bonding pads may not be provided (where cell pads 143*a*, 143*b*, 143*c* and 144' may form external terminals of the LED module 100C and comprise the chip pads of LED module 100C to provide a bonding location for connection of the LED module to a circuit board of a larger system (e.g., display)).

In the present exemplary embodiment, the plurality of light emitting cells within the LED module 100C may be operated in a passive matrix manner as described elsewhere herein. The LED module 100C may be manufactured in the same manner as describe elsewhere herein with the exception of the formation (e.g., patterning) of the fourth cell pads 144' and (if desired) omitting the formation of bonding pads 145*a*, 145*b*, 145*c* and 146.

Figure 39:
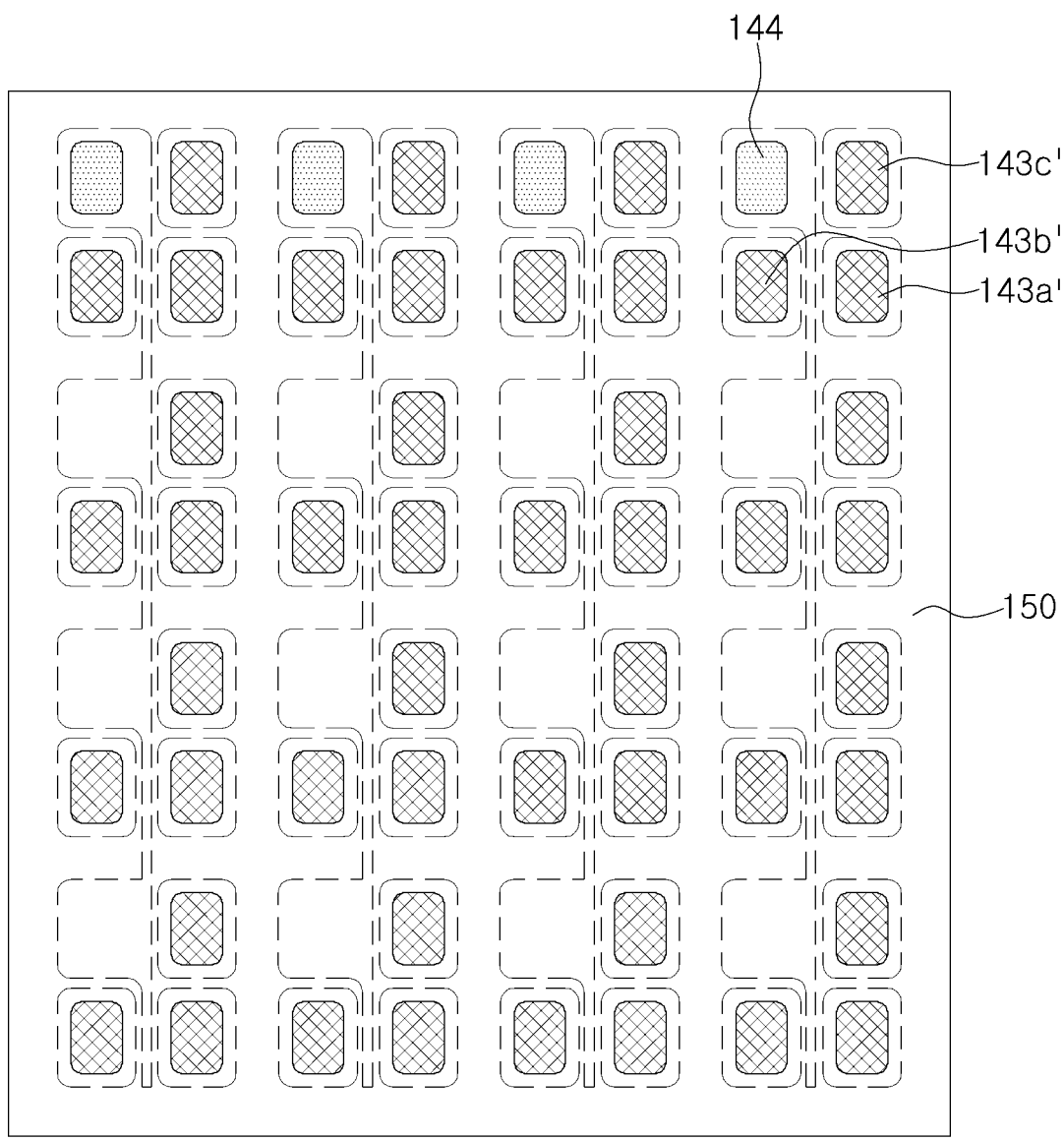
FIG. 39 is a schematic view illustrating an LED module according to an exemplary embodiment in the present disclosure.

FIG. 39 is a schematic view illustrating an LED module according to an exemplary embodiment in the present disclosure.

The LED module 100D illustrated in FIG. 39 is a modified example having a structure in which the first electrodes 135 are not connected to each other between the light emitting elements arranged in the first direction (for example, a row direction), unlike the LED module 100 described above with reference to FIGS. 1 through 22. Thus, in the LED module 100D, first to third cell pads 143*a'*, 143*b'*, and 143*c'* are disposed differently, compared with the LED module 100.

In the present exemplary embodiment, the common cell pads 144 are disposed such that one common cell pad 144 is disposed in each column of the light emitting elements arranged in the second direction (for example, the column direction) in the LED module 100D, and may be disposed below mutually different light emitting elements along one edge (for example, first row) of the LED module 100D. The first to third cell pads 143*a'*, 143*b'*, and 143*c'* may be disposed in the first to third base pads 141*a*, 141*b*, and 141*c* of each of the light emitting elements, respectively. That is, the first cell pads 143*a'* may be connected to the first base pads 141*a* of the light emitting elements, respectively, the second cell pads 143*b'* may be connected to the second base pads 142*a* of the light emitting elements, respectively, and the third cell pads 143*c'* may be connected to the third base pads 141*c* of the light emitting elements, respectively. Also, in the present exemplary embodiment, separately formed bonding pads may not be provided and cell pads 143*a*, 143*b*, 143*c* and 144 may comprise the chip pads and act as terminals of the LED module 100D. Other than the differences noted above, the structure of this embodiment may be the same as described with respect to LED module 100.

In the present exemplary embodiment, the plurality of light emitting cells within the LED module 100D may be operated in an active matrix manner as described herein. LED module 100D may be manufactured (except to provide the formation of additional cell pads which are not connected in common in the row direction) and assembled as part of a larger system as described elsewhere herein.

Figure 40:
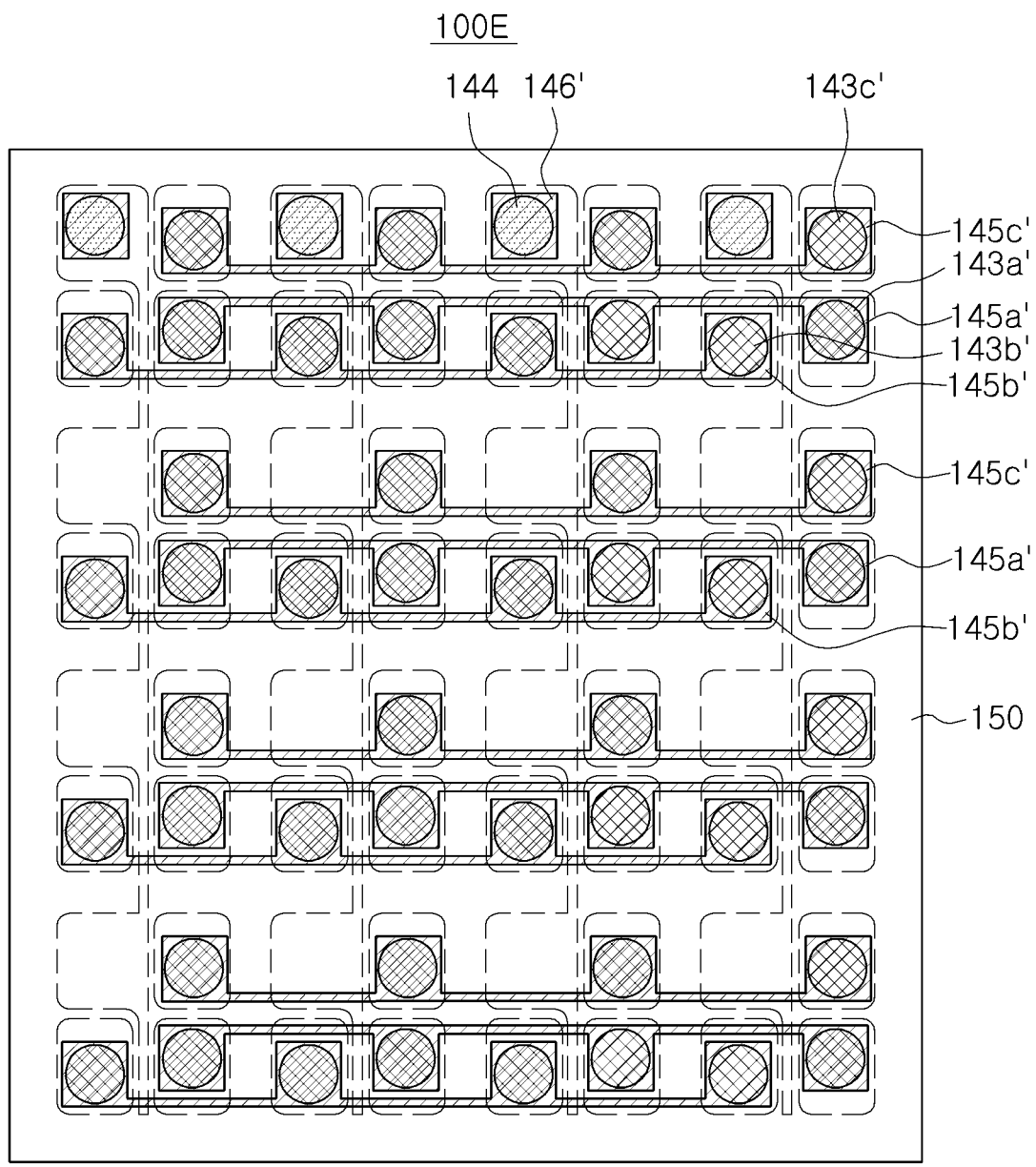
FIG. 40 is a schematic view illustrating an LED module according to an exemplary embodiment in the present disclosure.

FIG. 40 is a schematic view illustrating an LED module according to an exemplary embodiment in the present disclosure.

The LED module 100E illustrated in FIG. 40 has a structure similar to the structure of LED module 100D of FIG. 39 in which additional first to third bonding pads 145*a'*, 145*b'*, and 145*c'* and the common bonding pad 146' are provided as compared to other embodiments described herein.

In the present exemplary embodiment, the first to third light emitting cells of the group of the light emitting elements arranged in the first direction may be connected in common to each other by the first to third bonding pads 145*a'*, 145*b'*, and 145*c'*, respectively. A first bonding pad 145*a'* may be commonly connected to the first light emitting cells (e.g., C1) arranged in the first direction by connecting the first cell pads 143*a'*. The second bonding pad 145*b'* may be commonly connected to the second light emitting cells (e.g. C2) arranged in the first direction by connecting the second cell pads 143*b'*. The third bonding pad 145*c'* may be commonly connected to the third light emitting cells (e.g. C3) arranged in the first direction by connecting the third cell pads 143*c'*. The first, second and third light emitting cells C1, C2 and C3 may be the same as those described with respect to light emitting module 100.

In the present exemplary embodiment, the plurality of light emitting cells within the LED module 100E may be operated in a passive matrix manner as described herein. LED module 100E may be manufactured (with the alternative of forming additional cell pads which are connected in common in the row direction by bonding pads 145*a'*, 145*b'* and 145*c'*) and assembled as part of a larger system as described elsewhere herein.

In the exemplary embodiments described above, the LED module in which light emitting elements having three light emitting cells are arranged in a matrix form has been described, but the invention is not limited thereto.

The technical concepts of the present invention may also be applied to an LED module in which light emitting elements having more than three light emitting cells (for example, four light emitting cells forming subpixels such as RGGB or RGBW) are arranged in a matrix form. R refers to red, G refers to green, B refers to blue, and W refers to white. The technical concepts of the present invention may also be applied to an LED module in which light emitting elements having two light emitting cells (for example, two light emitting cells forming red and yellow subpixels or two light emitting cells forming red and orange subpixels) are arranged in a matrix form).

The technical concepts of the present invention may also be applied to an LED module in which light emitting elements having one light emitting cell are arranged in a matrix form as in the following exemplary embodiment.

Figure 43:
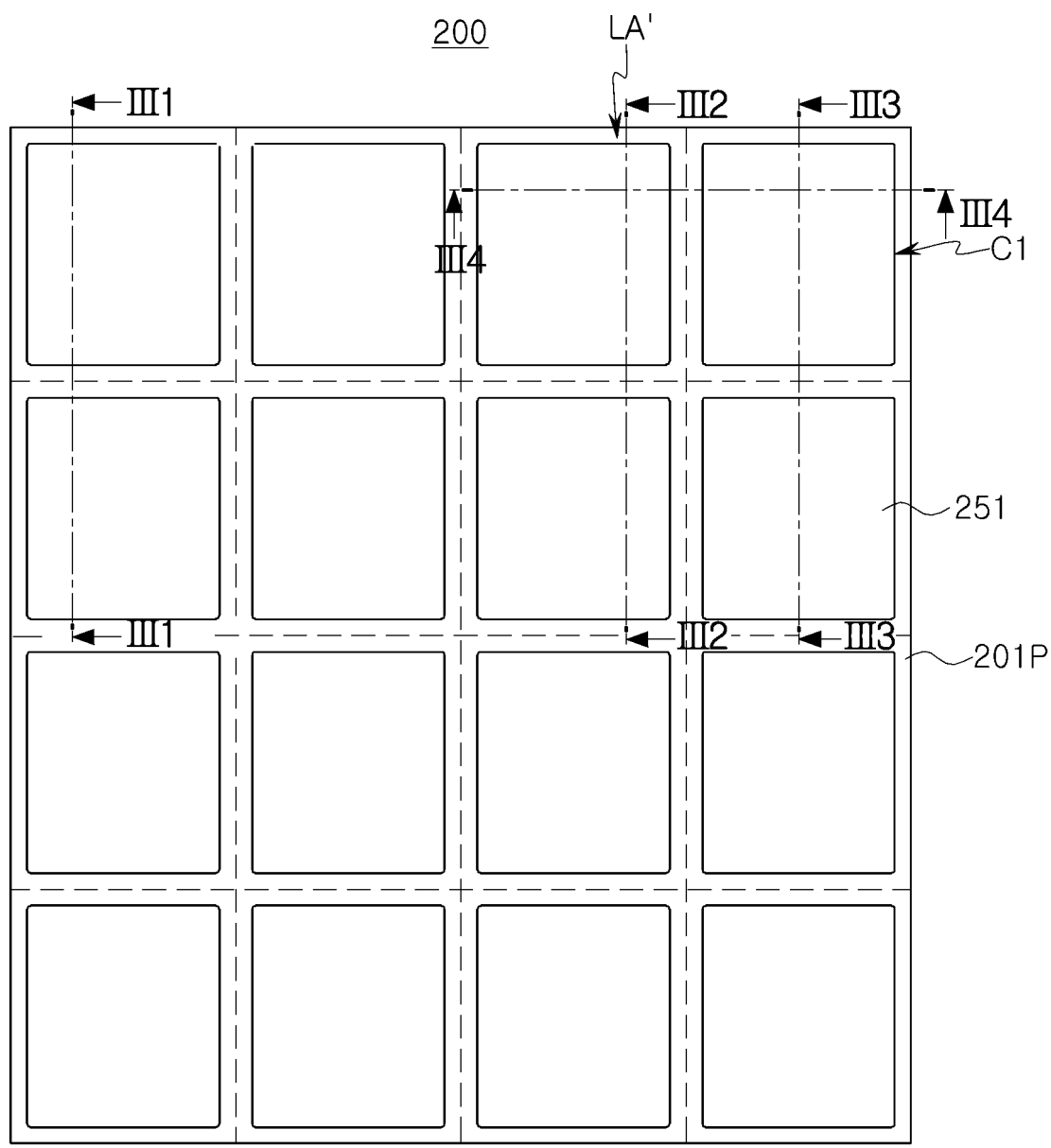
FIGS. 43 and 44 are a schematic plan view and a schematic bottom view of an LED module according to an exemplary embodiment in the present disclosure.
Figure 44:
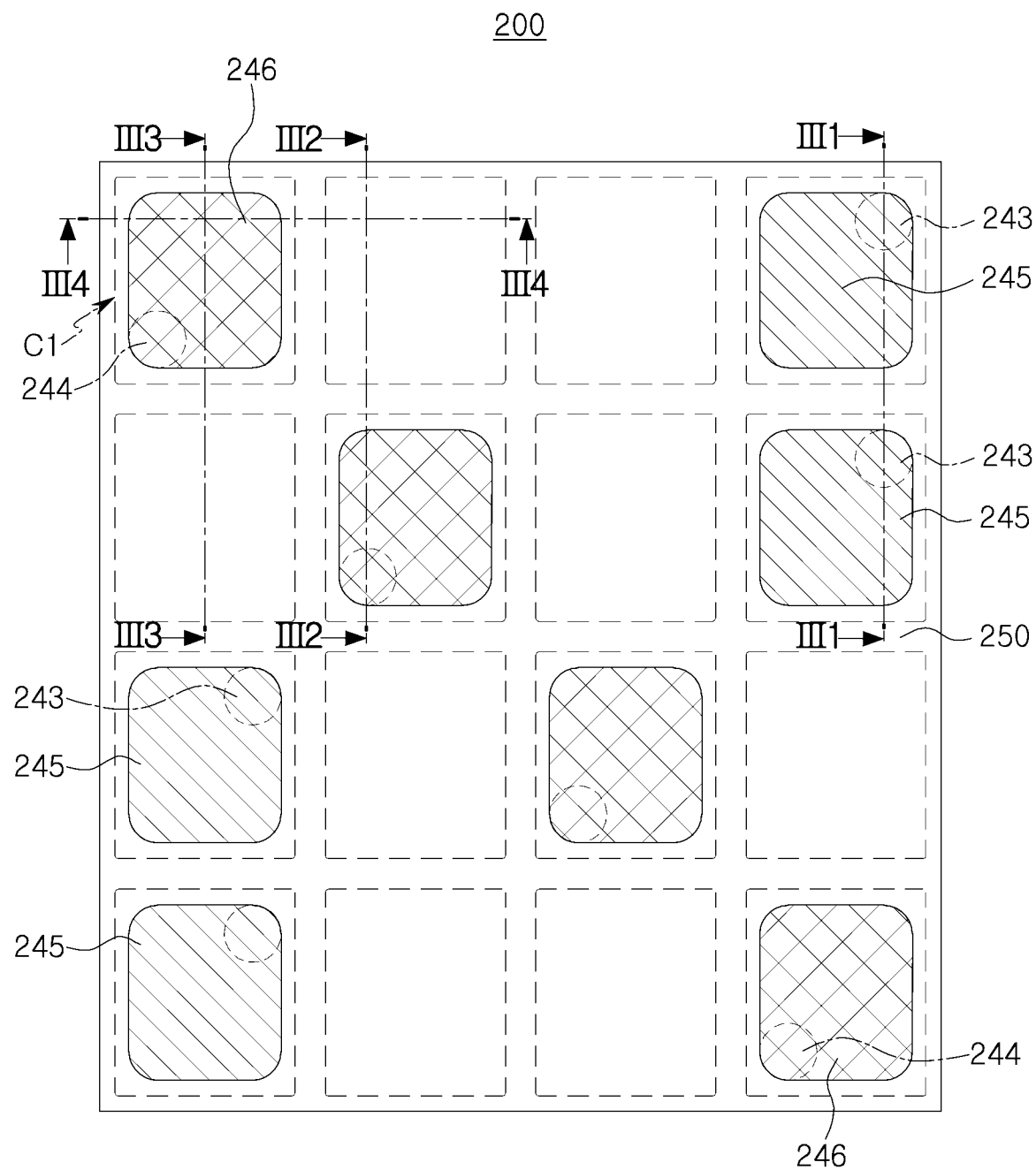

FIGS. 43 and 44 are a plan view and a schematic bottom view schematically illustrating an LED module 200 according to an exemplary embodiment in the present disclosure.

Figure 45A:
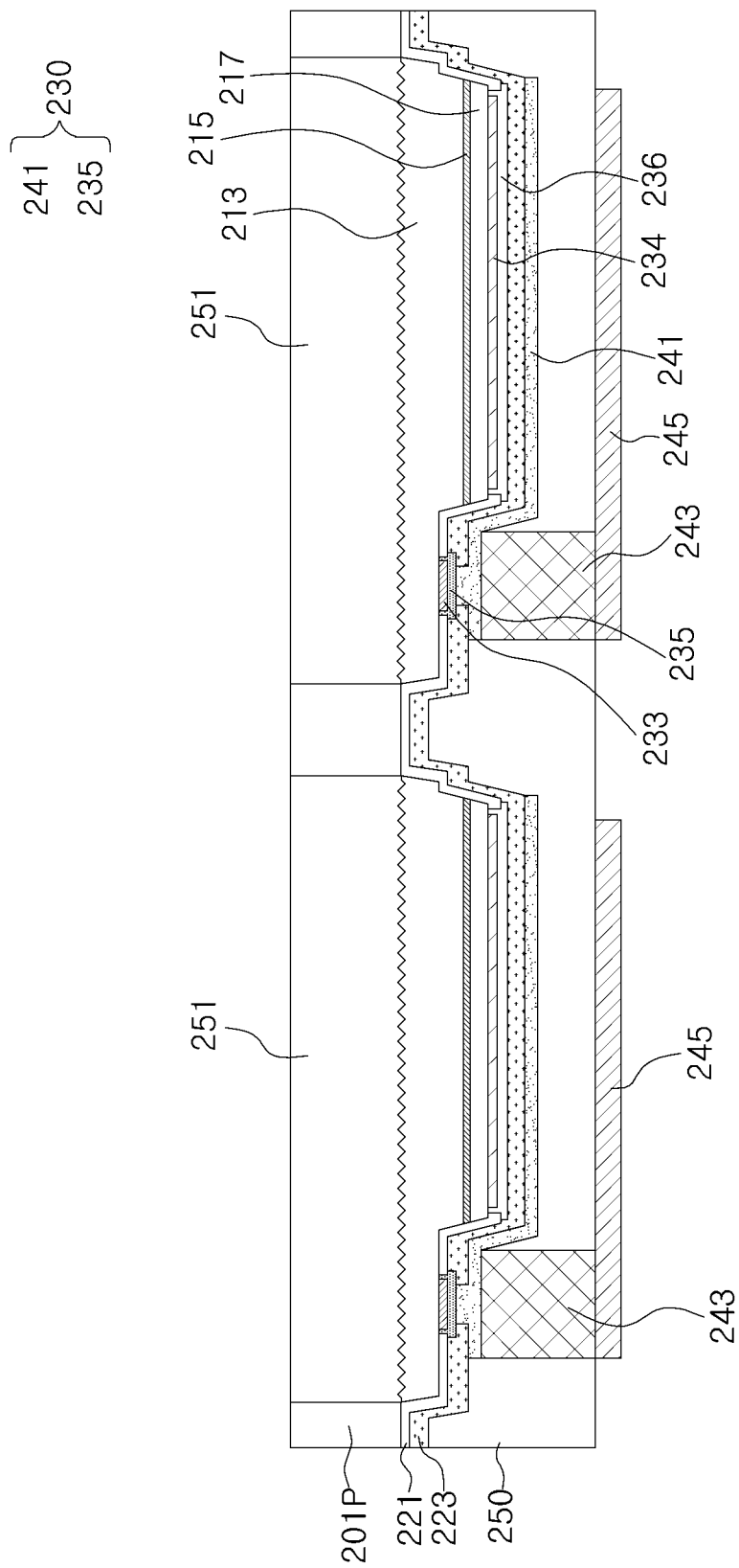
FIGS. 45A through 45D are cross-sectional views of the LED module of FIGS. 43 and 44.
Figure 45B:
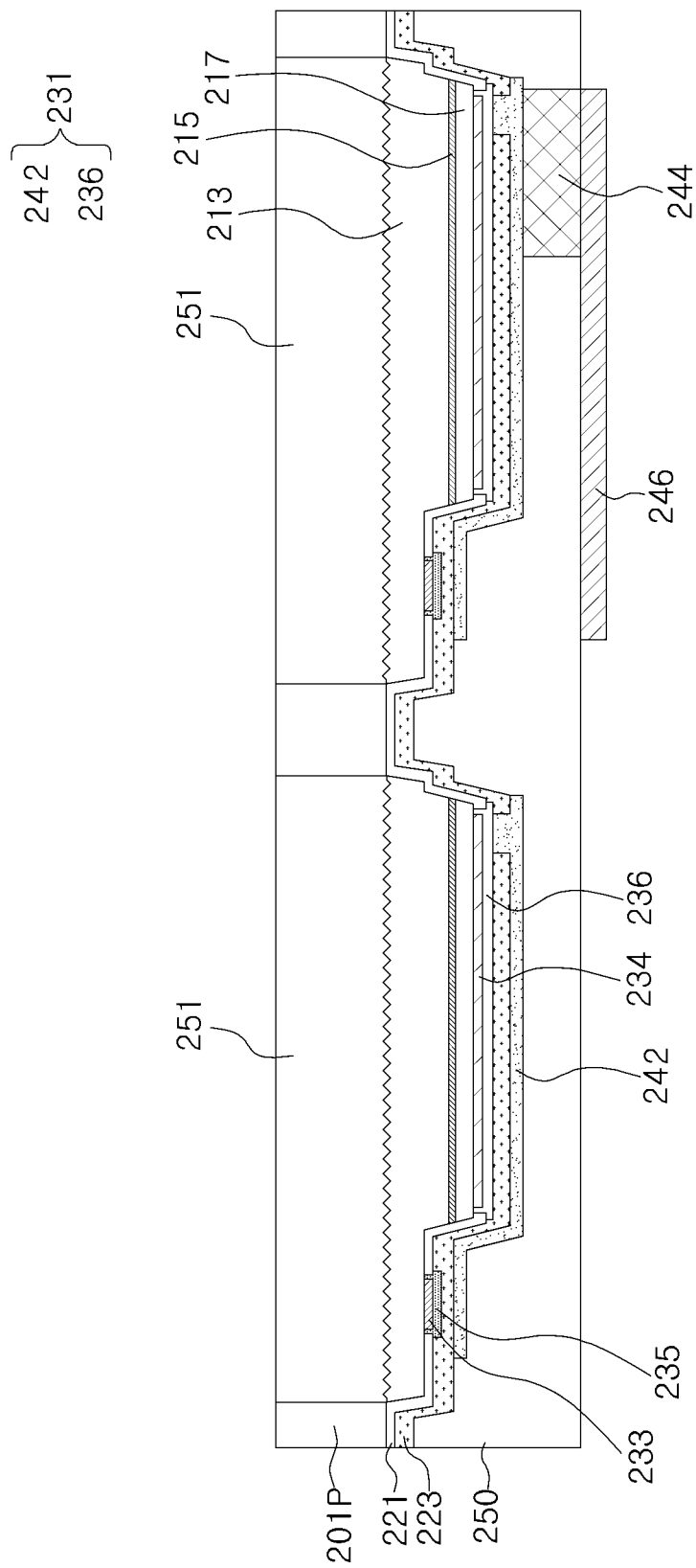
Figure 45C:
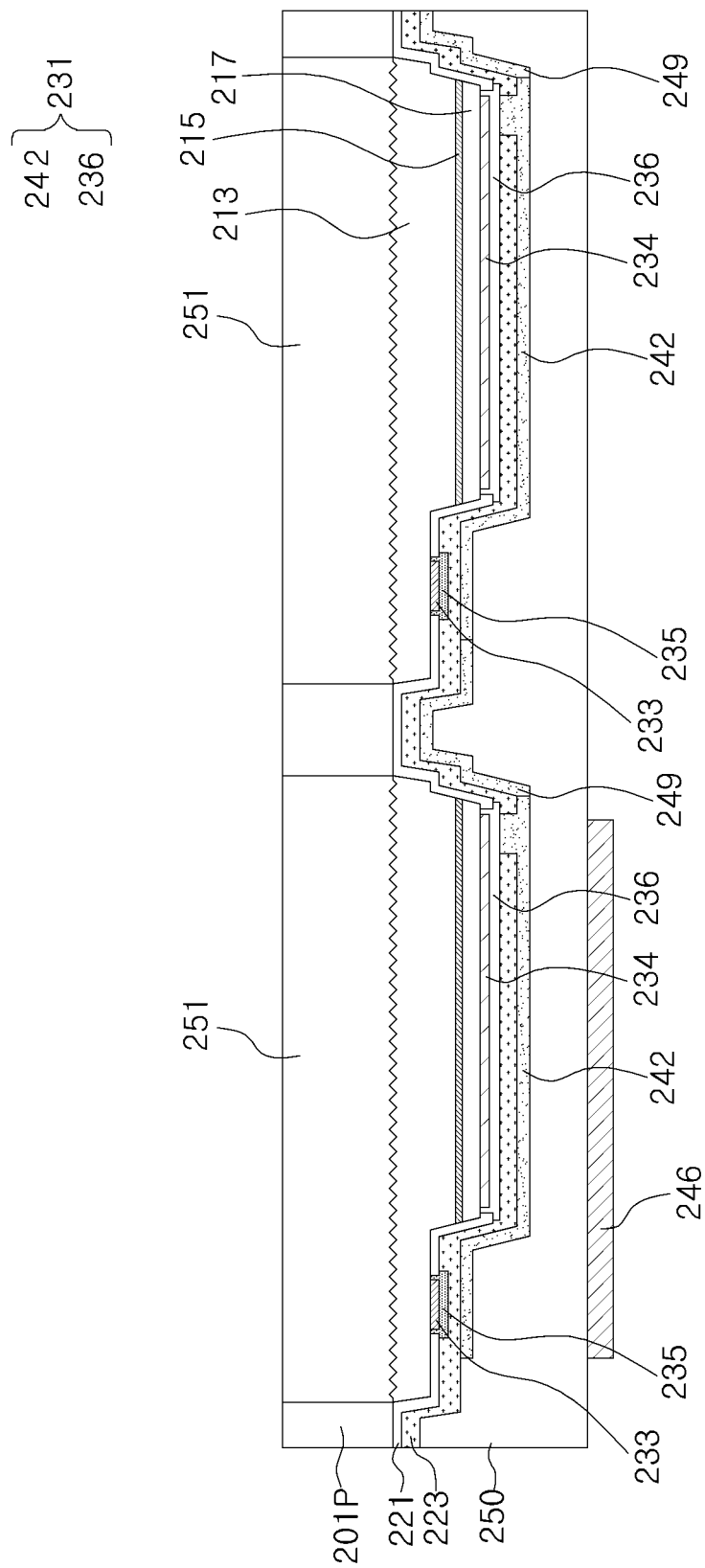
Figure 45D:
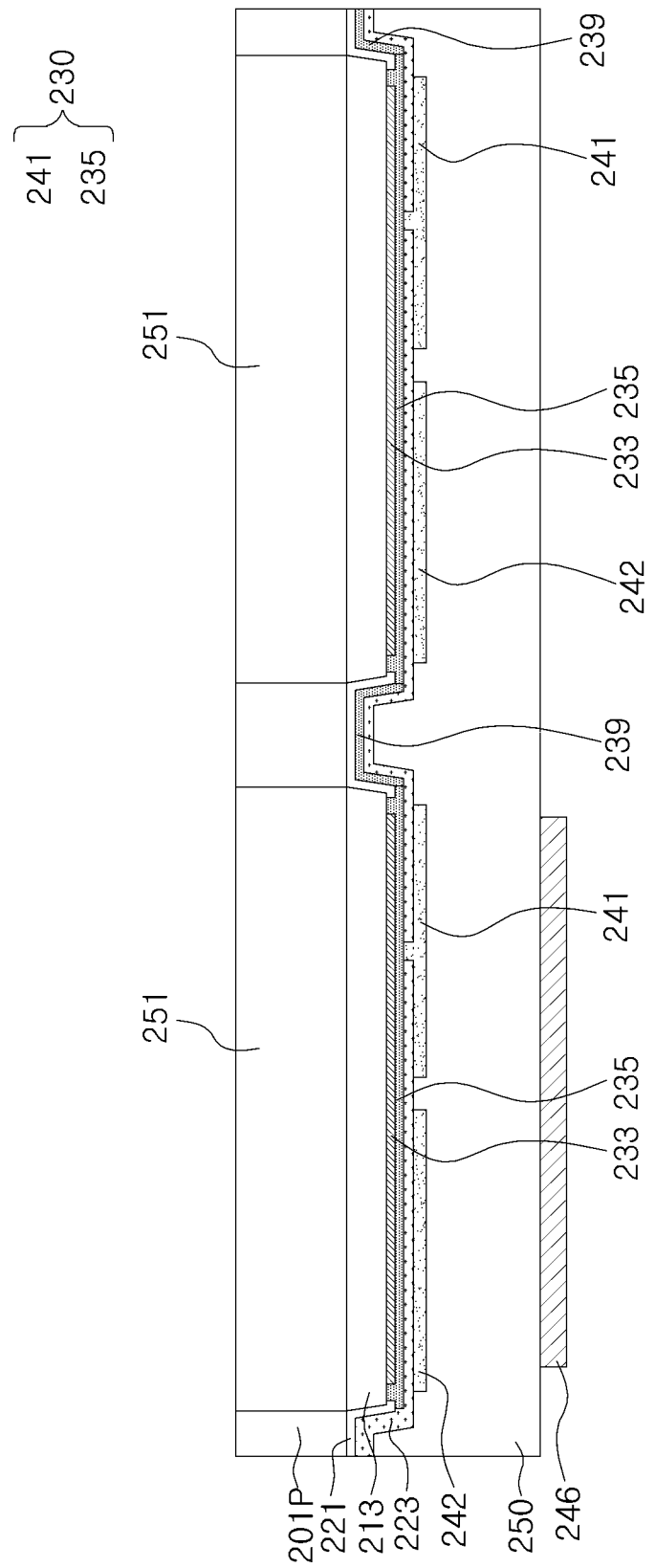

FIGS. 45A through 45D are cross-sectional views of the LED module 200 of FIGS. 43 and 44. FIG. 45A is a cross-sectional view taken along line III1-III1 of FIGS. 43 and 44, FIG. 45B is a cross-sectional view taken along line III2-III2 of FIGS. 43 and 44, FIG. 45C is a cross-sectional view taken along line III3-III3 of FIGS. 43 and 44, and FIG. 45D is a cross-sectional view taken along line III4-III4 of FIGS. 43 and 44.

Referring to FIGS. 43, 44, and 45A through 45D, the LED module 200 may include a light emitting unit including semiconductor light emitting elements LA' of a 4×4 matrix.

However, this is merely illustrative and the LED module 200 may include a light emitting unit including semiconductor light emitting elements LA' arranged in a matrix form of m number of rows and n number of columns in a first direction (for example, in a traverse direction or row direction) and a second direction (for example, in a longitudinal direction or column direction) intersecting each other. Here, m and n are natural numbers equal to or greater than 2. Each of the semiconductor light emitting elements LA' may include one light emitting cell C1. Each of the light emitting cells C1 may be separately and independently driven. The light emitting cell C1 may include a first conductivity-type semiconductor layer 213, an active layer 215, and a second conductivity-type semiconductor layer 217. The active layer 215 may be disposed between the first conductivity-type semiconductor layer 213 and the second conductivity-type semiconductor layer 217, and may emit light having a specific wavelength. For example, the active layer 215 may emit UV light, blue light, green light, yellow light, orange light, or red light.

The LED module 200 may include a light transmission portion 251 corresponding to the light emitting cell C1 and disposed on the first surface of the light emitting unit. The light transmission portion 251 may include a wavelength conversion layer including a wavelength conversion material such as a phosphor or a quantum dot and a filter layer disposed on the wavelength conversion layer.

The LED module 200 may include a partition structure 101P disposed between the light emitting cells C1 on the first surface of the light emitting unit. The partition structure 101P may have a lattice structure accommodating the light emission portion 251.

The LED module 200 may include a wiring electrode disposed on the second surface of the light emitting unit and configured such that the light emitting cells C1 arranged within the LED module 200 are independently driven.

The wiring electrode may include a first cell electrode 230 commonly connected to the first conductivity-type semiconductor layer 213 of the light emitting cells C1 arranged in the first direction and a second cell electrode 231 commonly connected to the second conductivity-type semiconductor layer 217 of the light emitting cells C1 arranged in the second direction.

The wiring electrode may further include first electrodes 235 connected to the first conductivity-type semiconductor layers 213 of the light emitting cells C1 and second electrodes 236 connected to the second conductivity-type semiconductor layers 217 of the light emitting cells C1. The first electrodes 235 may be connected to the first conductivity-type semiconductor layers 213 by the medium of first contact electrodes 233, and the second electrodes 236 may be connected to the second conductivity-type semiconductor layers 217 by the medium of second contact electrodes 234.

The wiring electrode may further include first base pads 241 connected to the first electrodes 235 of the light emitting cells C1 and second base pads 242 connected to the second electrodes 236 of the light emitting cells C1.

The first cell electrode 230 may include a first electrode 235 of the light emitting cell C1 and a first base pad 241 connected to the first electrode 235.

The first electrodes 235 of the light emitting cells C1 arranged in the first direction may be connected to each other by a first electrode connection part 239, and the first cell electrode 230 may be commonly connected to the first conductivity-type semiconductor layer 213 of the light emitting cells C1 arranged in the first direction by the first electrode connection part 239.

The second cell electrode 231 may include second electrodes 236 of the light emitting cells C1 arranged in the second direction and a second base pad 242 commonly connected to the second electrodes 236.

The second base pads 242 of the light emitting cells C1 arranged in the second direction may be connected to each other by a metal connection part 249, and the second cell electrodes 231 may be commonly connected to the second conductivity-type semiconductor layer 217 of the light emitting cells C1 arranged in the second direction by the metal connection part 249.

The LED module 200 may further include a first cell pad 243 connected to the first cell electrode 230 and a second cell pad 244 connected to the second cell electrode 231. The first cell pad 243 may be connected to the first base pad 241, and the second cell pad 244 may be connected to the second base pad 242.

In the present exemplary embodiment, one second cell pad 244 may be disposed in each column of the light emitting elements LA' arranged in the second direction, and the LED module 200 includes a total of four second cell pads 244, and the four second cell pads 244 may be disposed below mutually different light emitting elements LA' in a diagonal direction of the LED module 200. One first cell pad 243 may be disposed in each row of the light emitting elements LA' arranged in the first direction, and may be disposed below the light emitting element LA' disposed at an edge of the LED module 200, e.g., under an outermost light emitting element LA' in each row.

The LED module 200 may further include first bonding pads 245 respectively connected to the first cell pads 243, and second bonding pads 246 respectively connected to the second cell pads 244.

The LED module 200 may include a first insulating layer 221 and a second insulating layer 223 surrounding the light emitting cells C1. The first insulating layer 221 and a second insulating layer 223 may separate the light emitting cells C1 from each other in the first and second directions.

As illustrated in FIGS. 45A through 45D, the first insulating layer 221 between the light emitting cells C1 may be in contact with the partition structure 201P on the first surface. The second insulating layer 223 may be disposed between the first and second electrodes 235 and 236 and the first and second base pads 243 and 244. The first and second electrodes 235 and 236 may be connected to the first and second conductivity-type semiconductor layers 213 and 217, respectively, through a portion from which a portion of the first insulating layer 221 has been removed. The first electrode 235 and the first base pad 243 may be connected, or the second electrode 236 and the second base pad 244 may be connected, through a portion from which a portion of the second insulating layer 223 has been removed.

The LED module 200 may include an encapsulant 250 encapsulating a space between the light emitting elements LA' to support the light emitting unit and partially exposing the second cell pads 244. The first cell pads 243 and the second cell pads 244 may be connected to the light emitting elements LA' through the encapsulant 250. Bonding pads 245 and 2456 connected to the first and second cell pads 243 and 244 exposed to one surface of the encapsulant 250 may be disposed on one surface of the encapsulant 250.

The present exemplary embodiment relates to an LED module 200 including a plurality of light emitting cells C1 that may be operated in a passive matrix manner as described elsewhere herein. According to the present exemplary embodiment, the number of electrode pads required for independently driving the plurality of light emitting cells C1, C2, and C3 within the LED module 100A may be reduced. In addition, since a size of the electrode pads is increased, defective bonding at a stage of mounting on a circuit board may be improved.

Figure 46:
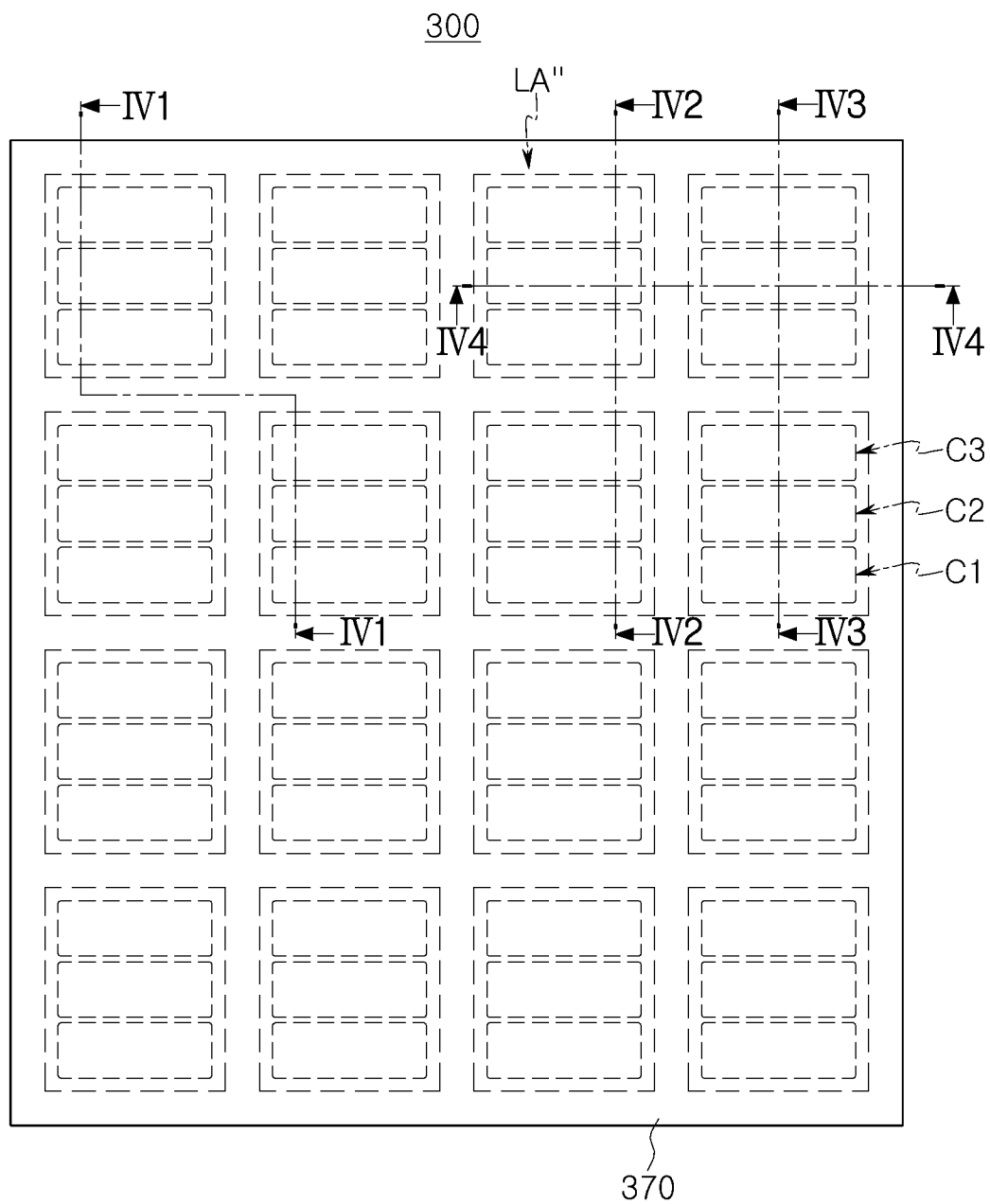
FIGS. 46 and 47 are a schematic plan view and a schematic bottom view of an LED module according to an exemplary embodiment in the present disclosure.
Figure 47:
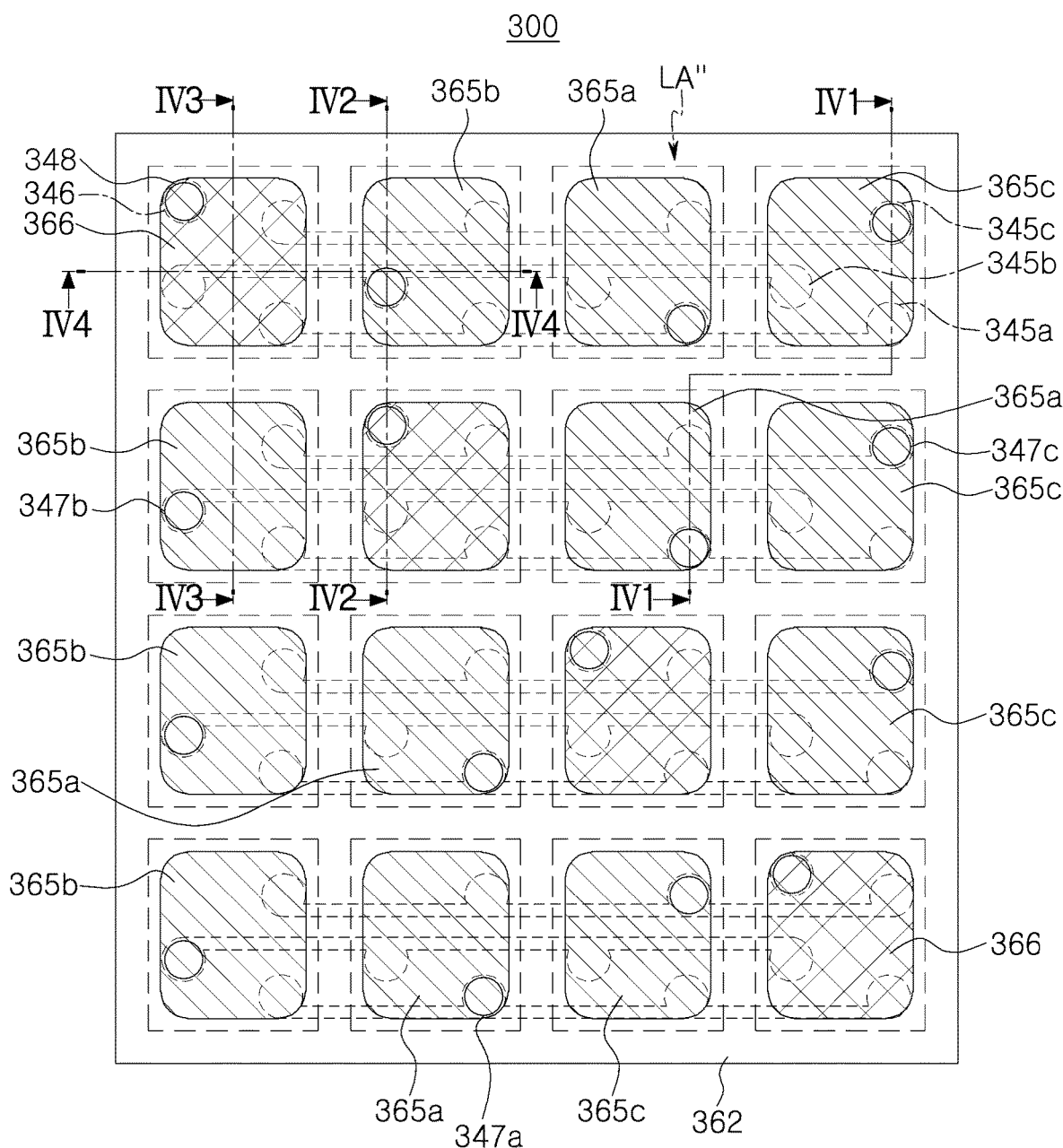

FIGS. 46 and 47 are a plan view and a bottom view schematically illustrating an LED module 300 according to an exemplary embodiment in the present disclosure.

Figure 48A:
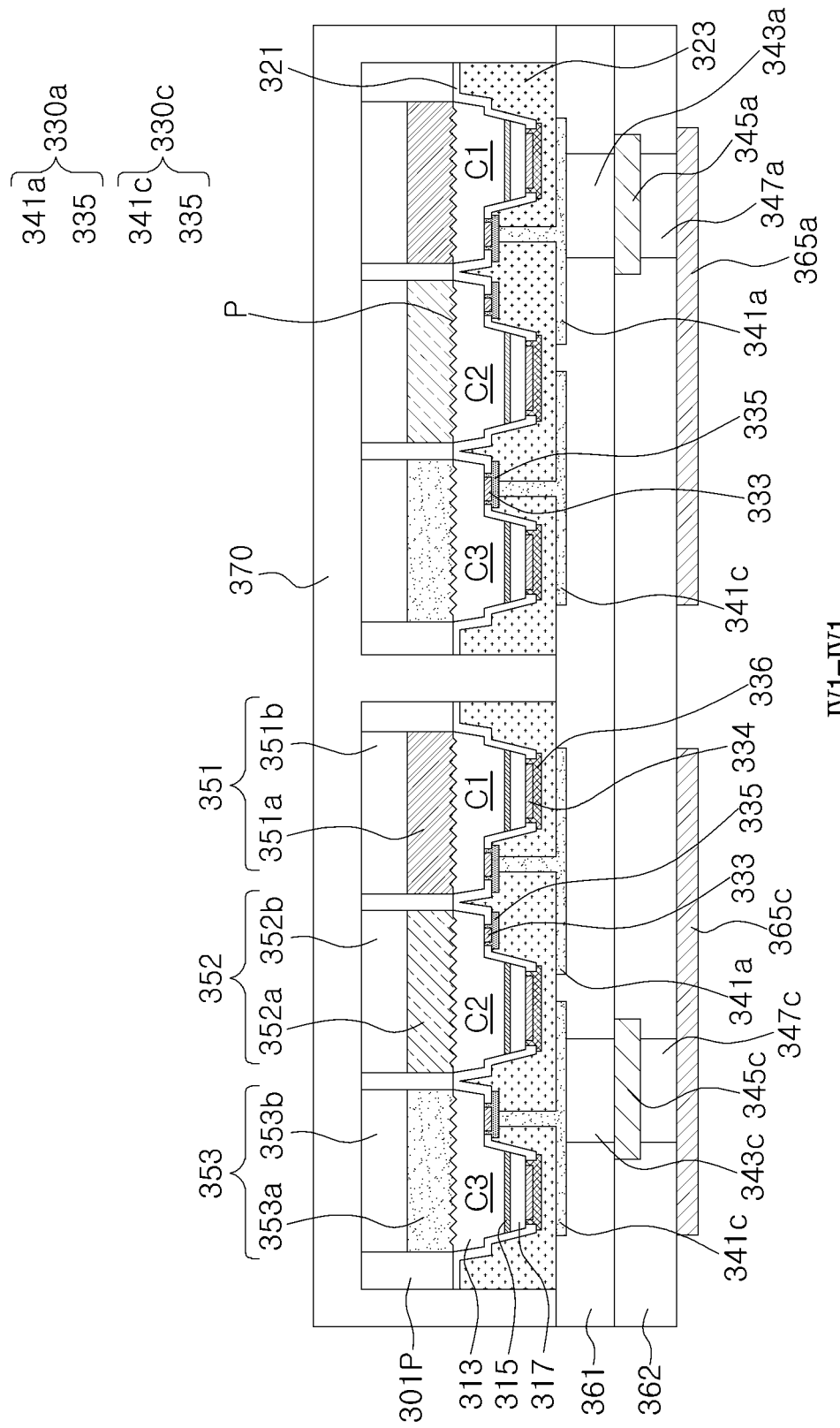
FIGS. 48A through 48D are cross-sectional views of the LED module of FIGS. 46 and 47.
Figure 48B:
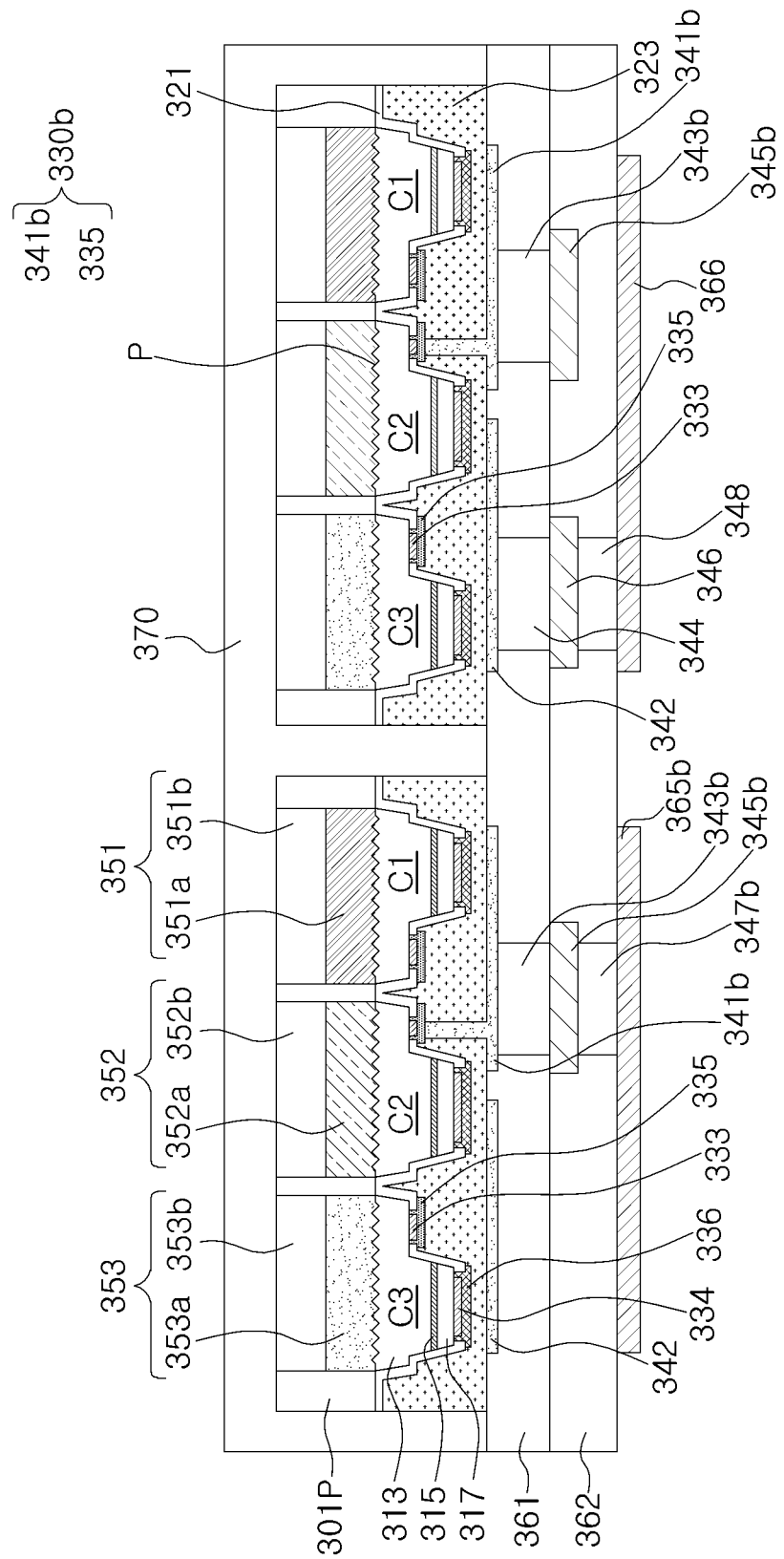
Figure 48C:
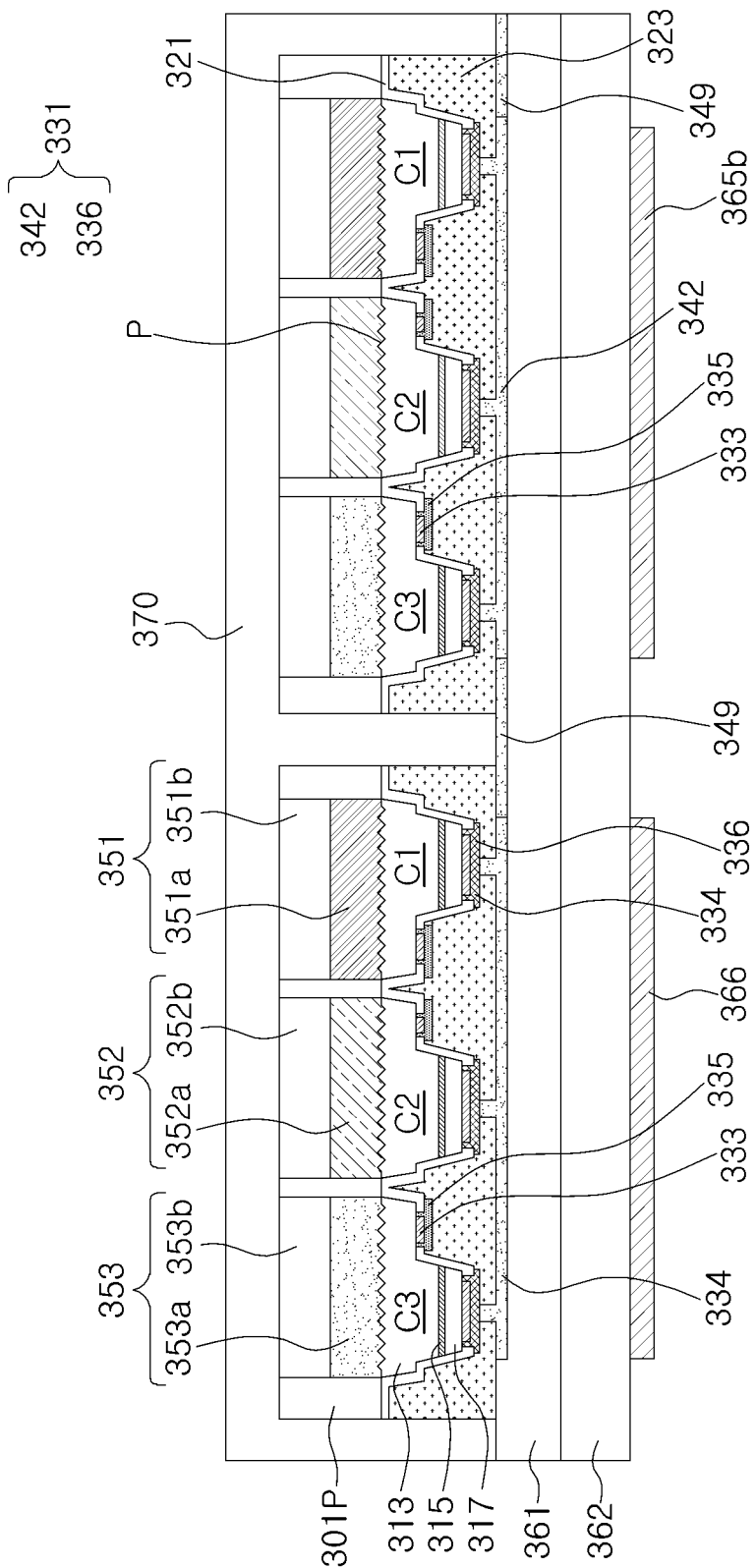
Figure 48D:
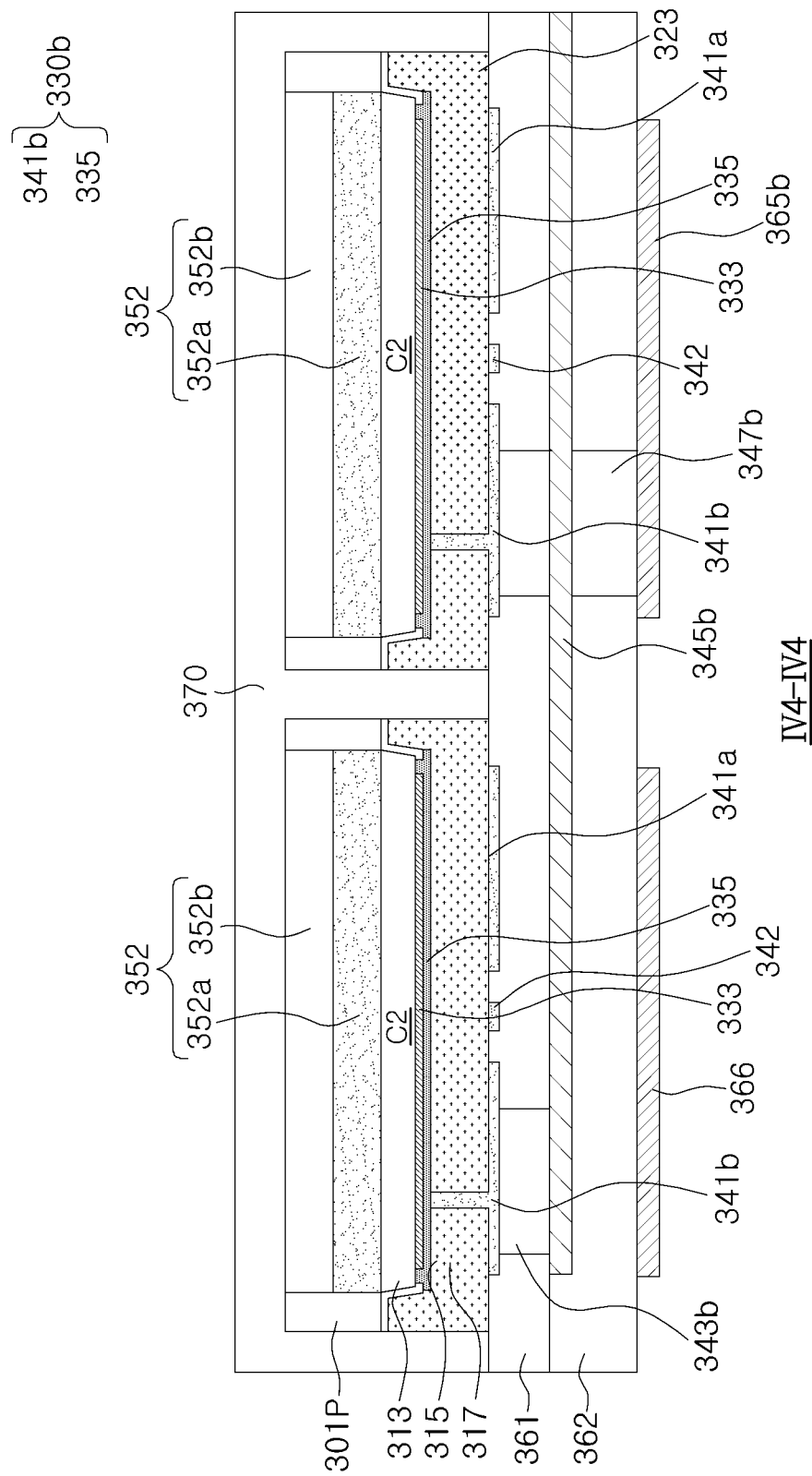

FIGS. 48A through 48D are cross-sectional views of the LED module 300 illustrated in FIGS. 46 and 47. FIG. 48A is a cross-sectional view taken along line IV1-IV1 of FIGS. 46 and 47, FIG. 48B is a cross-sectional view taken along line IV2-IV2 of FIGS. 46 and 47, FIG. 48C is a cross-sectional view taken along line IV3-IV3 of FIGS. 46 and 47, and FIG. 48D is a cross-sectional view taken along line IV4-IV4 of FIGS. 46 and 47.

Referring to FIGS. 46, 47, and 48A through 48D, the LED module 300 may include semiconductor light emitting elements LA" of a 4×4 matrix. However, this is merely illustrative and the LED module 100 may include a light emitting unit including semiconductor light emitting elements LA" arranged in a matrix form of m number of rows and n number of columns in a first direction (for example, in a traverse direction or row direction) and a second direction (for example, in a longitudinal direction or column direction) intersecting each other. Here, m and n are integers equal to or greater than 2. Each of the semiconductor light emitting elements LA" may form a part of a different single individual pixel in the display panel 1000 (please refer to FIG. 50) and realize full colors. Each of the semiconductor light emitting elements LA" may include first to third light emitting cells C1, C2, and C3 that respectively form three subpixels (e.g., R, G, and B subpixels).

The first to third light emitting cells C1, C2, and C3 may each include a first conductivity-type semiconductor layer 313, an active layer 315, and a second conductivity-type semiconductor layer 317. The active layer 315 may be disposed between the first conductivity-type semiconductor layer 313 and the second conductivity-type semiconductor layer 317, and may emit light having a specific wavelength. For example, the active layer 315 may emit blue light (having a wavelength ranging from 440 nm to 460 nm) or ultraviolet light (having a wavelength ranging from 380 nm to 440 nm). Since active layers 315 of the first to third light emitting cells C1, C2, and C3 are grown on a wafer or a substrate through the same process, the active layers 315 may emit the same color of light.

The LED module 300 may include first to third light transmission portions 351, 352, and 353 disposed on the first surface of the light emitting unit, which correspond to the first to third light emitting cells C1, C2, and C3, respectively. The first light transmission portion 351 may be disposed on the first light emitting cell C1, the second light transmission portion 352 may be disposed on the second light emitting cell C2, and the third light transmission portion 353 may be disposed on the third light emitting cell C3. The first to third light transmission portions 351, 352, and 353 may adjust light emitted by the first to third light emitting cells C1, C2, and C3 and convert the same into light having different colors. In the present exemplary embodiment, the first to third light transmission portions 351, 352, and 353 may emit red light, green light, and blue light, respectively.

The first light transmission portion 351 may include a first wavelength conversion layer 351a and a first filter layer 351b, the second light transmission portion 352 may include a second wavelength conversion layer 352a and a second filter layer 352b, and the third light transmission portion 353 may include a third wavelength conversion layer 353a and a third filter layer 353b.

The first to third wavelength conversion layers 351a, 352a, and 353a and the first to third filter layers 351b, 352b, and 353b may be the same as the first to third wavelength conversion layers 151a, 152a, and 153a and the first to third filter layers 151b, 152b, and 153b of the exemplary embodiments described above.

The LED module 300 may include a partition structure 301P disposed between the first to third light emitting cells C1, C2, and C3 on the first surface of the light emitting unit. The partition structure 301P may have a lattice structure accommodating first to third light transmission portions 351, 352, and 353. The partition structure 301P may be separately disposed in each of the light emitting elements LA".

In the present exemplary embodiment, the partition structure 301P may be a structure remaining after a portion of the silicon (Si) wafer used as a growth substrate has been removed, but the present disclosure is not limited thereto.

The LED module 300 may be disposed on the second surface of the light emitting unit and include a wiring electrode configured such that the first to third light emitting cells C1, C2, and C3 of the semiconductor light emitting elements LA" arranged within the LED module 300 are independently driven.

The wiring electrode may include a first cell electrode 330a commonly connected to the first conductivity-type semiconductor layer 313 of the first light emitting cell C1 of each of the semiconductor light emitting elements LA" arranged in the first direction, a second cell electrode 330b commonly connected to the first conductivity-type semiconductor layer 313 of the second light emitting cell C2 of each of the semiconductor light emitting elements LA" arranged in the first direction, a third cell electrode 330c commonly connected to the first conductivity-type semiconductor layer 313 of the third light emitting cell C3 of each of the semiconductor light emitting elements LA" arranged in the first direction, and a common cell electrode 331 commonly connected to the second conductivity-type semiconductor layer 317 of each of the first to third light emitting cells C1, C2, and C2 of each of the semiconductor light emitting elements LA" arranged in the second direction.

The wiring electrode may further include first electrodes 335 connected to the first conductivity-type semiconductor layer 113 of each of the first to third light emitting cells C1, C2, and C3 of each of the semiconductor light emitting elements LA" and second electrodes 336 connected to the second conductivity-type semiconductor layer 317 of each of the first to third light emitting cells C1, C2, and C3. The first electrode 335 may be connected to the first conductivity-type semiconductor layer 313 by the medium of a first contact electrode 333, and the second electrode 336 may be connected to the second conductivity-type semiconductor layer 317 by the medium of a second contact electrode 334.

The wiring electrode may include a first base pad 341a connected to the first electrode 335 of the first light emitting cell C1, a second base pad 341b connected to the first electrode 335 of the second light emitting cell C2, and a third base pad 341c connected to the first electrode 335 of the third light emitting cell C3.

The first cell electrode 330a may include the first electrode 335 and the first base pad 341a of the first light emitting cell C1, the second cell electrode 330b may include the first electrode 335 and the second base pad 341b of the second light emitting cell C2, and the third cell electrode 330c may include the first electrode 335 and the third base pad 341c of the third light emitting cell C3.

The common cell electrode 331 may include the second electrodes 336 of the first to third light emitting cells C1, C2, and C3 and the common base pad 342 commonly connected to the second electrodes 336 in each of the light emitting elements LA" arranged in the second direction.

In the present exemplary embodiment, the common base pads 342 of the semiconductor light emitting elements LA" arranged in the second direction in each column may be connected to each other by a metal connection part 349. The common cell electrode 331 may be commonly connected to the second conductivity-type semiconductor layer 317 of each of the first to third light emitting cells C1, C2, and C3 of the semiconductor light emitting elements LA" arranged in the second direction by the metal connection part 349.

The wiring electrode may further include a first upper cell pad 343a connected to the first cell electrode 330a, a second upper cell pad 343b connected to the second cell electrode 330b, a third upper cell pad 343c connected to the third cell electrode 330c, and a common upper cell pad 344 connected to the common cell electrode 331.

In the present exemplary embodiment, one common upper cell pad 344 may be disposed in each column of the light emitting elements LA" arranged in the second direction. A total of four common cell pads 344 are provided, and the four common upper cell pads 344 may be disposed below mutually different semiconductor light emitting elements LA in a diagonal direction of the LED module 300. Common connection pads 346 respectively connected to the common upper cell pads 344 may be further provided. Also, common lower cell pads 348 respectively connected to the common connection pads 346 may be further provided.

The first to third cell pads 343a, 343b, and 343c, may be disposed in the light emitting elements LA" arranged in the first direction or the second direction. The first to third cell pads 343a, 343b, and 343c may be disposed below each of the light emitting elements LA".

A first connection pad 345a connecting the first cell pads 343a, a second connection pad 345b connecting the second cell pads 343b, and a third connection pad 345c connecting the third cell pads 343c may be disposed in each row of the light emitting elements LA" arranged in the first direction.

First to third lower cell pads 347a, 347b, and 347c respectively connected to the first to third connection pads 345a, 345b, and 345c may be further provided. The first to third lower cell pads 347a, 347b, and 347c may be disposed in each row of the light emitting elements LA" arranged in the first direction, and may be disposed below mutually different light emitting elements LA" in each row.

The LED module 300 may further include first to third bonding pads respectively connected to the first to third lower cell pads 347a, 347b, and 347c, and further include common bonding pads 366 respectively connected to the common lower cell pads 348. In the present exemplary embodiment, each of the first to third bonding pads 365a, 365b, and 365c and the common bonding pads 366 may be integrally formed below first to third light emitting cells C1, C2, and C3 of a corresponding one of the light emitting elements LA".

The LED module 300 may include first and second insulating layers 321 and 323 surrounding each of the first to third light emitting cells C1, C2, and C3. The first and second insulating layers 321 and 323 may separate the first to third light emitting cells C1, C2, and C3 from each other. The second insulating layer 323 may be thicker in a region in which the first electrode 335 is disposed than in a region in which the second electrode 335 is disposed. As illustrated in FIGS. 48A through 48D, the first insulating layer 321 may be in contact with the partition structure 301P among the first to third light emitting cells C1, C2, and C3. The second insulating layer 323 may be disposed between the first and second electrodes 335 and 336 and the base pads 341a, 341b, 341c, and 342. Through a portion from which a portion of the second insulating layer 323 has been removed, the first electrode 335 and the first to third base pads 341a, 341b, and 341c may be connected or the second electrode 336 and the common base pad 342 may be connected.

The LED module 300 may further include an upper encapsulant 370 covering the light transmission portions 351, 352, and 353 and the partition structure 301P. The upper encapsulant 370 may be formed to cover an outer surface of the partition structure 301P and an outer surface of the second insulating layer 323 between the light emitting elements LA", thus separating the light emitting elements LA" from each other.

The LED module 300 may include lower encapsulants 361 and 362 supporting the light emitting unit including the light emitting elements LA".

The first to third upper cell pads 343a, 343b, and 343c and the common upper cell pad 344 may be connected to the light emitting elements LA" through the first lower encapsulant 361. The first lower encapsulant 361 may be in contact with the upper encapsulant 370 between the light emitting elements LA".

The first to third connection pads 345a, 345b, and 345c and the common connection pad 346 may be disposed between the first lower encapsulant 361 and the second lower encapsulant 362.

The first to third lower cell pads 347a, 347b, and 347c and the common cell pad 348 may be connected to the connection pads 345a, 345b, 345c, and 346 through the second lower encapsulant 362.

The first to third bonding pads 365a, 365b, and 365c and the common bonding pad 366 respectively connected to the first to third lower cell pads 347a, 347b, and 347c, and the common lower cell pad 348 may be disposed on one surface of the second lower encapsulant 362.

Figure 49:
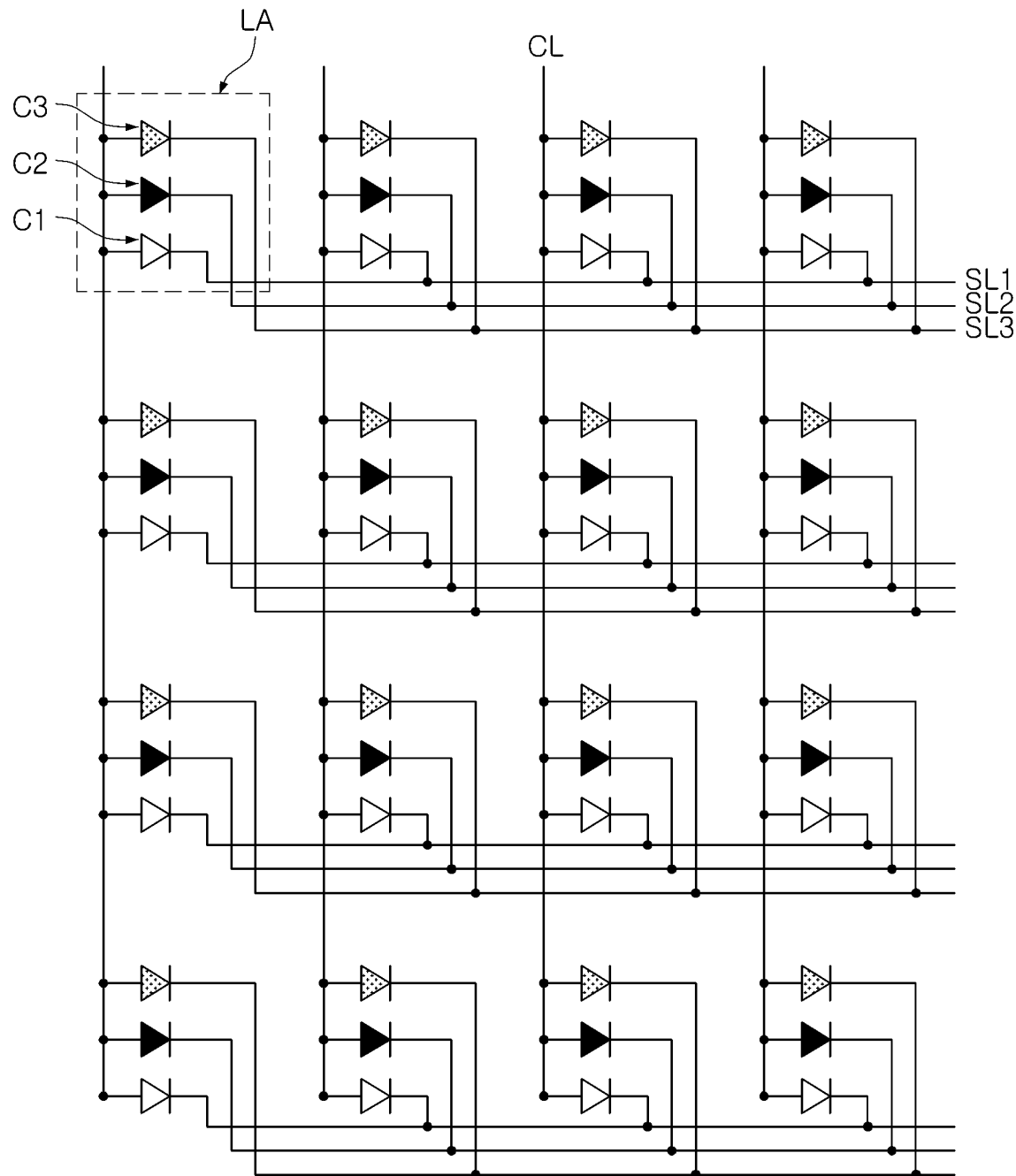
FIG. 49 is a circuit diagram illustrating an LED module according to exemplary embodiments in the present disclosure.

FIG. 49 is a circuit diagram illustrating the wiring connections of LED modules according to an exemplary embodiment in the present disclosure. The circuit diagram in FIG. 49 represents the wiring connections provided by LED modules (100, 100A, 100B, 100E, 300). It will be appreciated that the circuit diagram may represent wiring connections of LED modules 100C and 100D when mounted on a printed circuit board of a larger system (e.g., display), where the printed circuit board provides common wiring connections to corresponding groups of cells C (e.g., C1, C2, and C3) arranged in the first (e.g., row) direction, corresponding to those described with respect to LED modules 100, 100A, 100B, 100E and 300. It will be appreciated that such a combination of one or more LED modules 100C or one or more LED modules 100D on such a printed circuit board are considered exemplary embodiments.

Referring to FIG. 49, each of the semiconductor light emitting elements LA may include first to third light emitting cells C1, C2, and C3. Cathodes of and the first conductivity type semiconductor layers 113 of the first light emitting cells C1 arranged in a row direction may be connected to a corresponding first signal line SL1, cathodes of and the first conductivity type semiconductor layers 113 of the second light emitting cells C2 arranged in a row direction may be connected to a corresponding second signal line SL2, and cathodes of and the first conductivity type semiconductor layers 113 of the third light emitting cells C3 arranged in a row direction may be connected to a corresponding third signal line SL3. Anodes of and the second conductivity type semiconductor layers 117 of the first to third light emitting cells C1, C2 and C3 of the semiconductor light emitting elements LA arranged in a column direction may be connected to a corresponding common line CL. In alternative embodiments (such alternative being applicable to all of the embodiments described here (e.g., including those described with respect to LED modules 100, 100A, 100B, 100C, 100D, 100E and 300)), the connection of cathodes and anodes of the light emitting cells (C1, C2, C3) can be reversed. In other words, cathodes of the first to third light emitting cells C1, C2, and C3 of the semiconductor light emitting elements LA arranged in a column direction may be connected to a corresponding common line CL and anodes of first to third light emitting cells C1, C2 and C3 in a row may be connected to a corresponding signal line (one of signal lines S1, S2 and S3). Each of signal lines S1, S2 and S3 and common lines CL form a separate electrical node. The structure of signal lines S1, S2 and S3 and common lines CL may be formed of a corresponding wiring electrode and their connections as described herein. For example, the structure of each signal line S1 may comprise first cell electrodes 130a of corresponding light emitting cells C1 arranged in a row and their electrical connections, the structure of each signal line S2 may comprise second cell electrodes 130b of corresponding light emitting cells C2 arranged in a row and their electrical connections, and the structure of each signal line S3 may comprise third cell electrodes 130c of corresponding light emitting cells C3 arranged in a row and their electrical connections, as described and illustrated with respect to the embodiments herein. The structure of each common line CL may comprise common cell electrodes 130b of corresponding light emitting cells C arranged in a column and their electrical connections as described and illustrated with respect to the embodiments herein.

FIG. 50 is a view schematically illustrating a display panel according to an exemplary embodiment in the present disclosure.

Referring to FIG. 50, a display panel 1000 may include a circuit board 1200 and several LED modules 1100 mounted in a matrix form on the circuit board 1200 (e.g., corresponding to the printed circuit board of a system as described herein). The circuit board 1200 may act as a support substrate for mounting the plurality of LED modules 110. The circuit board may comprise a continuous integral body or be formed as a group of separate sub—printed circuit boards. In FIG. 50, it is illustrated that the LED modules 1100 are disposed as a matrix of 16 rows×9 columns, but this is merely illustrative. The size and the number of the LED modules 1100 mounted on the display panel 1000 may be variously modified according to a size and a shape of the display panel 1000. For example, each LED module 1100 may correspond to one of the LED modules according to exemplary embodiments of the present disclosure.

The circuit board 1200 may include wiring that connects each of the signal lines S1, S2 and S3 of the LED modules 1100 to a corresponding output (e.g. terminal) of a display driver (e.g., an integrated circuit, or display driver IC). The display driver may be connected to the circuit board 1200. The circuit board 1200 may include wiring that connects each common line CL of the LED modules 1100 to a corresponding output of a display driver IC. This wiring of the circuit board may be connected to the signal lines S1, S2 and S3 and common lines CL by an electrical connection to the appropriate terminal of the LED module 1100, (e.g., bonding pads 145a, 145b, 145c, or 146, common bonding pad 146, cell pads 143a, 143b, 144c and/or common cell pad 144') (e.g., with a respective solder bump connection). Plural display drivers may be mounted to the printed circuit board 1200, such as on the periphery of the circuit board 1200.

Corresponding signal lines (e.g., groups of SL1, SL2 or SL3) of neighboring LED modules may connect to each other. For example, signal lines S1 arranged in a row of the display panel may be commonly connected by the circuit board wiring to form a larger signal line (e.g., a display signal line DSLa schematically represented in FIG. 50 as a dashed line) that may be connected to a display driver IC to connect to all sub-pixels connected to this larger signal line DSLa. Similarly, the circuit board 1200 may provide wiring to connect signal lines S2 of different LED modules 1100 arranged in the same row and signal lines S3 of different LED modules arranged in the same row. The circuit board 1200 may also provide wiring to connect common lines CL of the LED modules 1100 that are arranged in the same column and connect such groups of common lines CL (schematically represented in FIG. 50 as dashed line DCLa) to an output (terminal) of a corresponding driver IC.

With this configuration, a single sub-pixel of the display panel 1000 may be driven by applying a driving voltage on a selected display common line DCL by the driver IC and providing appropriate voltages on all of the display signal lines DSLa (e.g., corresponding to groups of signal lines S1, S2, and S3), one of which allows the selected sub-pixel to operate and the others causing the non-selected sub-pixels to have a ground or negative voltage applied to reverse bias the light emitting diode of the non-selected sub-pixels. Other common display signal lines DCL may be kept at ground, e.g. to prevent operation of light emitting diodes electrically connected thereto.

However, it may often be preferred to drive an entire or part of a column of sub-pixels simultaneously by allowing a display common signal line DCL to turn on all or a selected group of sub-pixels in a column. Voltages applied by the display drivers via the display signal lines DSL (corresponding to S1, S2 and S3) may operate to select an intensity level of the selected sub-pixels, such voltages being generated by the display drivers corresponding to display data received by the display drivers. By sequentially driving each column of the display panel 1000 in this manner, the entire display may be scanned to display an image, such as a frame of a video image.

Alternatively, it may be beneficial to have common signal lines CL and signal lines S1, S2 and S3 of different LED modules 1100 remain unconnected, or only connect certain subgroups of LED modules 1100 as described above, to allow for simultaneous and independent operation of such LED modules 1100 or subgroups of LED modules 1100 (i.e., in the same row or in the same column) via separate connections to respective display driver ICs. Such separate circuit board wiring to separately connect subpixels of different portions of the same row of subpixels is schematically illustrated by dashed lines DSLb. Such separate circuit board wiring to separately connect different portions of the same column of subpixels is schematically illustrated by dashed lines DCLb.

Thus the circuit board 1200 may comprise a plurality of rows of conductors, each row conductor connecting to the same terminal of each LED module 1100 of a corresponding sub-group or all of the LED modules 1100 of the same row to thus provide a corresponding common connection (and forming a corresponding common electrical node) to the light emitting diodes connected to these terminals. The circuit board 1200 also may comprise a plurality of columns of conductors, each column conductor connecting to the same terminal of each LED module 1100 of a corresponding sub-group or all of the LED modules 1100 of the same column to thus provide a corresponding common connection (and forming a corresponding common electrical node) to the light emitting diodes connected to these terminals.

Alternatively, a circuit (a thin film transistor (TFT) array, or the like) configured such that subpixels (for example, R, G, B subpixels) of the display panel 1000 may be independently driven.

The display panel 1000 may include a protective layer protecting the LED module 1100 from the outside, and a polarization layer adjusting a direction of light emitted by the LED module 1100 to make a screen clear and sharp.

Figure 51:
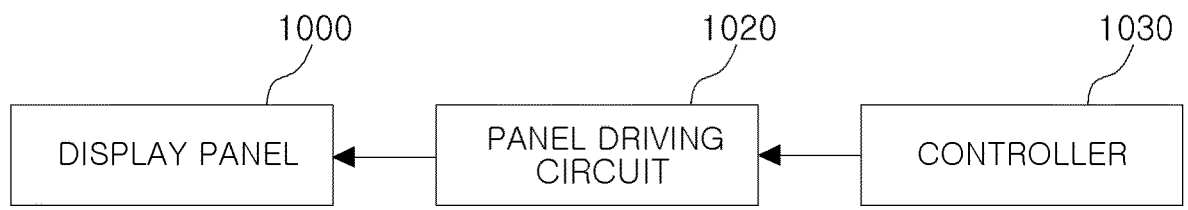
FIG. 51 is a block diagram illustrating a configuration of a display device according to an exemplary embodiment in the present disclosure.

FIG. 51 is a block diagram illustrating a configuration of a display device according to an exemplary embodiment in the present disclosure.

Referring to FIG. 51, the display panel 1000 illustrated in FIG. 50 may constitute a display device together with a panel driving circuit 1020 and a controller 1030. Here, the display device may be realized as a display of various electronic devices such as a TV, an electronic slate, an electronic table, a large format display (LFD), a smartphone, a tablet PC, a desktop PC, a notebook computer, and the like.

The panel driving circuit 1020 may drive the display panel 1000, and the controller 1030 may control the panel driving circuit 1020, such as by providing digital display data and timing information to the panel driving circuit 1020 to control the intensity of the sub-pixels of the display panel. The panel driving circuit 1020 controlledby the controller 1030 may be configured such that a plurality of subpixels including red (R), green (G), and blue (B) subpixels are independently turned on and off or are driven line by line, or group by group, as described herein.

For example, the panel driving circuit 1020 may transmit a clock signal having a specific driving frequency to each of the plurality of subpixels to turn on or off each of the plurality of subpixels. The controller 1030 may control the panel driving circuit 1020 such that a plurality of subpixels are turned on simultaneously in a set group unit according to an input image signal, thus displaying a desired image on the display panel 1000. The panel driving circuit 1020 may comprise a plurality of display driver ICs as described herein.

As set forth above, according to exemplary embodiments in the present disclosure, using the LED module in which light emitting elements are arranged in a matrix form, a process of manufacturing a display device may be simplified, whereby manufacturing time may be shortened and manufacturing cost may be reduced.

Advantages and effects of the present disclosure are not limited to only those described herein and should be understood from the described specific exemplary embodiments of the present disclosure. While exemplary embodiments have been shown and described above, it will be apparent to those skilled in the art that modifications and variations could be made without departing from the scope of the present invention as set forth by the appended claims. For example, while rows of subpixels connected in common are described to be the same type of subpixels (e.g. all red subpixels, or all green subpixels or all blue subpixels), embodiments herein may be altered so that a row of subpixels connected in common may comprise different type of subpixels (e.g., a row commonly connected subpixels may comprise a mix of red, green and blue subpixels). In addition, while the pixels are shown to be formed as a stack of rectangular subpixels, other configurations may be implemented with the embodiments described herein, for example a configuration where the pixel is rotated by 90 degrees, subpixels of a pixel are positioned in a staggered configuration (e.g., subpixels positioned to form to a staircase or zig-zag shape) or subpixels having shapes other than a rectangular shape (such as triangular or hexagonal shapes that arranged within a triangular grid of subpixels or a hexagonal grid of subpixels). As another example, the preferred embodiments employ light emitting diodes as a light emitting cell C, but other types of light emitting structures may be used. As another example, adding all or some of the first light transmission portions (e.g., 151, 152, 153), such as the wavelength conversion layers and/or the filter layers described herein, need not be performed at the wafer level and may instead be performed after singulating the light emitting modules from the wafer, such as after mounting the light emitting modules on a printed circuit board of a system, such as 1200.

What is claimed is:

1. A semiconductor device comprising:
a single semiconductor chip, the single semiconductor chip comprising:
a p×q matrix of pixels arranged in p rows and q columns, where p and q are integers greater than 1, each pixel comprising a plurality of subpixels including a red subpixel, a green subpixel, and a blue subpixel, each of the plurality of subpixels comprising a light emitting diode having a first diode electrode and a second diode electrode connected to apply a voltage across the light emitting diode,
wherein each light emitting diode comprises a first conductivity-type semiconductor layer, a second conductivity-type semiconductor layer, and an active layer disposed between the first conductivity-type semiconductor layer and the second conductivity-type semiconductor layer;
p first signal lines, each dedicated to and connecting in common first conductivity-type semiconductor layers of the light emitting diodes of each of the red subpixels of a respective one of p rows of pixels;
p second signal lines, each dedicated to and connecting in common first conductivity-type semiconductor layers of the light emitting diodes of each of the green subpixels of a respective one of p rows of pixels;
p third signal lines, each dedicated to and connecting in common first conductivity-type semiconductor layers of the light emitting diodes of each of the blue subpixels of a respective one of p rows of pixels;
q common lines, each dedicated to and connecting in common second conductivity-type semiconductor layers of the light emitting diodes of a respective one of q columns of pixels;
p first chip pads respectively electrically connected to a corresponding one of the p first signal lines;
p second chip pads respectively electrically connected to a corresponding one of the p second signal lines;
p third chip pads respectively electrically connected to a corresponding one of the p third signal lines; and
q common chip pads respectively electrically connected to a corresponding one of the q common lines.

2. The semiconductor device of claim of 1, wherein the red subpixel, the green subpixel, and the blue subpixel of each pixel are arranged in q columns.

3. The semiconductor device of claim 1, wherein each of the p first chip pads, the p second chip pads, the p third chip pads and the q common chip pads comprises a continuous external surface area that extends under the red subpixel, the green subpixel, and the blue subpixel.

4. The semiconductor device of claim 3, wherein, with respect to a top down view, the external surface area of each of the p first chip pads, the p second chip pads, the p third chip pads and the q common chip pads is at least 50% of an area of a bounding convex polygon within which the red subpixel, the green subpixel and the blue subpixel are fully positioned.

5. The semiconductor device of claim 3, wherein, with respect to a top down view, the external surface area of each of the p first chip pads, the p second chip pads, the p third chip pads and the q common chip pads is at least as large as an area of a bounding convex polygon within which the red subpixel, the green subpixel and the blue subpixel are fully positioned.

6. The semiconductor device of claim 3, wherein, with respect to a top down view, the external surface area of each of the p first chip pads, the p second chip pads, the p third chip pads and the q common chip pads is at least 150% of an area of a bounding convex polygon within which the red subpixel, the green subpixel and the blue subpixel are fully positioned.

7. The semiconductor device of claim 1, wherein the red subpixels are configured to emit light having a peak intensity with a wavelength within the range of 630 nm to 780 nm, the green subpixels are configured to emit light having a peak intensity with a wavelength within the range of 500 nm to 600 nm and the blue subpixels are configured to emit light having a peak intensity with a wavelength within the range of 420 nm to 480 nm.

8. A semiconductor device, comprising:
a single semiconductor chip, the single semiconductor chip comprising:
a p×q matrix of pixels arranged in p rows and q columns, where p and q are integers greater than 1, each pixel comprising a plurality of subpixels including a red subpixel, a green subpixel, and a blue subpixel, each of the plurality of subpixels comprising a light emitting diode having a first diode electrode and a second diode electrode connected to apply a voltage across the light emitting diode, and light conversion material on the light emitting diode,
wherein each light emitting diode comprises a first conductivity-type semiconductor layer, a second conductivity-type semiconductor layer, and an active layer disposed between the first conductivity-type semiconductor layer and the second conductivity-type semiconductor layer;
p first signal lines, each dedicated to and connecting in common the first diode electrodes of the light emitting diodes of each of the red subpixels of a respective one of p rows of pixels;
p second signal lines, each dedicated to and connecting in common the first diode electrodes of the light emitting diodes of each of the green subpixels of a respective one of p rows of pixels;
p third signal lines, each dedicated to and connecting in common the first diode electrodes of the light emitting diodes of each of the blue subpixels of a respective one of p rows of pixels;
q common lines, each dedicated to and connecting in common the second diode electrodes of the light emitting diodes of a respective one of q columns of pixels;
p first chip pads respectively electrically connected to a corresponding one of the p first signal lines;
p second chip pads respectively electrically connected to a corresponding one of the p second signal lines;
p third chip pads respectively electrically connected to a corresponding one of the p third signal lines;
q common chip pads respectively electrically connected to a corresponding one of the q common lines;
an encapsulant positioned about the p first signal lines, the p second signal lines, and the p third signal lines and under the light emitting diodes of each pixel; and
a partition structure positioned at upper surfaces of the light emitting diodes, the partition structure comprising a plurality of openings,
wherein the light conversion material of each of the plurality of subpixels is formed within a corresponding one of the plurality of openings,
wherein each of the p first signal lines, the p second signal lines, and the p third signal lines comprises first electrodes and second electrodes, each of the first electrodes connected to the first conductivity-type semiconductor layer by the first diode electrode, each of the second electrodes connected to the second conductivity-type semiconductor layer by the second diode electrode.

9. The semiconductor device of claim 8, wherein the light conversion material of at least some of the subpixels comprises a wavelength conversion layer including phosphor.

10. The semiconductor device of claim 8,
wherein the light conversion material of at least some of the subpixels comprises a wavelength conversion layer including a plurality of quantum dots.

11. The semiconductor device of claim 10, wherein the quantum dots include a group III-V compound semiconductor or a group II-VI compound semiconductor having a core-shell structure comprising a core having a diameter between 1 nm to 30 nm and a shell, having a thickness between 0.1 nm to 20 nm.

12. The semiconductor device of claim 11, wherein the core includes CdSe or InP, and the shell includes ZnS or ZnSe.

13. The semiconductor device of claim 11, wherein the core has a diameter between about 3 nm to about 10 nm, and the shell has a thickness between 0.5 nm to 2 nm.

14. The semiconductor device of claim 8,
wherein the light conversion material of at least some of the subpixels comprises a wavelength conversion layer,
wherein the wavelength conversion layer comprises at least one of a first wavelength conversion material and a second wavelength conversion material,
wherein the first wavelength conversion material is part of wavelength conversion layers of the red subpixels and has a material property to convert light to red light having a wavelength within the range of 630 nm to 780 nm, and
wherein the second wavelength conversion material is part of wavelength conversion layers of the green subpixels and has a material property to convert light to green light having a wavelength within the range of 500 nm to 600 nm.

15. The semiconductor device of claim 8, wherein each of the p first chip pads, the p second chip pads, the p third chip pads and the q common chip pads penetrates the encapsulant such that the encapsulant covering side surfaces of each of the p first chip pads, the p second chip pads, the p third chip pads and the q common chip pads.

16. The semiconductor device of claim 8, further comprising cell pads connecting each of the p first signal lines, p second signal lines, and p third signal lines with corresponding ones of the p first chip pads, the p second chip pads and the p third chip pads, respectively, and connecting each of the q common lines with each of the q common chip pads, respectively, wherein each of the cell pads penetrates the encapsulant such that the encapsulant covering side surfaces of each of the cell pads.

17. The semiconductor device of claim 8, wherein the partition structure comprising a semiconductor crystalline growth substrate, the plurality of openings are portions of the semiconductor crystalline growth substrate are removed.

18. The semiconductor device of claim 8, wherein the partition structure comprising a black matrix resin.

19. The semiconductor device of claim 8, wherein, with respect to a top down view, the partition structure have a thickness of the partition structure disposed between the plurality of subpixels is smaller than a thickness of the partition structure disposed between each pixel.

20. A display panel comprising:
a panel substrate;
a plurality of semiconductor chips mounted on the panel substrate;
a protective layer disposed on the plurality of semiconductor chips; and
a polarization layer disposed between the protective layer and the plurality of semiconductor chips and adjusting a direction of the plurality of semiconductor chips,
wherein each semiconductor chip comprising:
a p×q matrix of pixels arranged in p rows and q columns, where p and q are integers greater than 1, each pixel comprising a red subpixel, a green subpixel, and a blue subpixel, each subpixel comprising a light emitting diode having a first diode electrode and a second diode electrode connected to apply a voltage across the light emitting diode,
wherein each light emitting diode comprises a first conductivity-type semiconductor layer, a second conductivity-type semiconductor layer, and an active layer disposed between the first conductivity-type semiconductor layer and the second conductivity-type semiconductor layer;
p first wirings, each dedicated to and connecting in common first conductivity-type semiconductor layers of the light emitting diodes of each of the red subpixels of a respective one of p rows of pixels;
p second wirings, each dedicated to and connecting in common first conductivity-type semiconductor layers of the light emitting diodes of each of the green subpixels of a respective one of p rows of pixels;
p third wirings, each dedicated to and connecting in common first conductivity-type semiconductor layers of the light emitting diodes of each of the blue subpixels a respective one of p rows of pixels;
q wirings, each dedicated to and connecting in common second conductivity-type semiconductor layers of the light emitting diodes of a respective one of q columns of pixels;
p first chip pads respectively electrically connected to a corresponding one of the p first wirings;
p second chip pads respectively electrically connected to a corresponding one of the p second wirings;
p third chip pads respectively electrically connected to a corresponding one of the p third wirings; and
q common chip pads respectively electrically connected to a corresponding one of the q wirings.

* * * * *